(12) United States Patent
Wang et al.

(10) Patent No.: US 12,473,275 B2
(45) Date of Patent: Nov. 18, 2025

(54) ARYLAMINE COMPOUND AND USE THEREOF IN PHOTOELECTRIC DEVICES

(71) Applicant: Zhejiang University, Zhejiang (CN)

(72) Inventors: Peng Wang, Zhejiang (CN); Yiming Wang, Zhejiang (CN); Yuefang Wei, Zhejiang (CN); Jing Zhang, Zhejiang (CN); Yi Yuan, Zhejiang (CN); Ming Lei, Zhejiang (CN)

(73) Assignee: Zhejiang University, Hangzhou (CN)

( * ) Notice: Subject to any disclaimer, the term of this patent is extended or adjusted under 35 U.S.C. 154(b) by 1117 days.

(21) Appl. No.: 17/423,475

(22) PCT Filed: Aug. 14, 2020

(86) PCT No.: PCT/CN2020/109402
§ 371 (c)(1),
(2) Date: Jul. 15, 2021

(87) PCT Pub. No.: WO2021/135261
PCT Pub. Date: Jul. 8, 2021

(65) Prior Publication Data
US 2022/0123222 A1    Apr. 21, 2022

(30) Foreign Application Priority Data
Jan. 5, 2020   (CN) .................. 202010007667.X

(51) Int. Cl.
| | | |
|---|---|---|
| C07D 209/88 | (2006.01) | |
| C07D 405/14 | (2006.01) | |
| C07D 409/14 | (2006.01) | |
| C07D 491/147 | (2006.01) | |
| C07D 493/06 | (2006.01) | |
| C07D 495/04 | (2006.01) | |
| C07D 519/00 | (2006.01) | |
| C09K 11/06 | (2006.01) | |
| H10K 85/50 | (2023.01) | |
| H10K 85/60 | (2023.01) | |
| H01G 9/20 | (2006.01) | |
| H10K 30/50 | (2023.01) | |

(52) U.S. Cl.
CPC ......... *C07D 409/14* (2013.01); *C07D 209/88* (2013.01); *C07D 405/14* (2013.01); *C07D 491/147* (2013.01); *C07D 493/06* (2013.01); *C07D 495/04* (2013.01); *C07D 519/00* (2013.01); *C09K 11/06* (2013.01); *H10K 85/50* (2023.02); *H10K 85/633* (2023.02); *H10K 85/636* (2023.02); *C09K 2211/1018* (2013.01); *H01G 9/20* (2013.01); *H10K 30/50* (2023.02); *H10K 85/623* (2023.02); *H10K 85/624* (2023.02); *H10K 85/657* (2023.02); *H10K 85/6572* (2023.02); *H10K 85/6574* (2023.02); *H10K 85/6576* (2023.02)

(58) Field of Classification Search
CPC ... C07D 209/88; C07D 405/14; C07D 409/14
See application file for complete search history.

(56) References Cited

FOREIGN PATENT DOCUMENTS

JP   S62280850 A   12/1987

OTHER PUBLICATIONS

Yamashita, et al. JP 62280850 English abstract, retrieved from STN, Dec. 5, 1987, Accession No. 1988:177186.*

* cited by examiner

*Primary Examiner* — Shawquia Jackson

(57) ABSTRACT

The present application relates to technical field of organic semiconductors and provides an arylamine compound and use thereof in photoelectric devices. The compound is composed of a N,N-dialkyl-dicarbazole amine functional group modified unit with larger conjugated system. The semiconductor material provided by the present application has high glass transition temperature, high solubility, good film forming property and high thermal stability of film morphology, and can be used as a hole transport material in photoelectric devices to realize excellent thermal stability. The compound has simple preparation process, easily available raw materials and low price, and is suitable for industrial production. High glass transition temperature and good thermal stability are beneficial to prolong the working life of optoelectronic devices. High solubility, can form amorphous film with excellent quality, and is beneficial to application in photoelectric devices; The device has high photoelectric conversion efficiency and is a hole transport material with excellent performance.

5 Claims, 1 Drawing Sheet

ARYLAMINE COMPOUND AND USE THEREOF IN PHOTOELECTRIC DEVICES

FIELD OF THE INVENTION

The present application belongs to the technical field of organic semiconductors, and particularly relates to an arylamine compound and use thereof in photoelectric devices.

BACKGROUND

After decades of development, solid-state electronics based on inorganic semiconductors has reduced the size of microelectronic components to micron and submicron levels, and it is difficult to further improve integration of the microelectronic components. Therefore, people put forward an idea of controlling the movement of electrons in an organic molecular region, and further controlling the photon process, so that molecular aggregates can be formed special devices, thus proposing a way to further improve integration of the microelectronic components. The electronic properties, conductive mechanism and impurity influence of organic semiconductors are different from those of traditional inorganic semiconductors. Revealing a relationship between chemical structure and physical properties in organic semiconductors and researching and preparing model devices are not only of great scientific significance, but also have great application prospects.

In recent years, organic semiconductor materials have developed rapidly and are widely used in optoelectronic and electronic components. At present, they have been applied to organic photoconductors (OPCs), organic electroluminescent diodes (OLED), organic photovoltaic cells (OPV), organic field effect transistors (OFETs), photorefractive holography and many other fields. Organic semiconductors have shown complementary performance to inorganic semiconductors in several aspects, mainly as follows: based on the basic performance of semiconductor materials, organic molecules have much more flexible van der Waals interactions, which makes it possible to fabricate organic semiconductor devices on flexible plastic films or metal foils, effectively overcoming the shortcomings of brittleness and hardness of inorganic semiconductor devices brought by covalent bonds between adjacent atoms. Organic semiconductors also have the advantages of good solubility, high transparency, photoelectric properties that can be controlled by molecular tailoring, and potential biocompatibility, etc.

In the organic optoelectronic devices prepared at present, the carrier generation function is often separated from the transmission function. Specifically, in the devices, materials are layered to form films, so that each layer is in an independent and optimal state, wherein an organic hole transport material (OHTMs) plays a very important role in organic optoelectronic devices.

In the prior art, 2,2',7,7'-tetrakis[N,N-di(4-methoxyphenyl)amino]-9,9'-spirobifluorene (spiro-OMeTAD) is usually used as an organic hole transport material, which has low glass transition temperature and is easy to crystallize under heating conditions, leads to poor thermal stability of devices based on this material. Therefore, it is of great significance to develop new low-cost and high-stability organic semiconductor materials for improving device performance, improving working stability and accelerating commercialization.

SUMMARY

The technical problem to be solved by the present application is to overcome the defects in the prior art and provide an arylamine compound and use thereof in photoelectric devices.

To solve the technical problem, the solution of the present application is as follows:

The present application provides an arylamine compound, which is composed of a π unit with a large conjugated system modified by a N,N'-dialkyl-dicarbazole amine functional group, and has a chemical structural formula shown as any one of formulas (1)-(112):

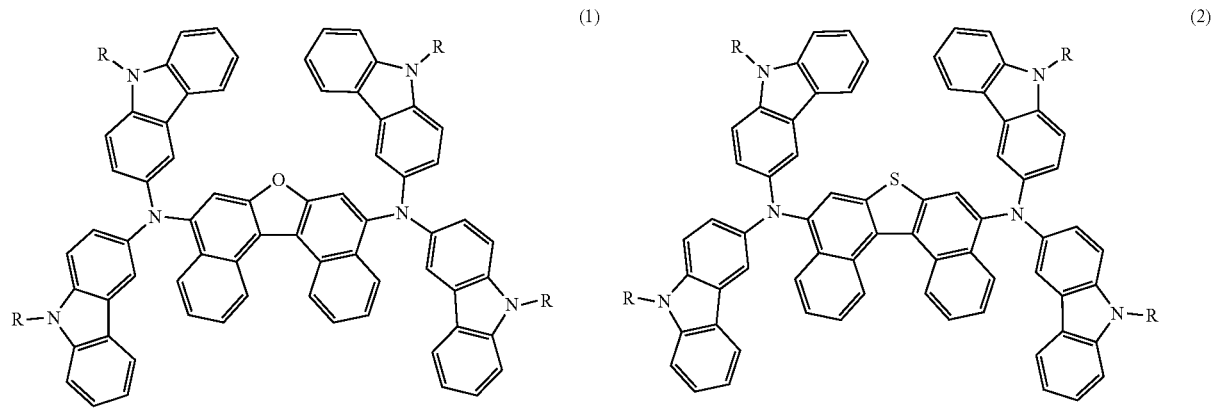

(3)
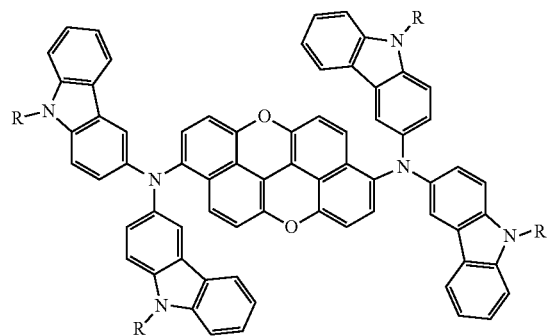
(4)
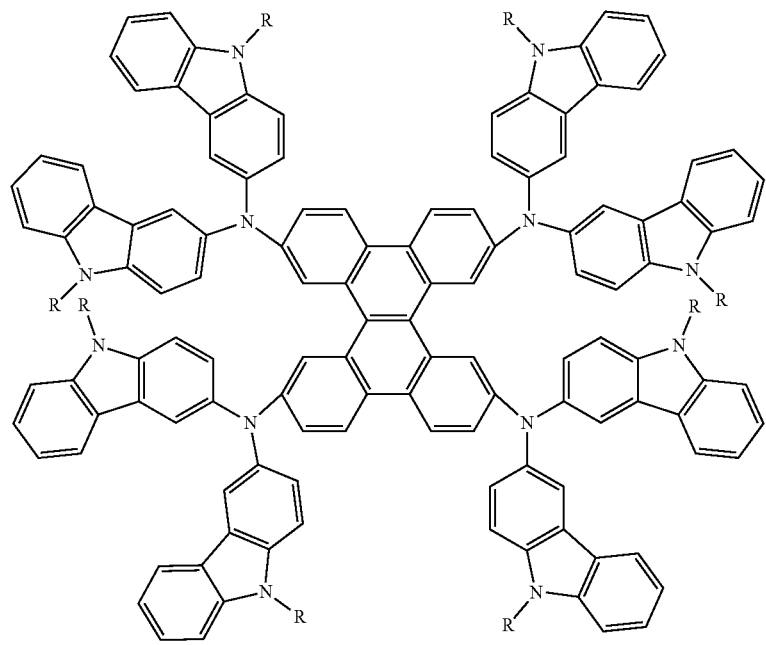
(5)
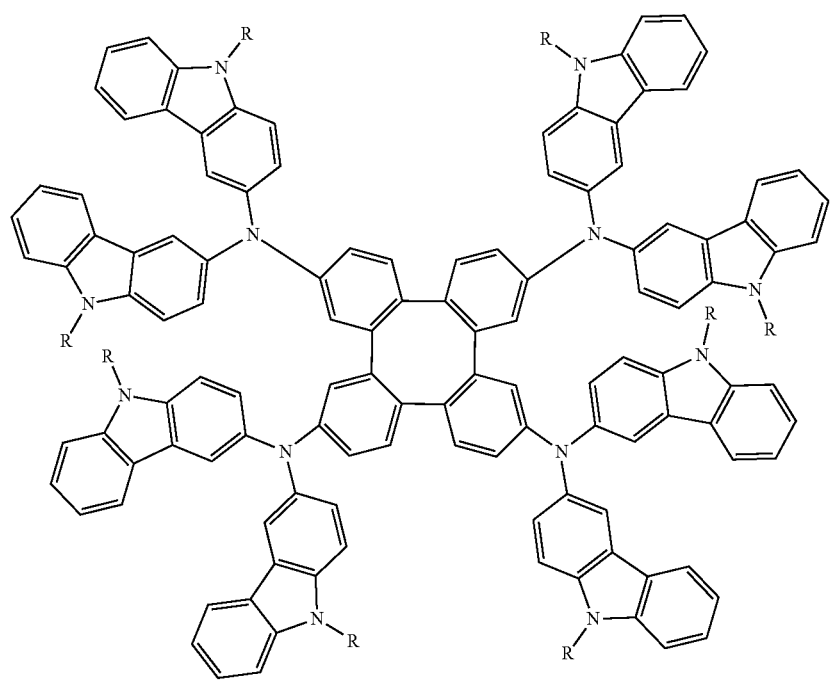

(6)
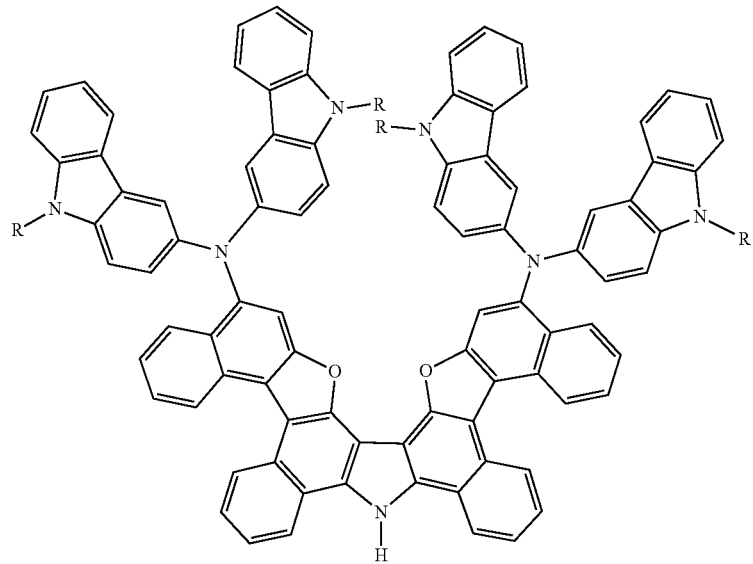
(7)
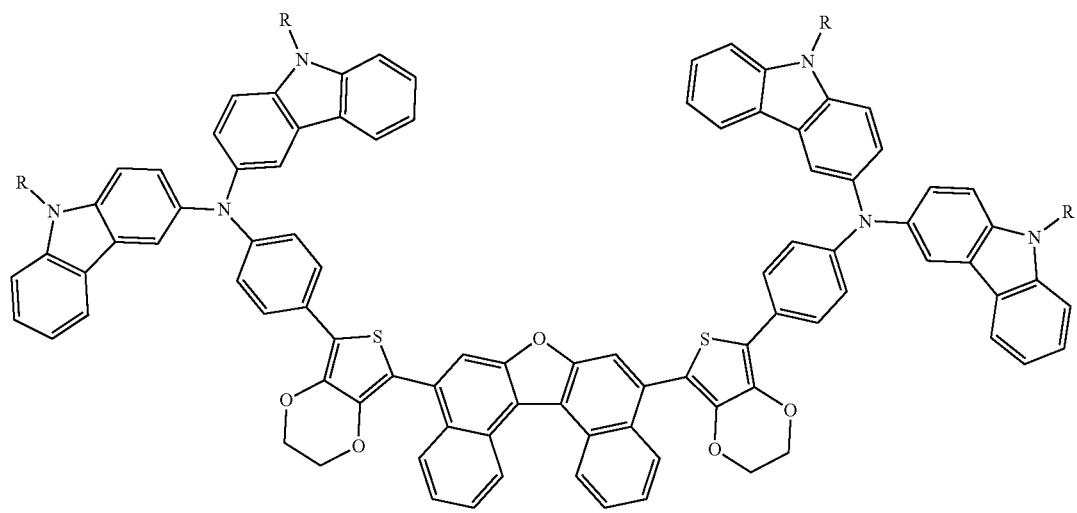
(8)
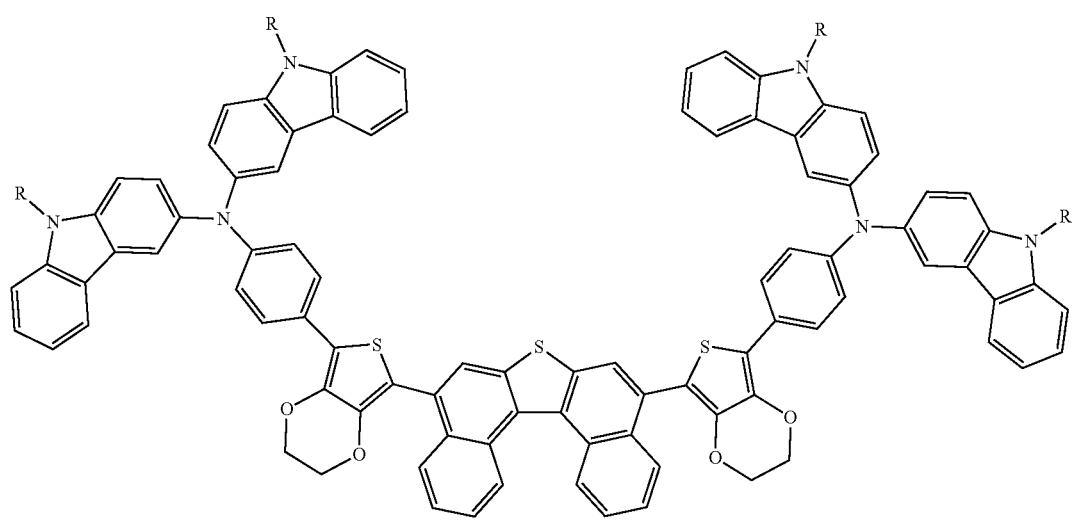

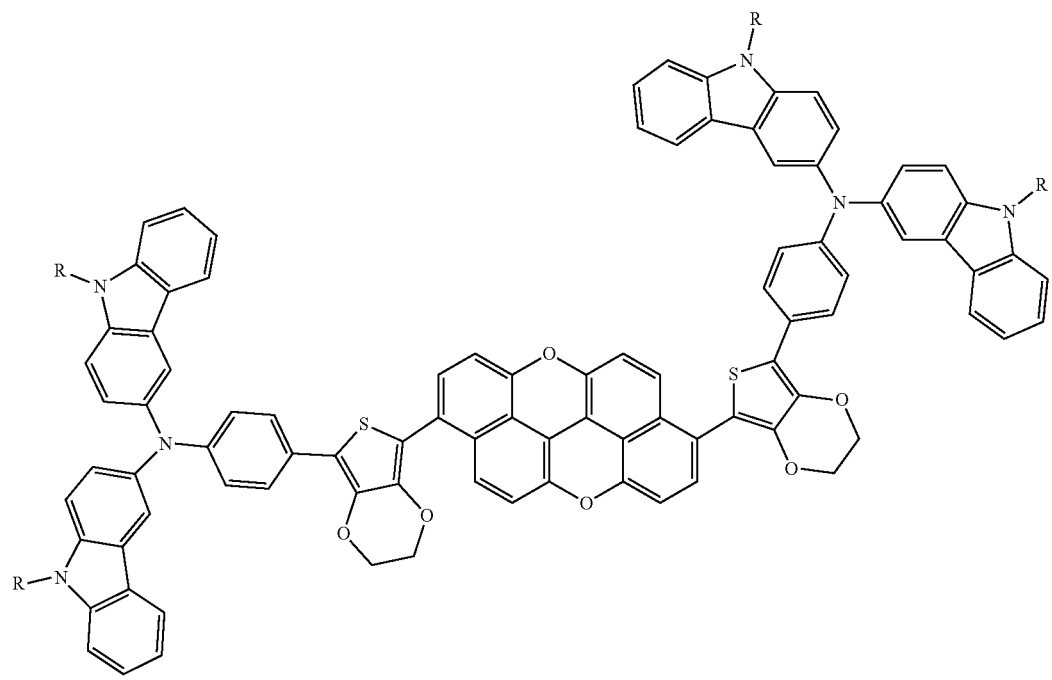
(9)
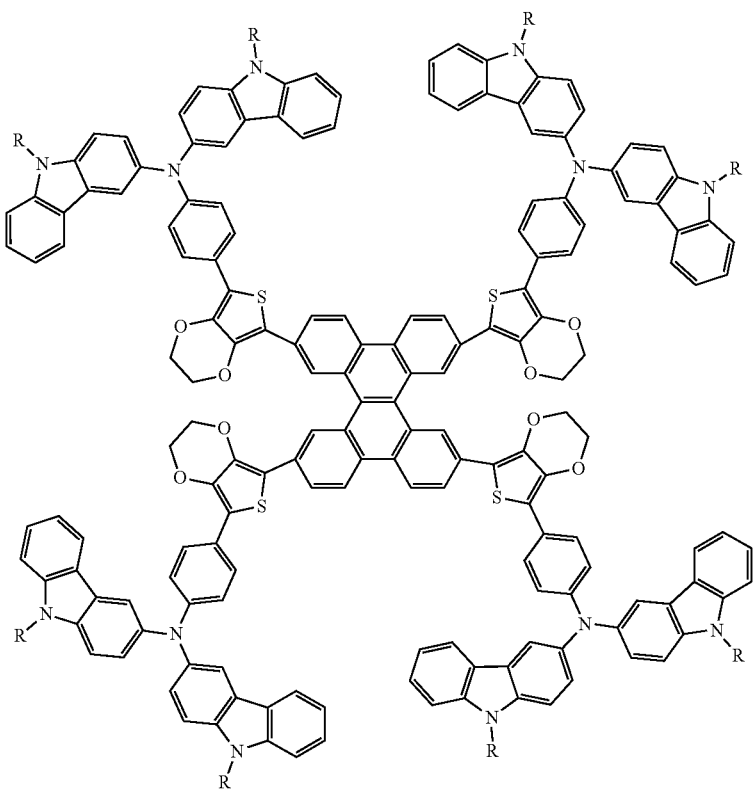
(10)

-continued
(11)
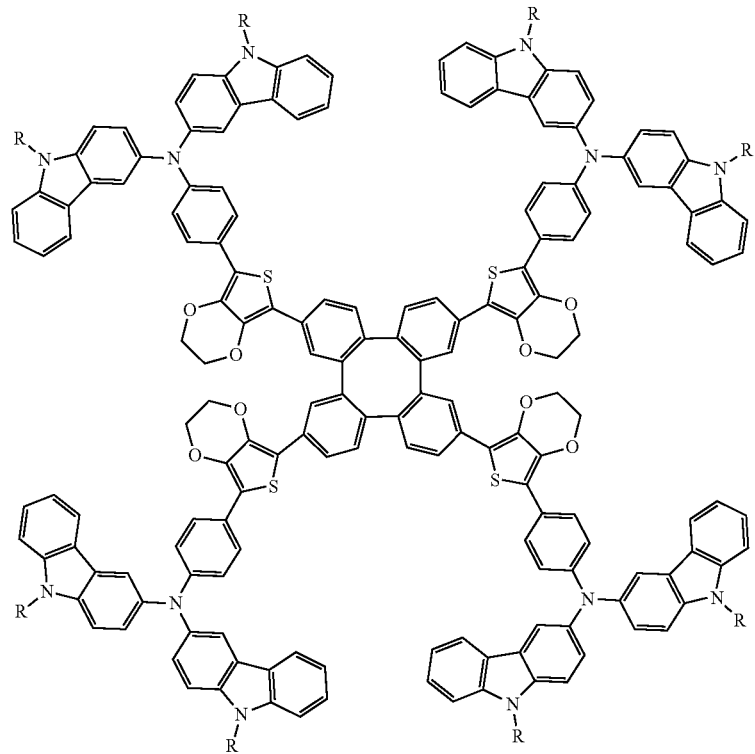
(12)
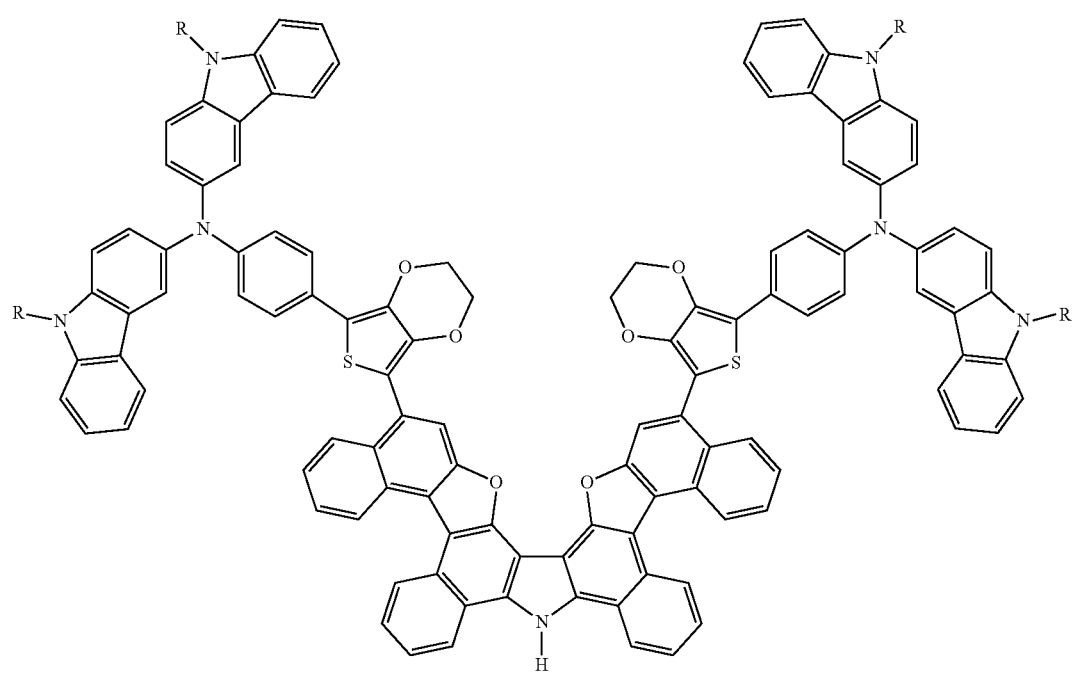

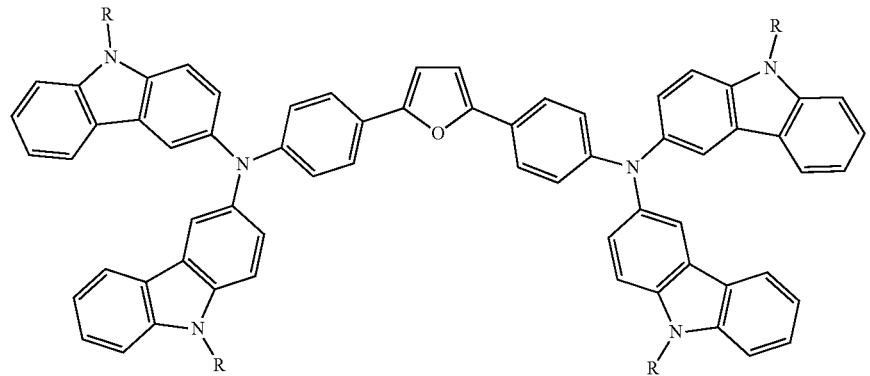
(13)
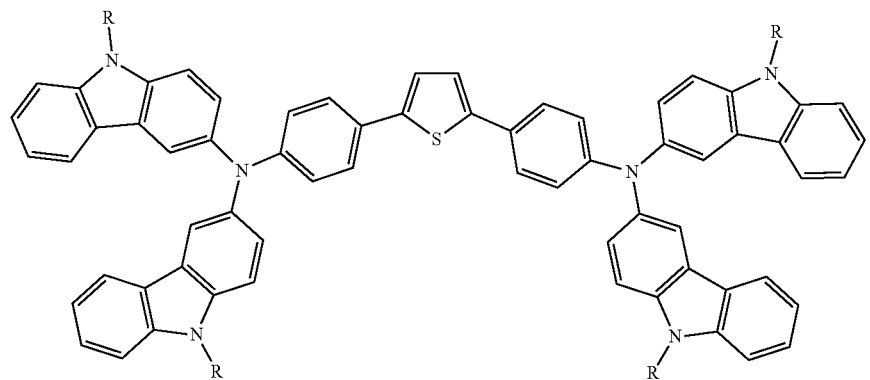
(14)
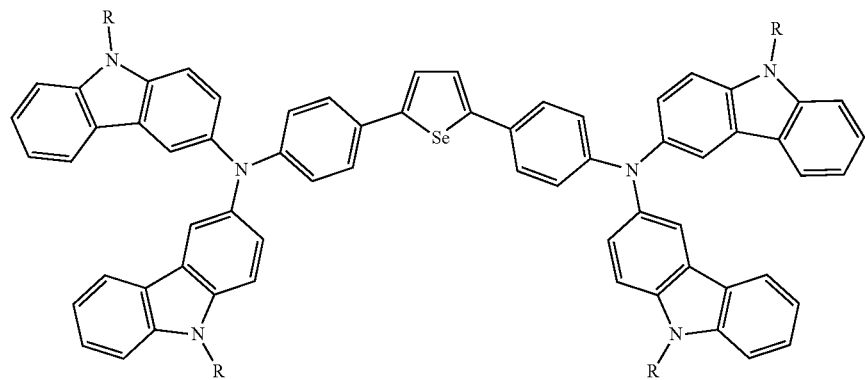
(15)
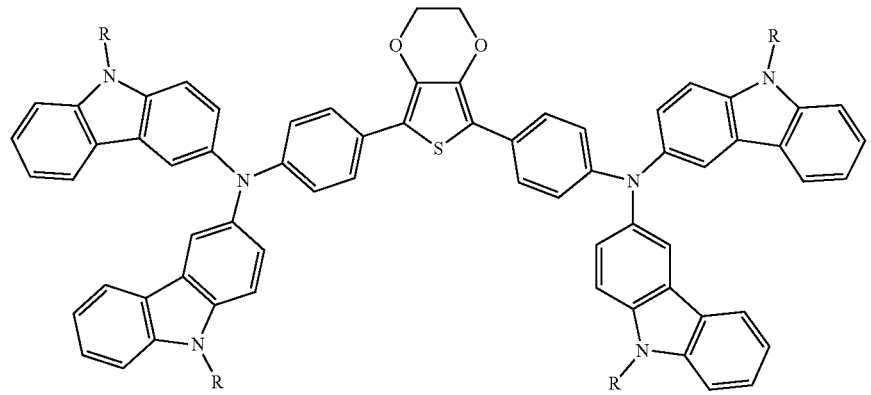
(16)

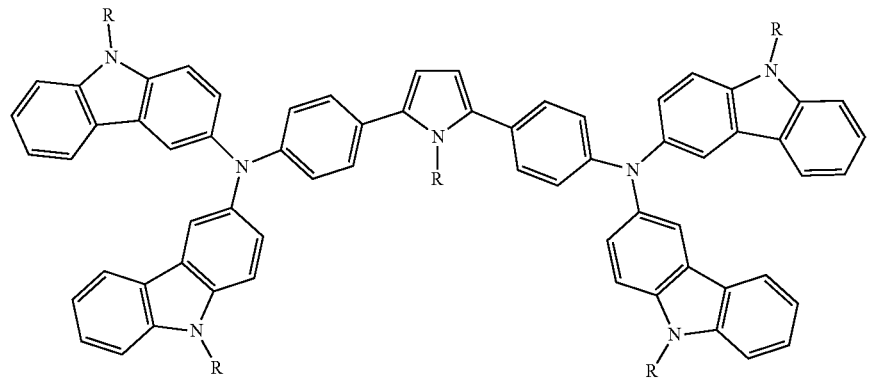
(17)
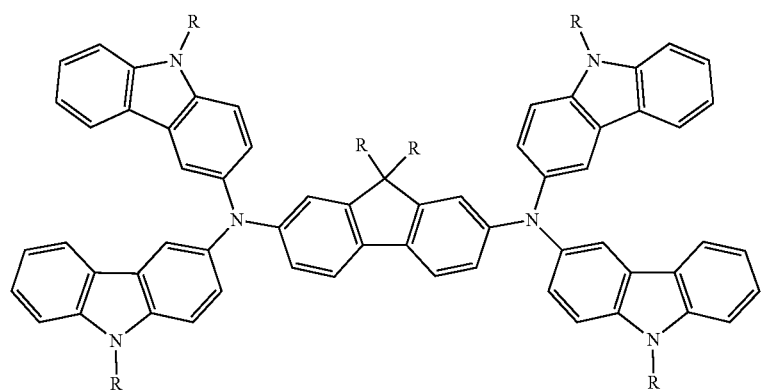
(18)
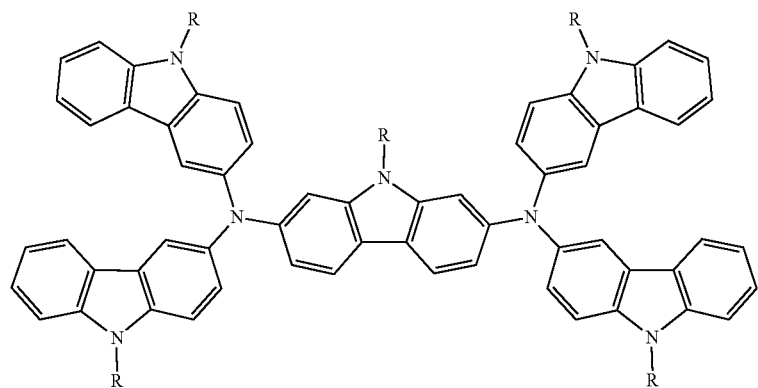
(19)
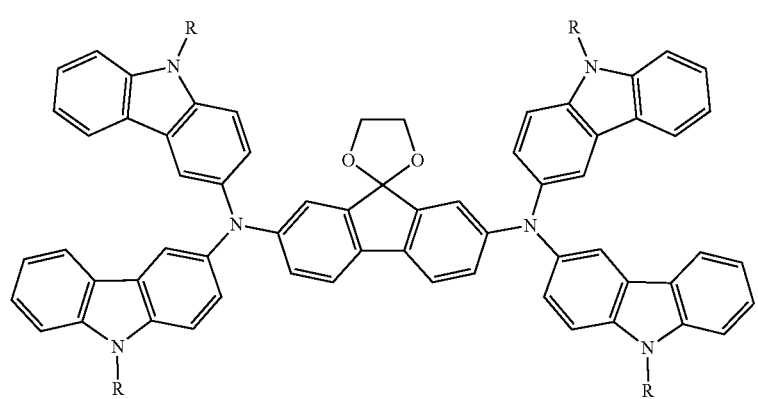
(20)

-continued
(21)
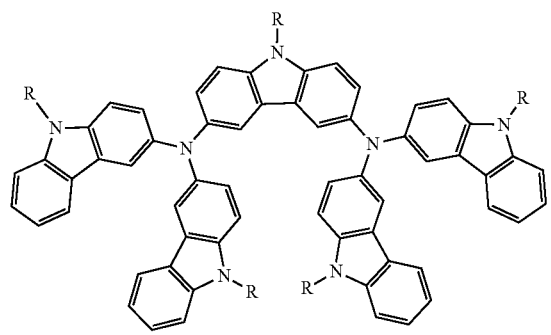
(22)
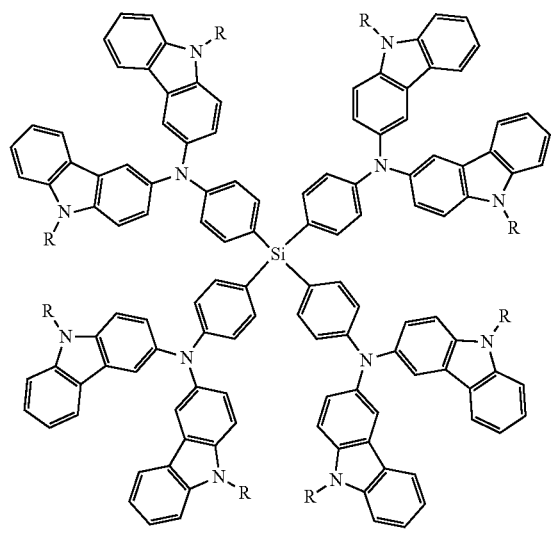
(23)
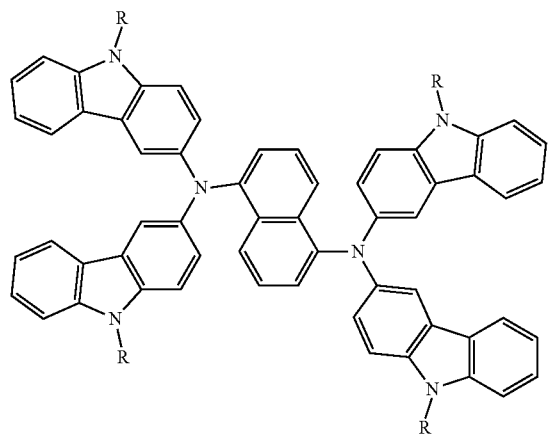
(24)
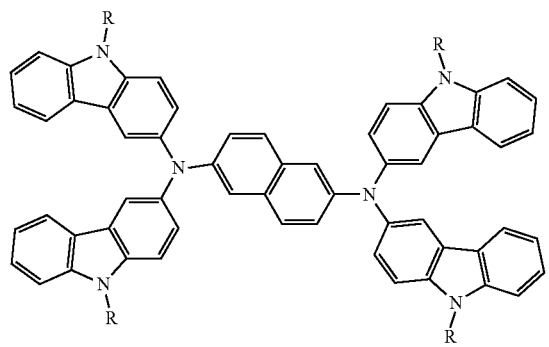
(25)
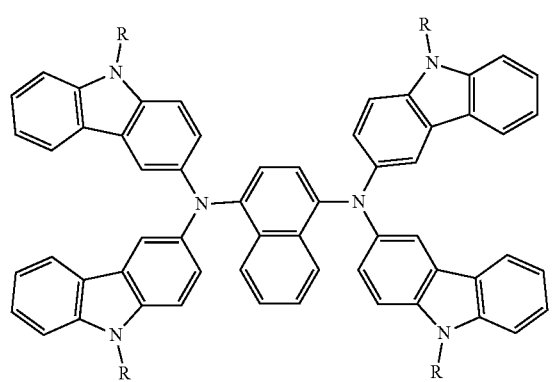
(26)
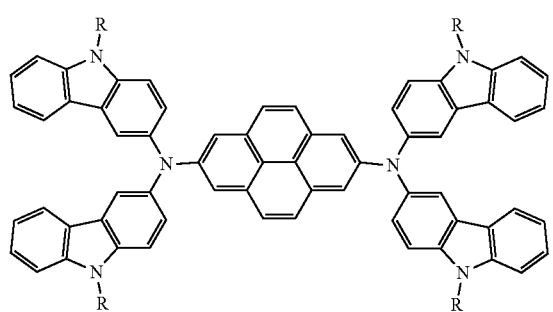

-continued
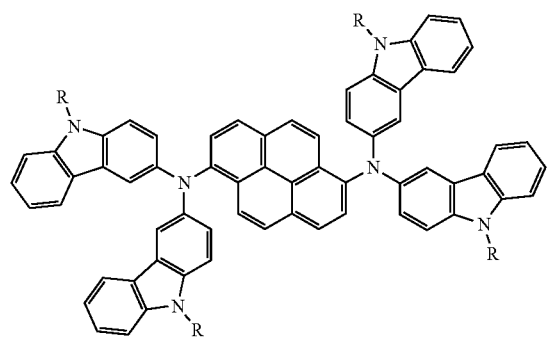
(27)
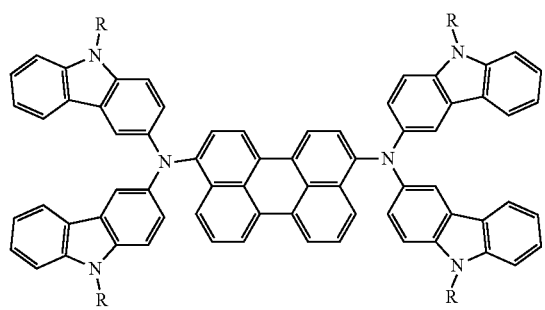
(28)
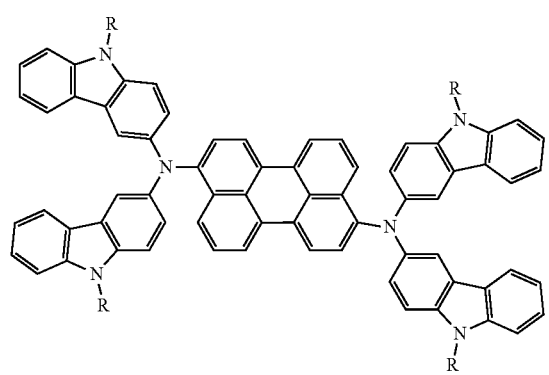
(29)
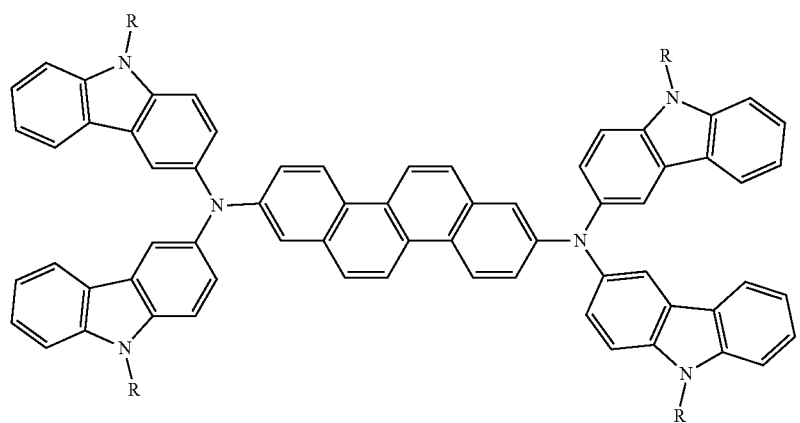
(30)
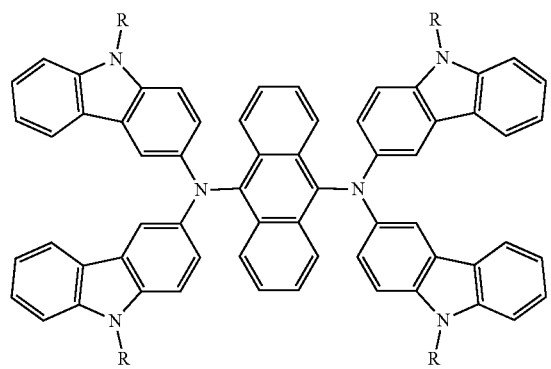
(31)
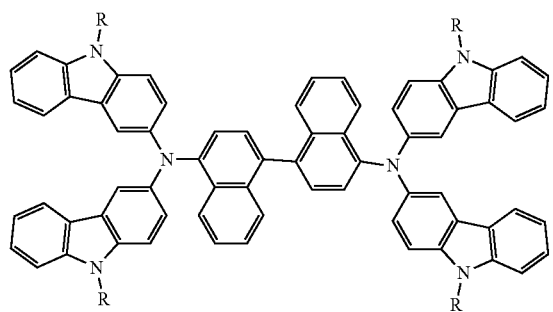
(32)

-continued
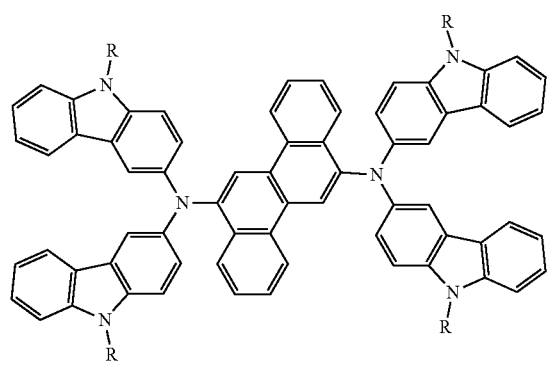
(33)
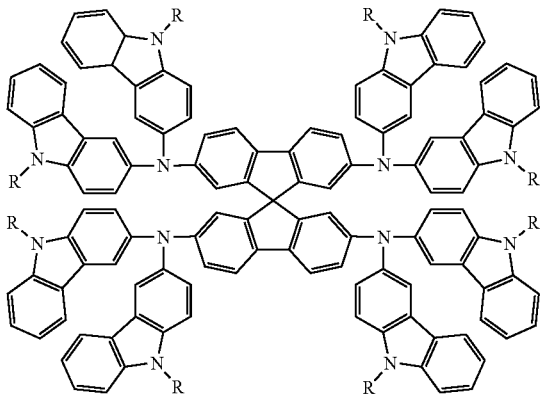
(34)
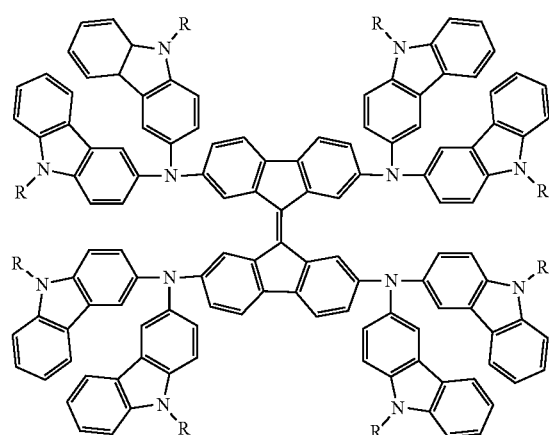
(35)
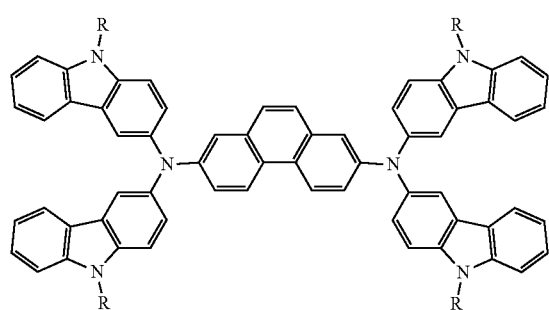
(36)
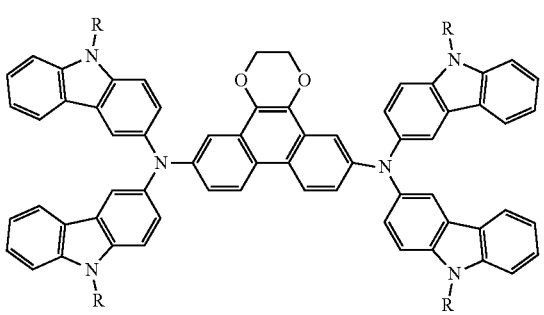
(37)
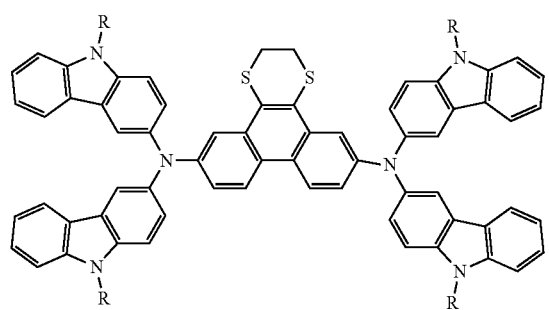
(38)
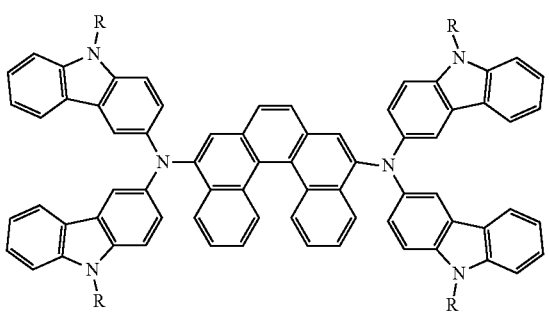
(39)

-continued
(40)
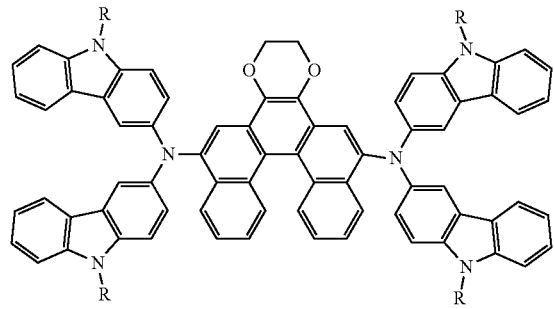
(41)
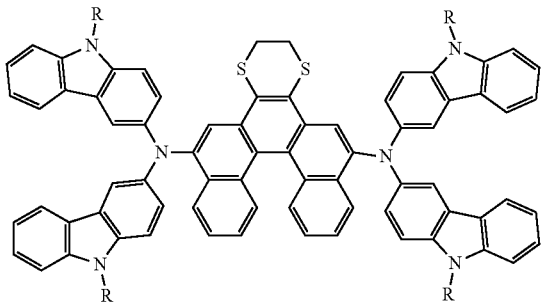
(42)
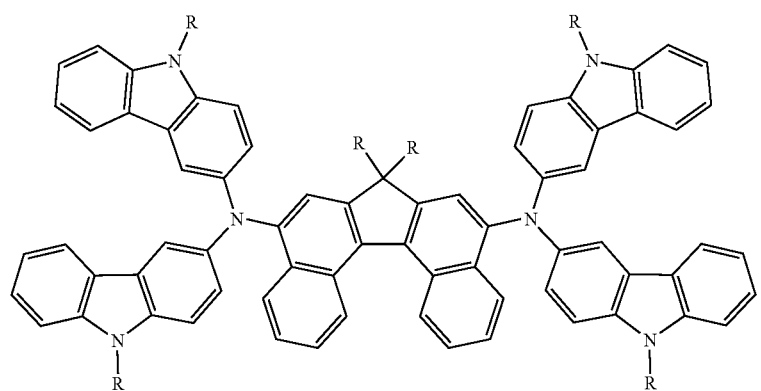
(43)
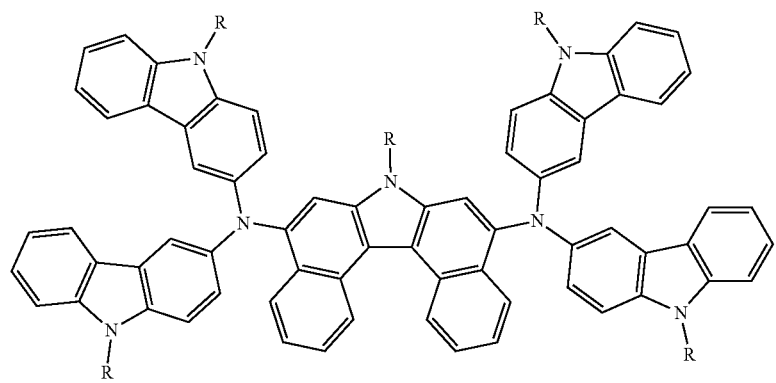
(44)
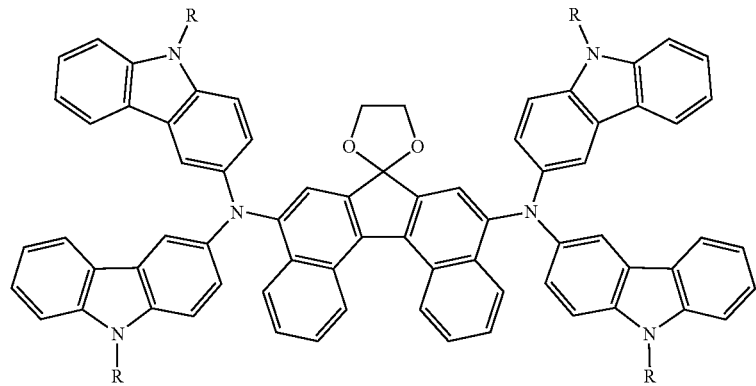

-continued
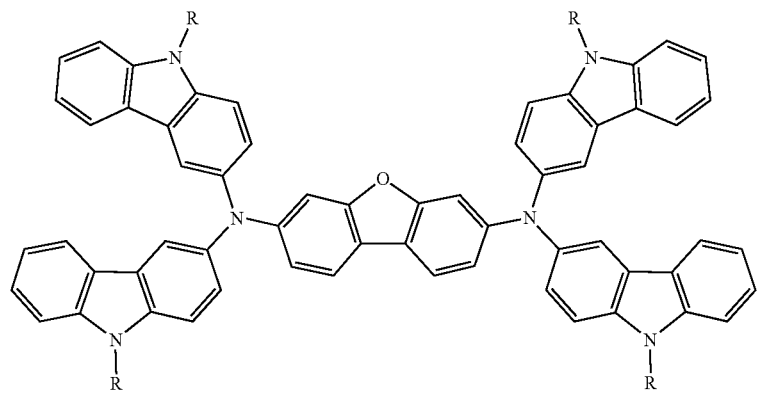
(45)
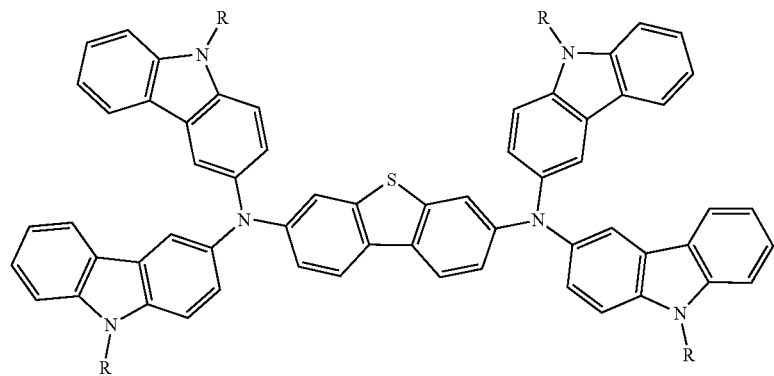
(46)
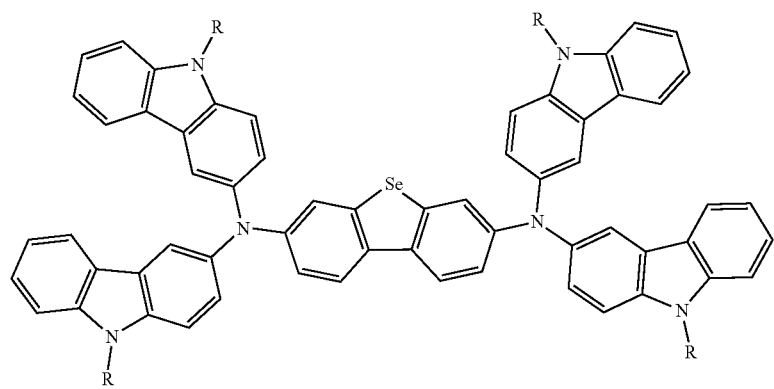
(47)
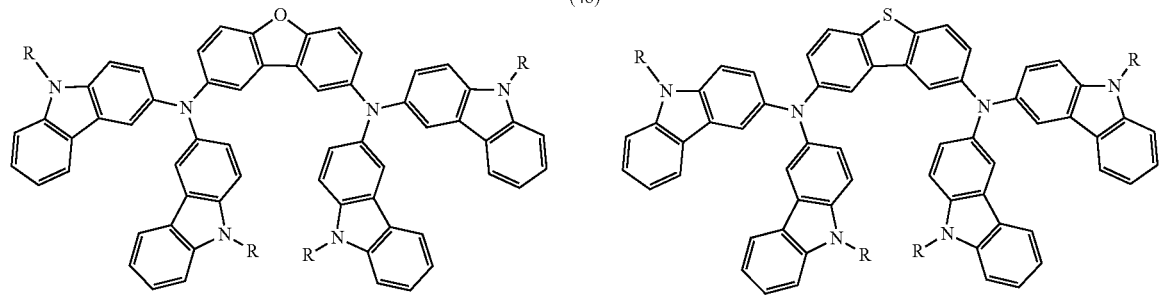
(48)     (49)

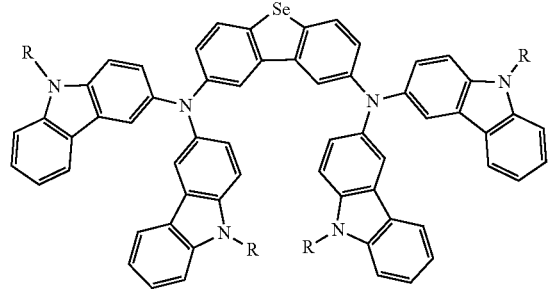
(50)
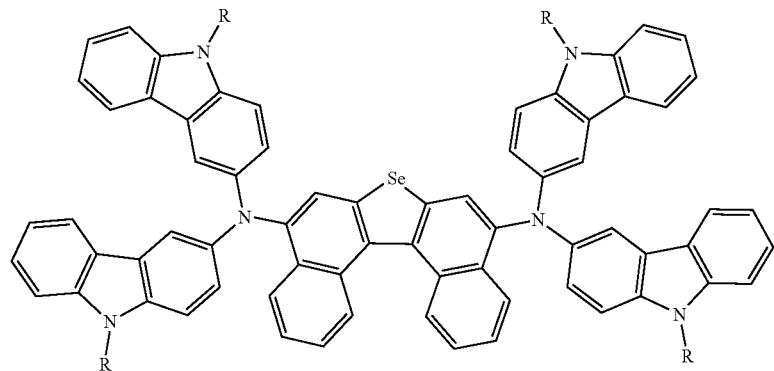
(51)
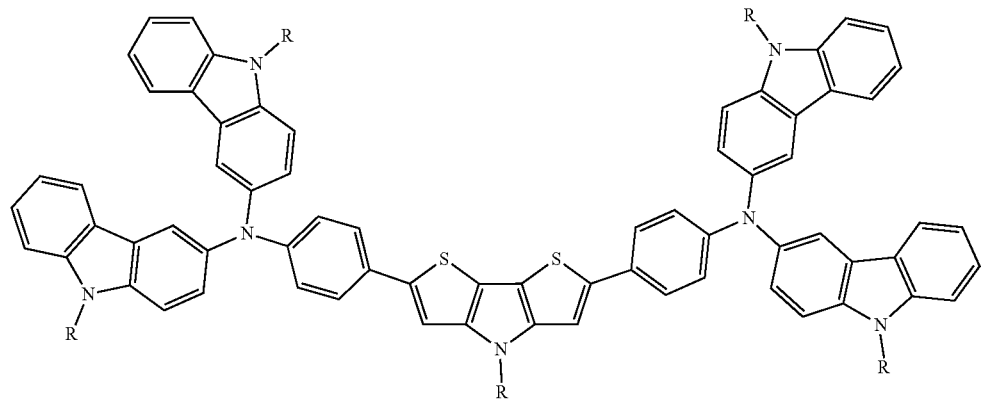
(52)
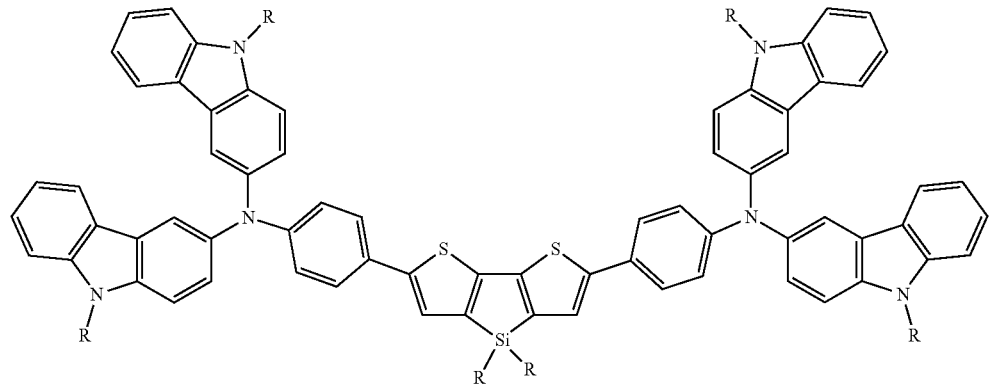
(53)

-continued
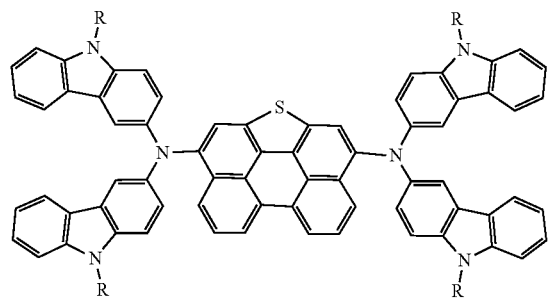
(54)
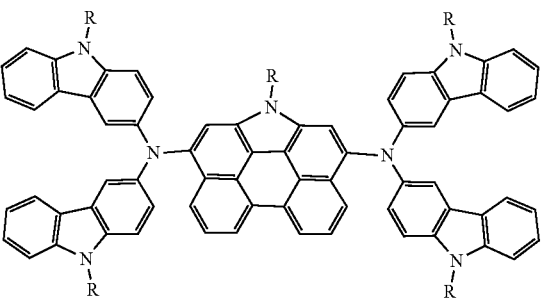
(55)
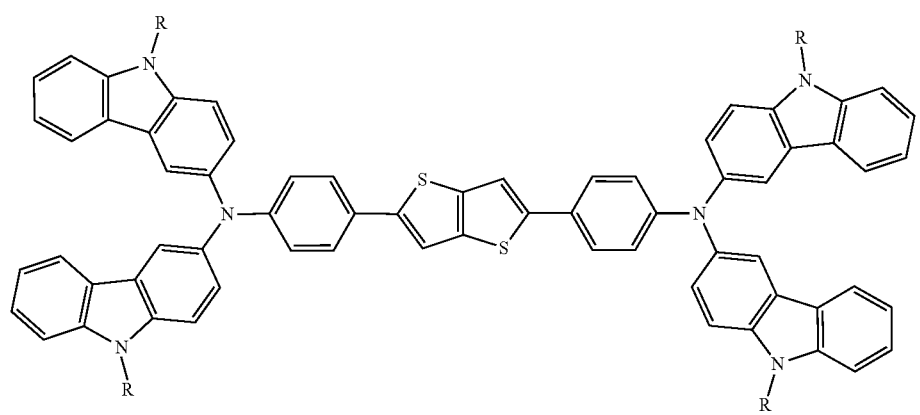
(56)
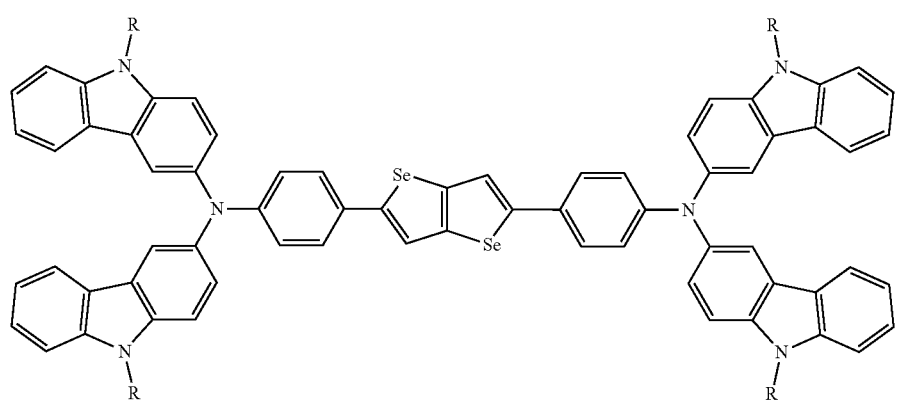
(57)
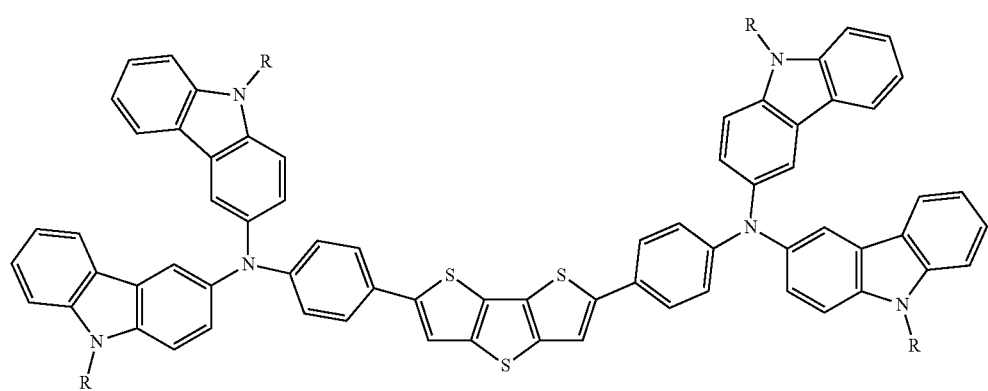
(58)

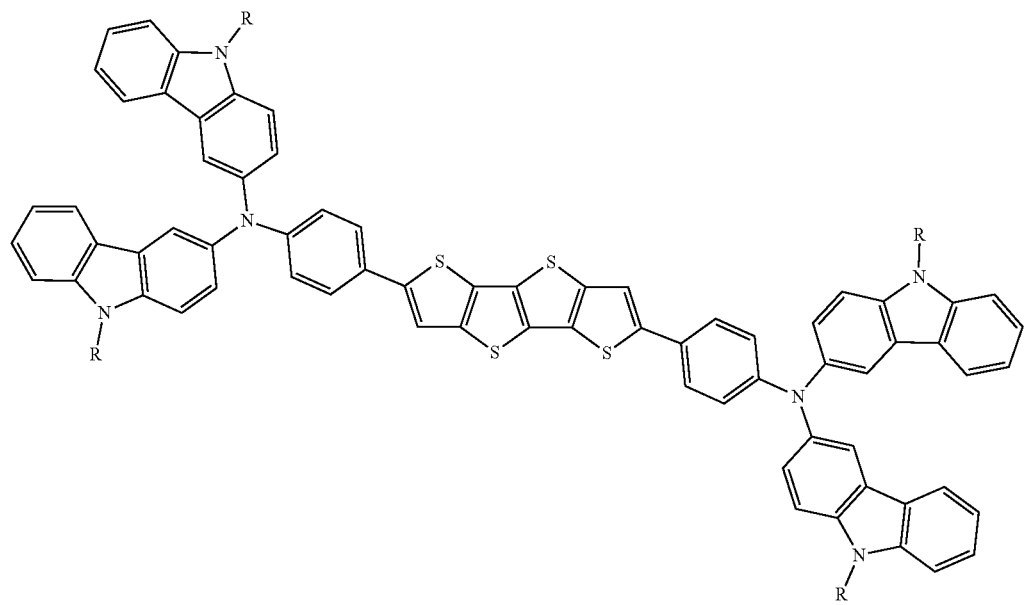
(59)
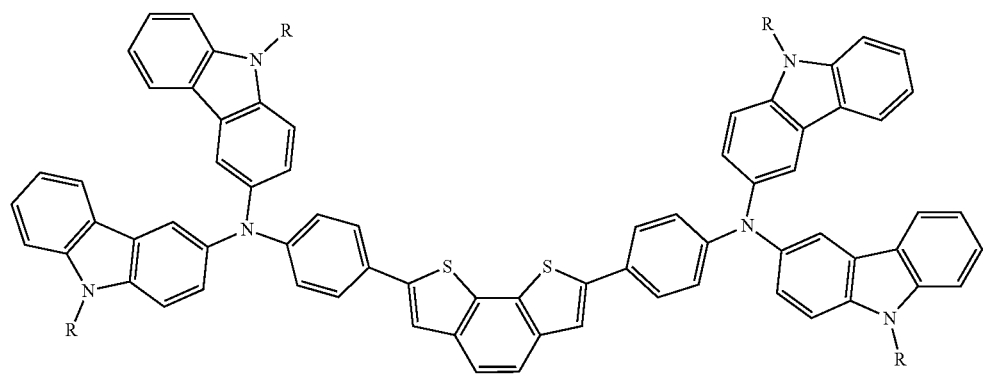
(60)
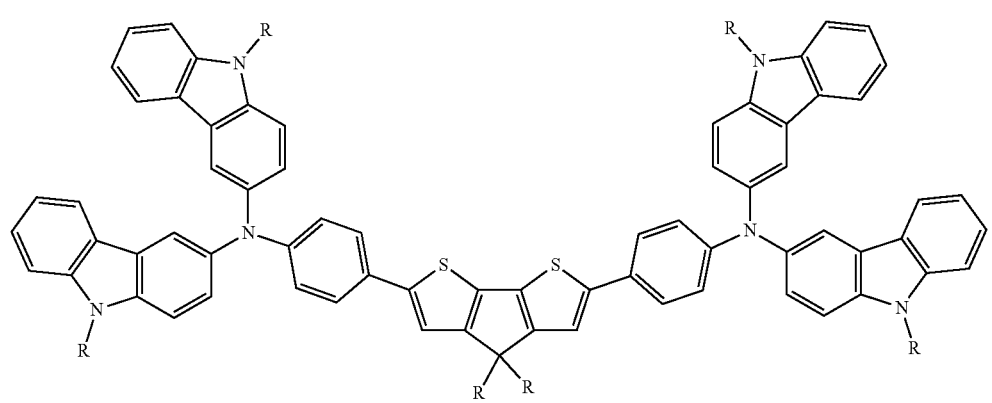
(61)

-continued
(62)
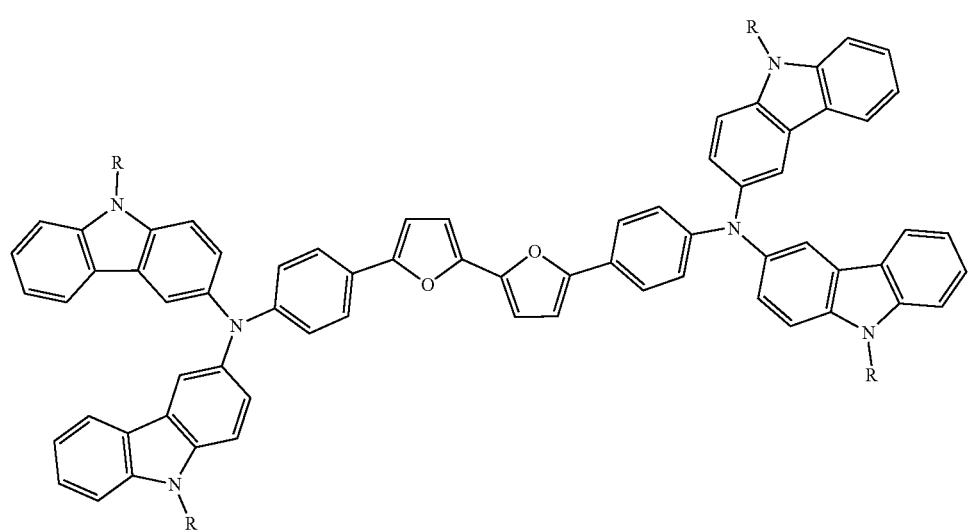
(63)
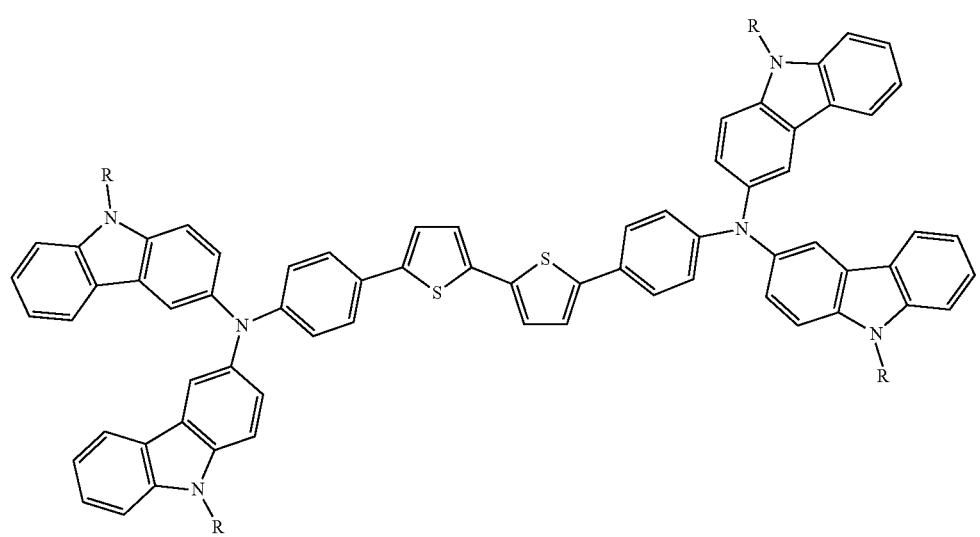
(64)
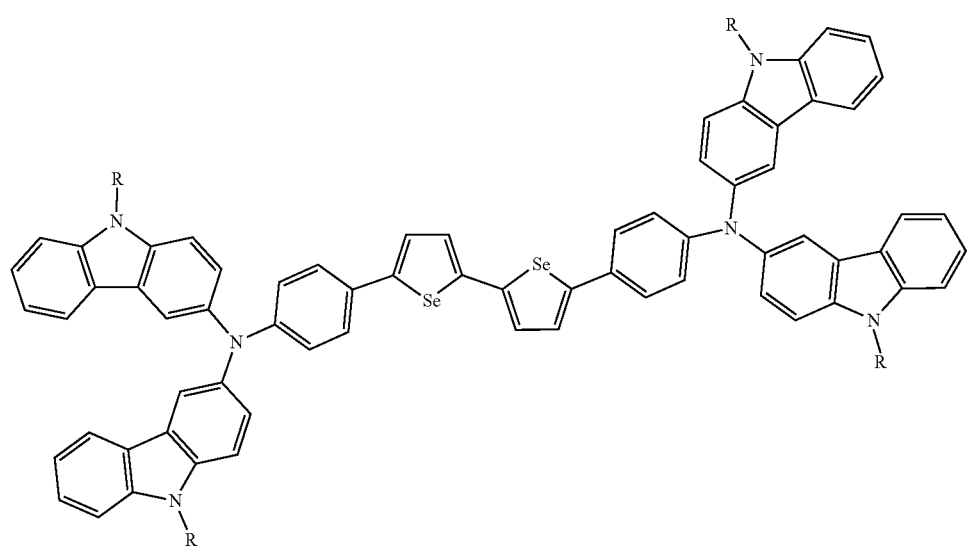

(65)
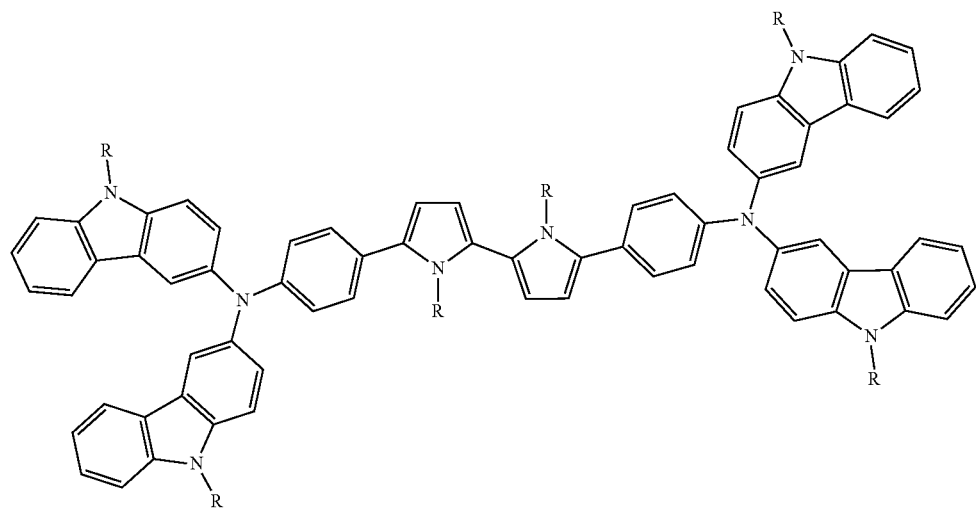
(66)
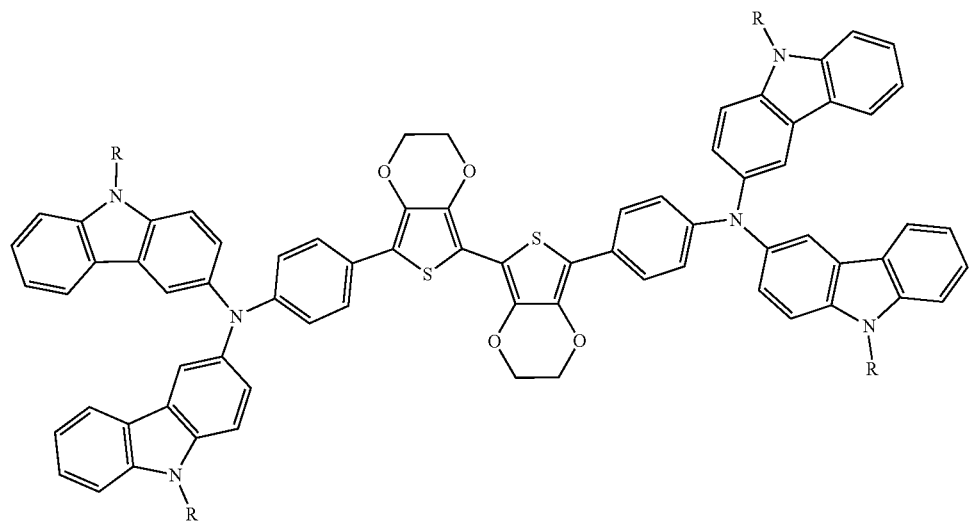
(67)
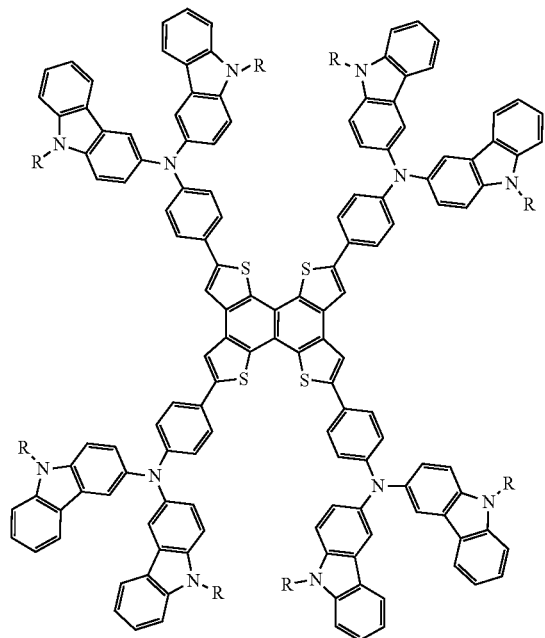
(68)
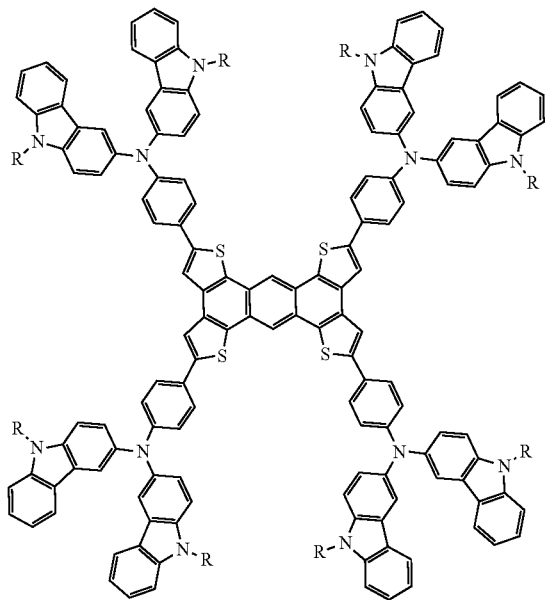

-continued
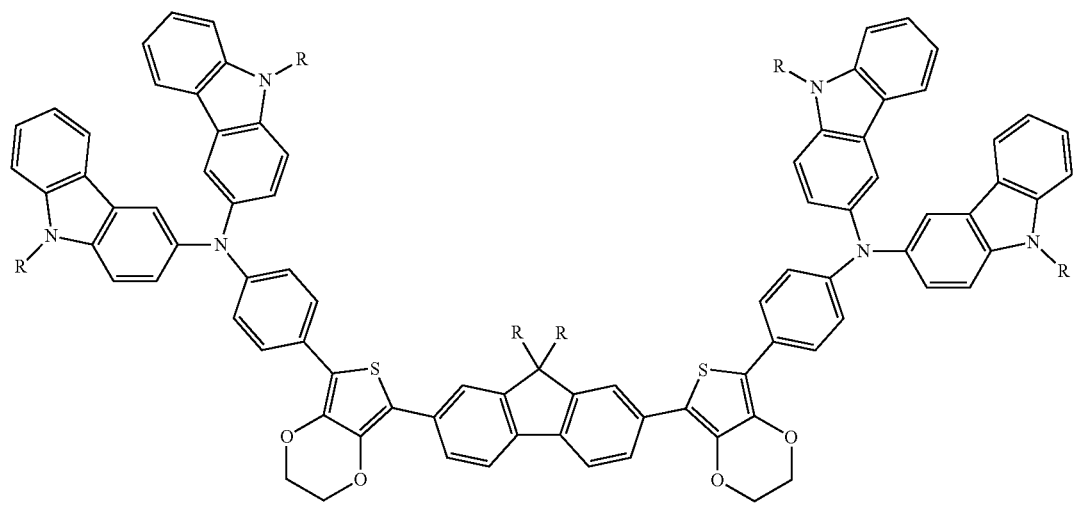
(69)
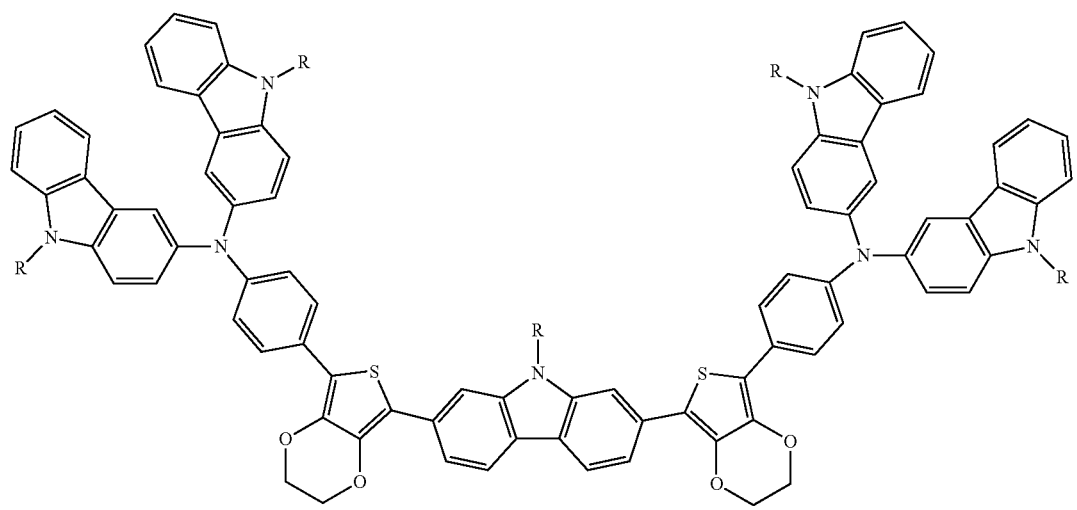
(70)
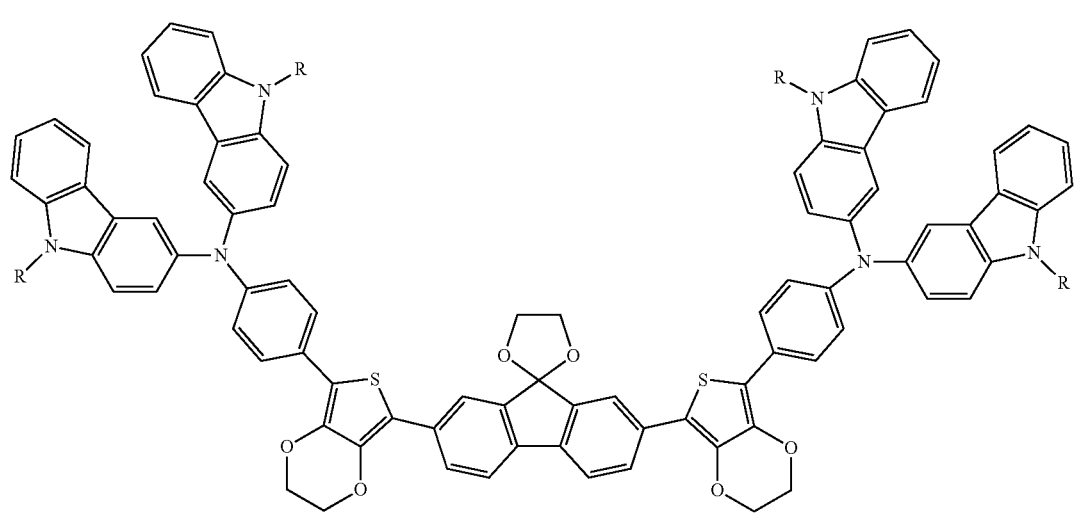
(71)

(72)
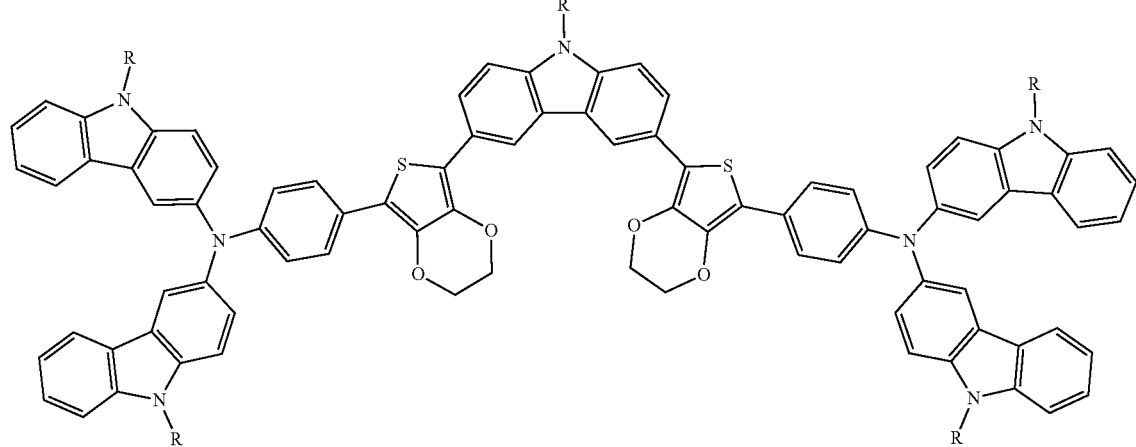
(73)
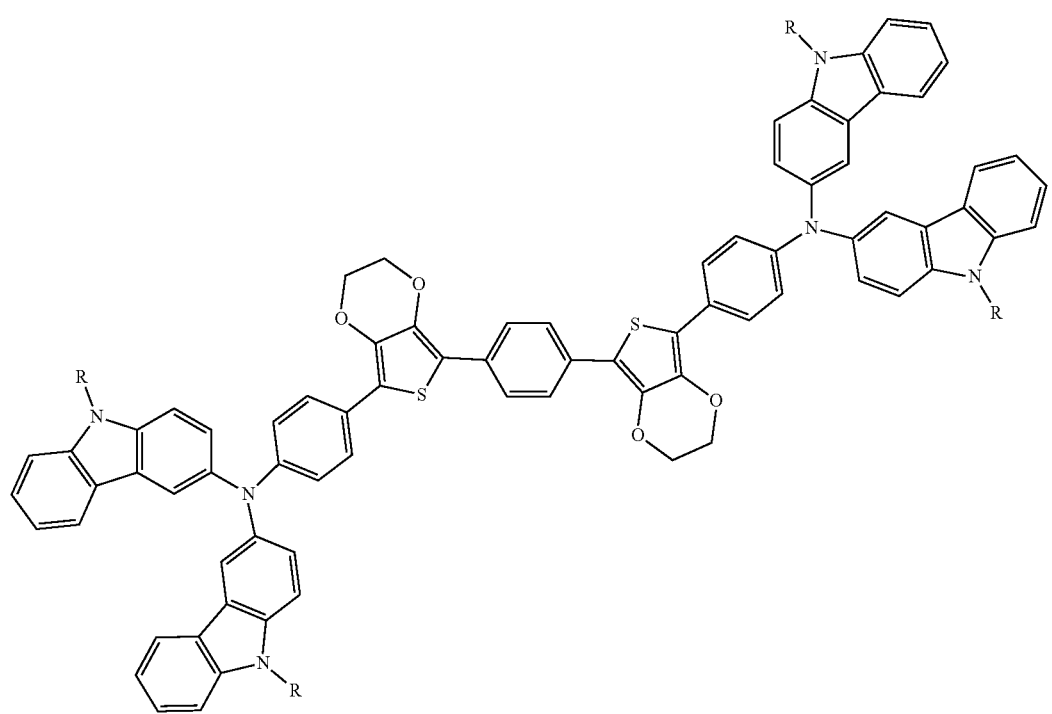

(74)
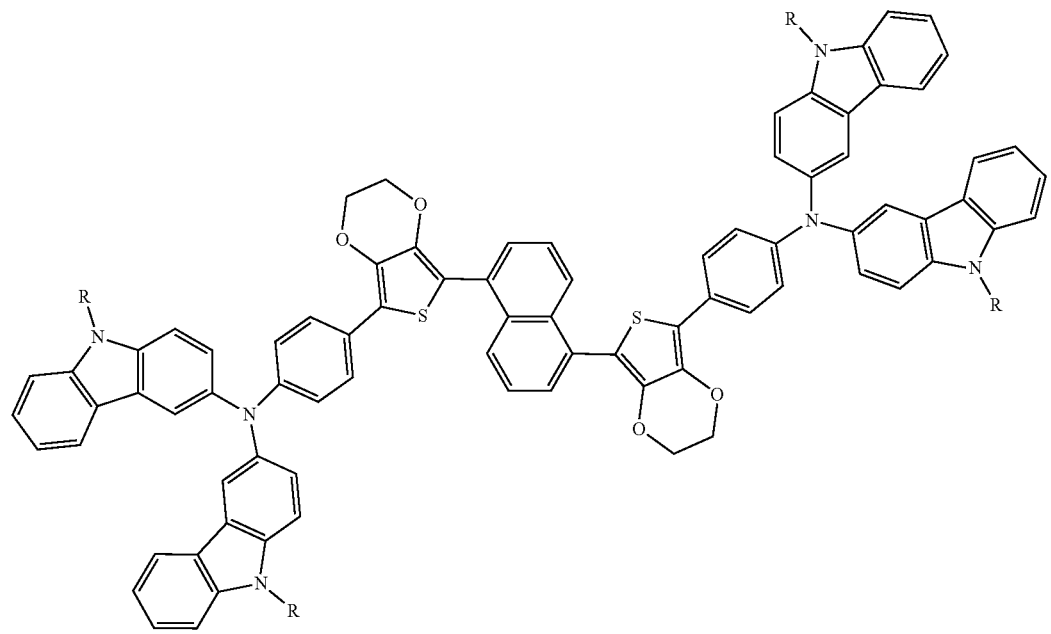
(75)
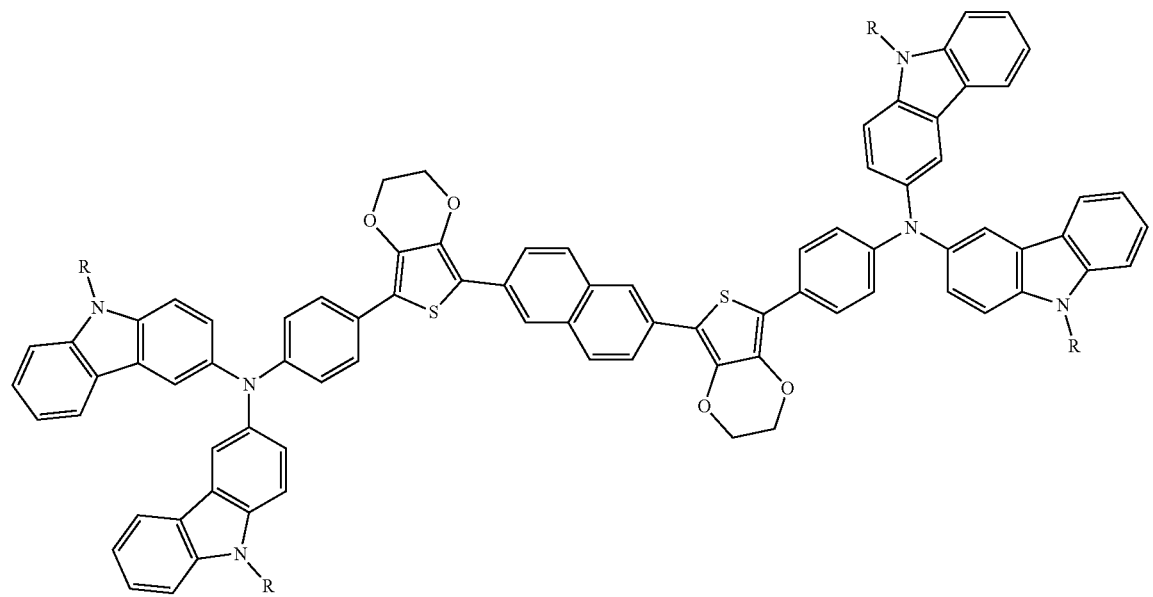

(76)
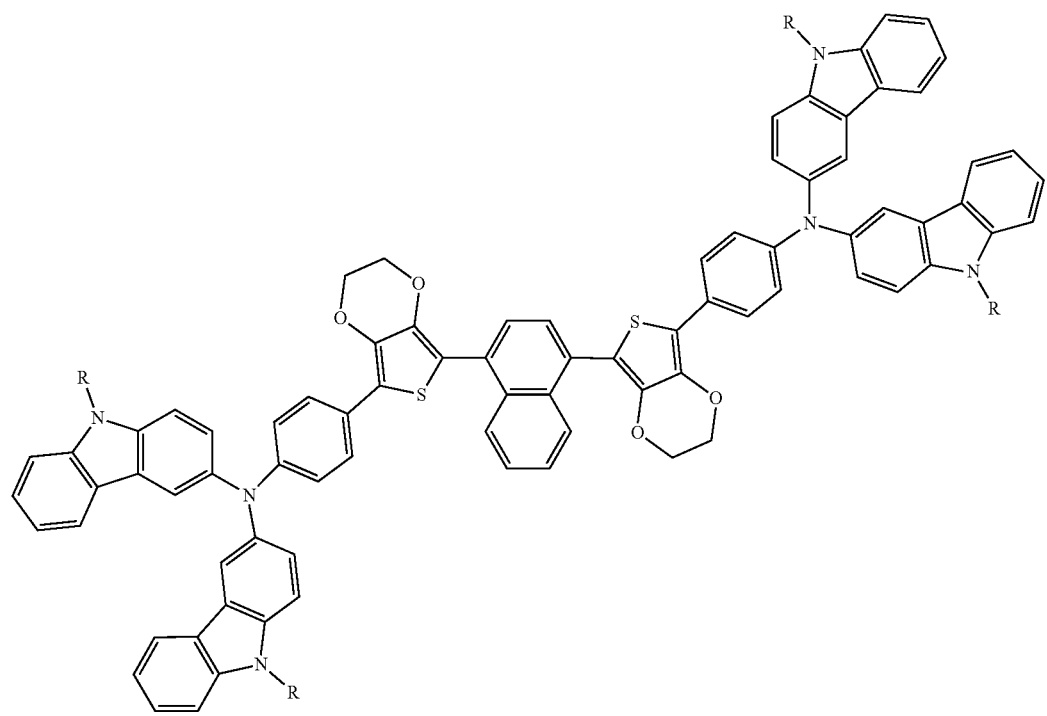
(77)
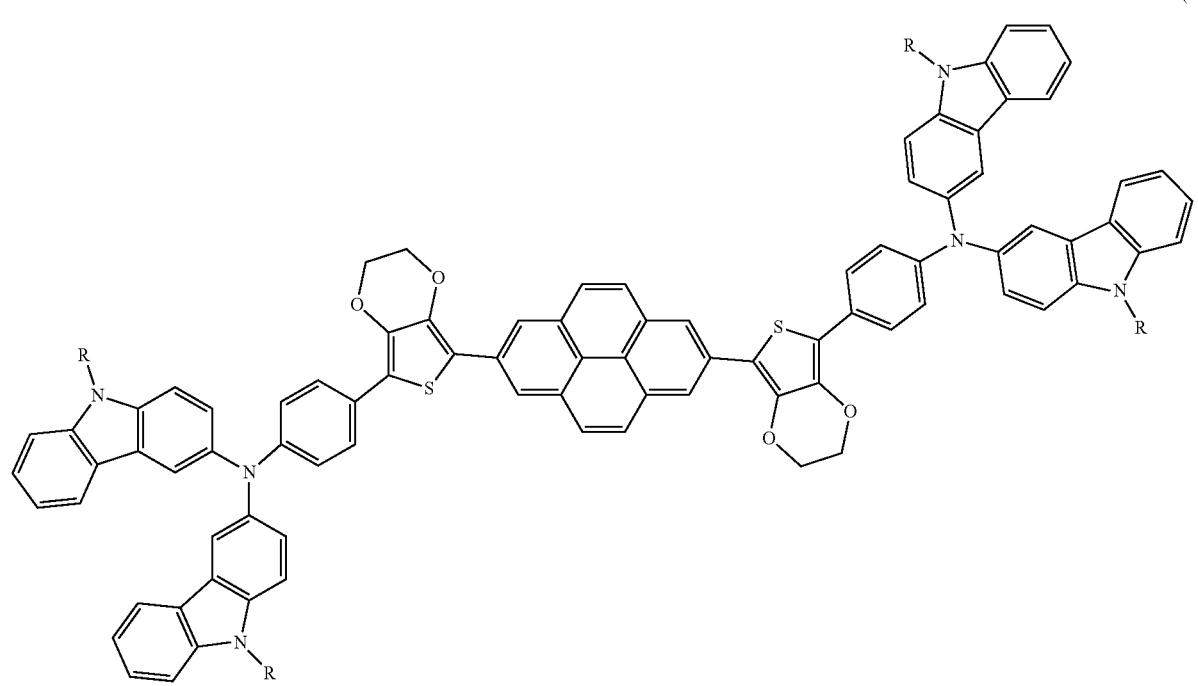

(78)
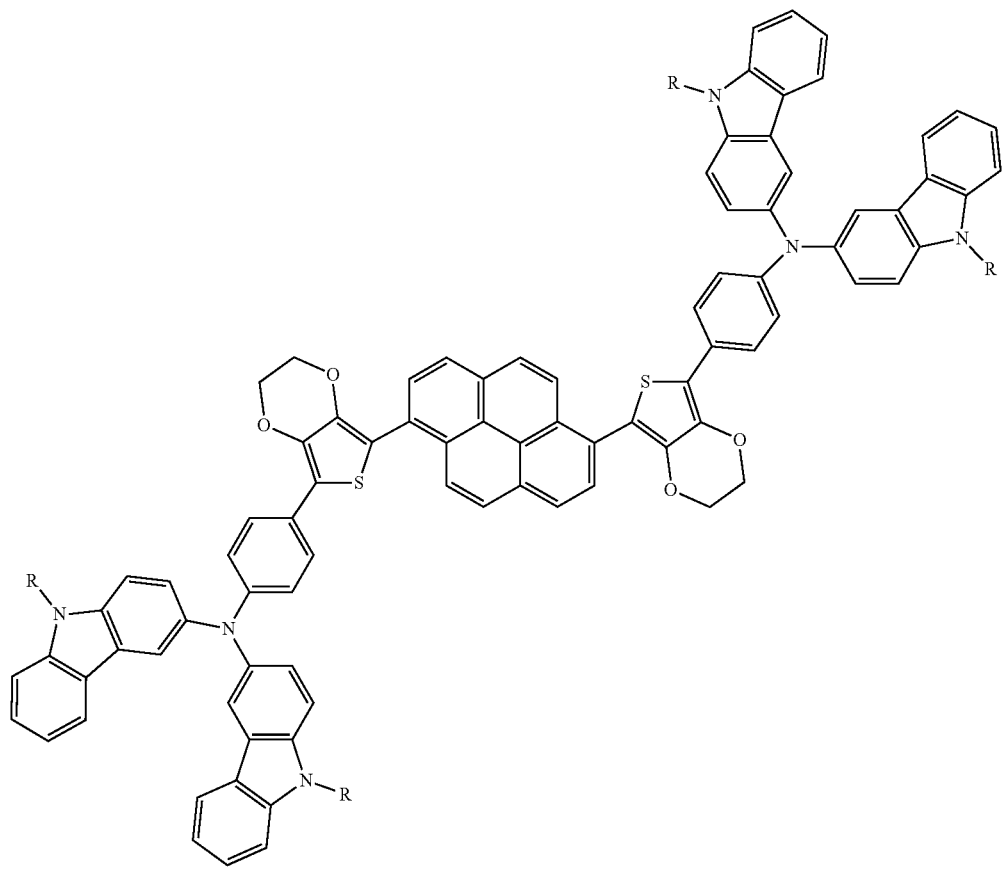
(79)
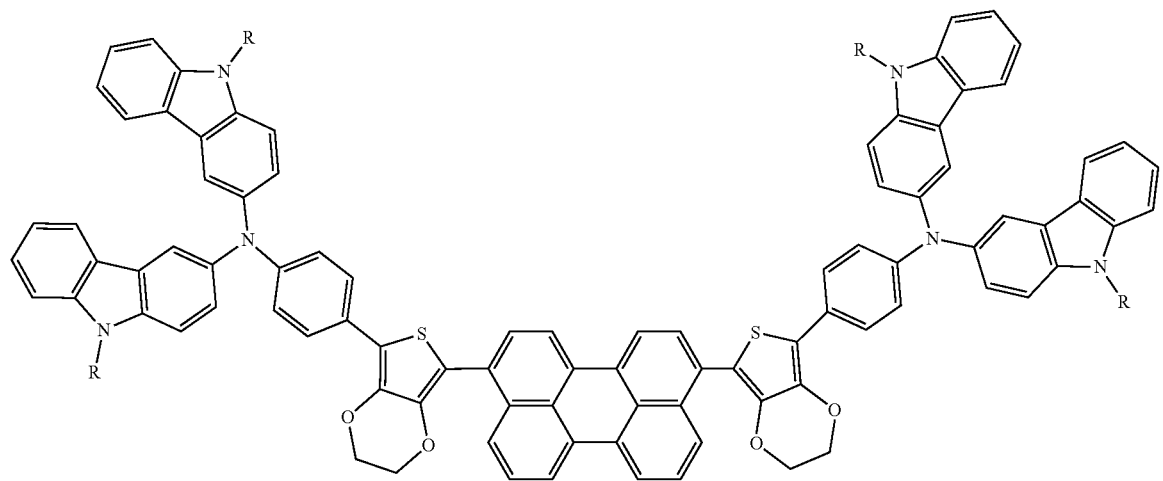

(80)
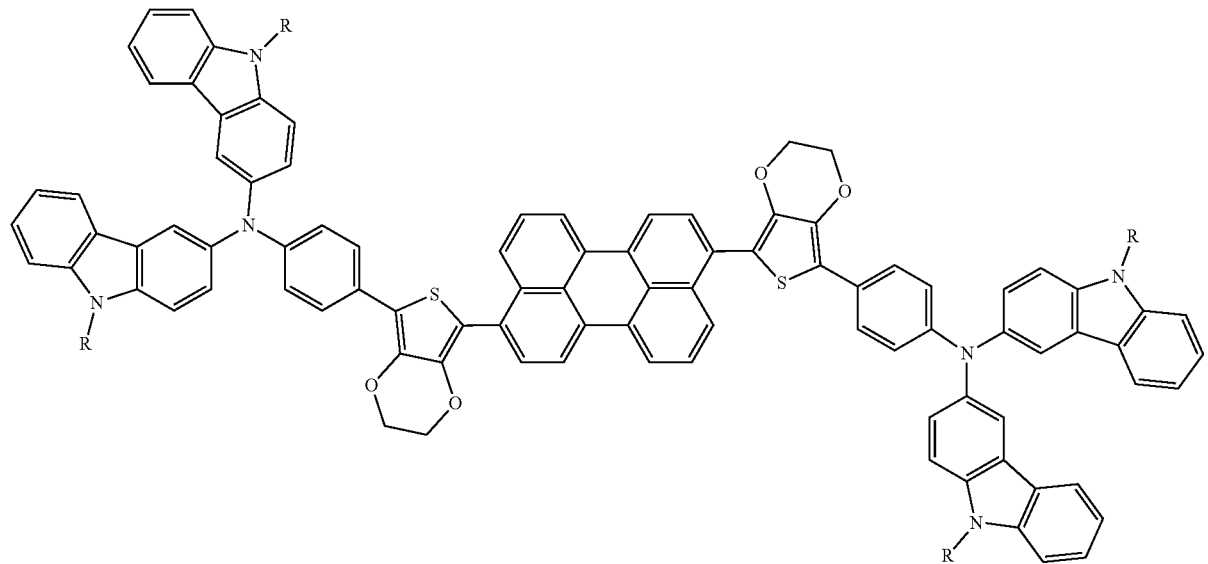
(81)
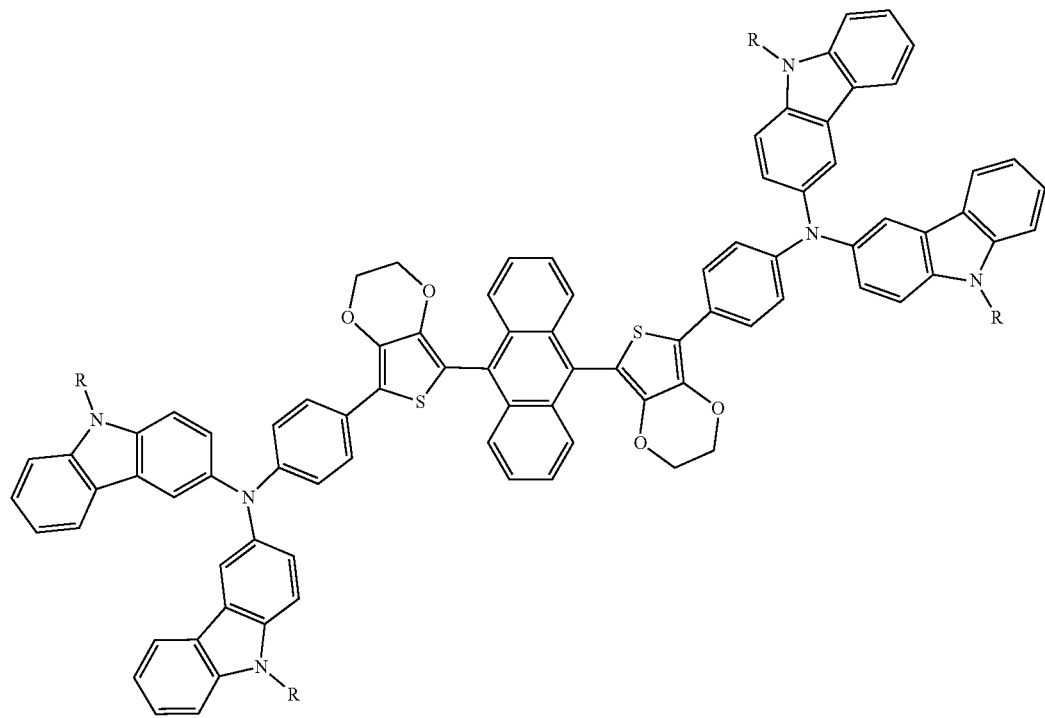

-continued
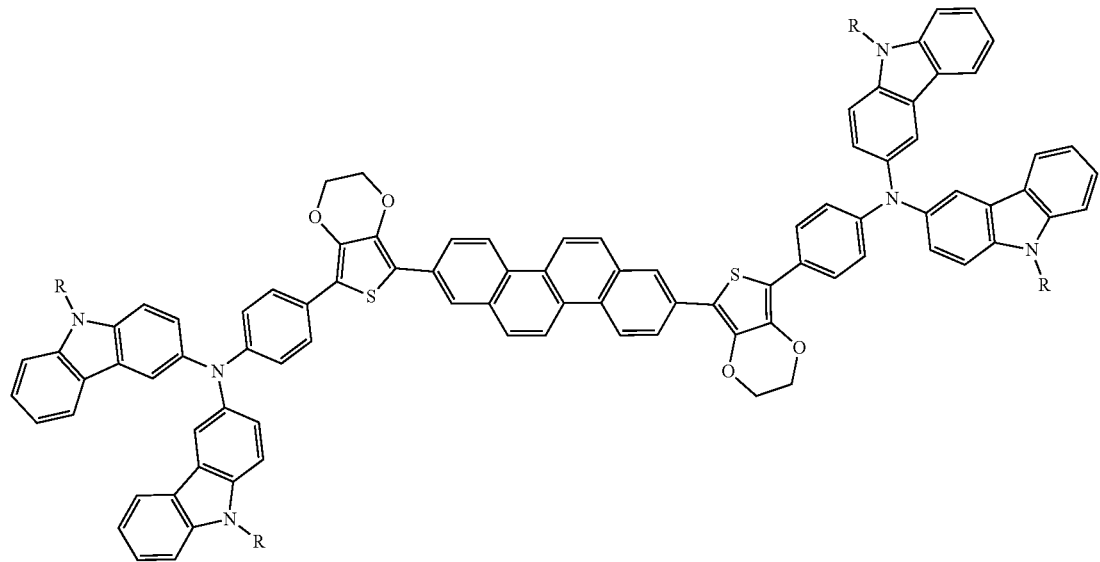
(82)
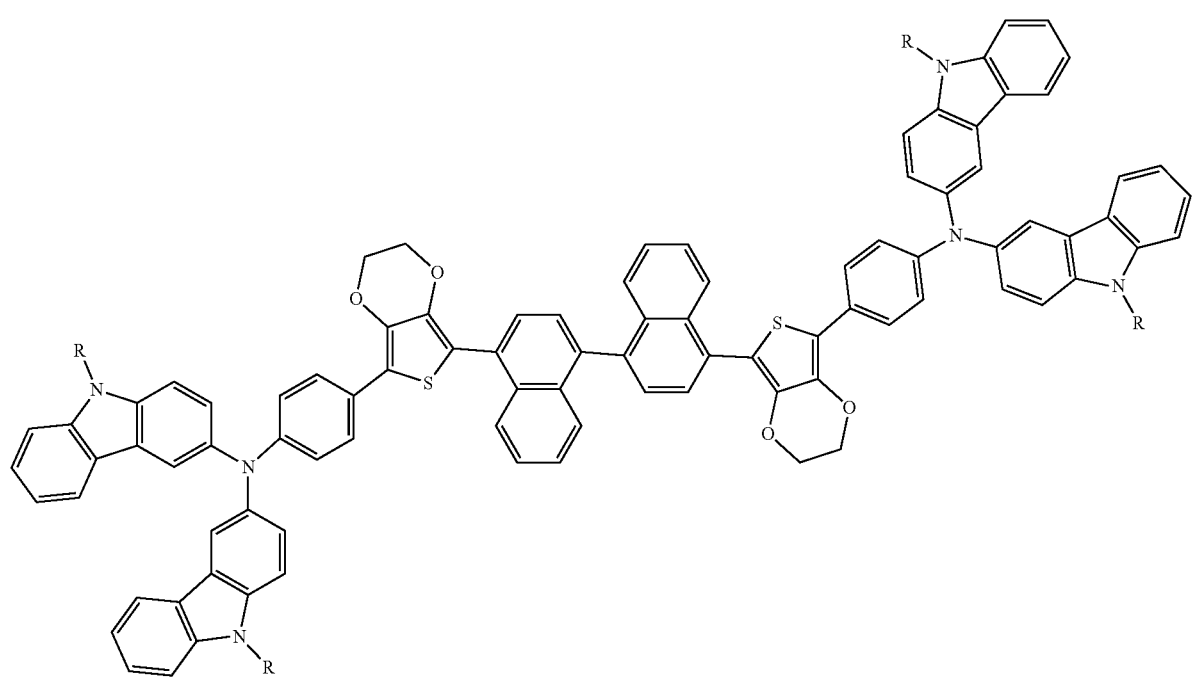
(83)

(84)
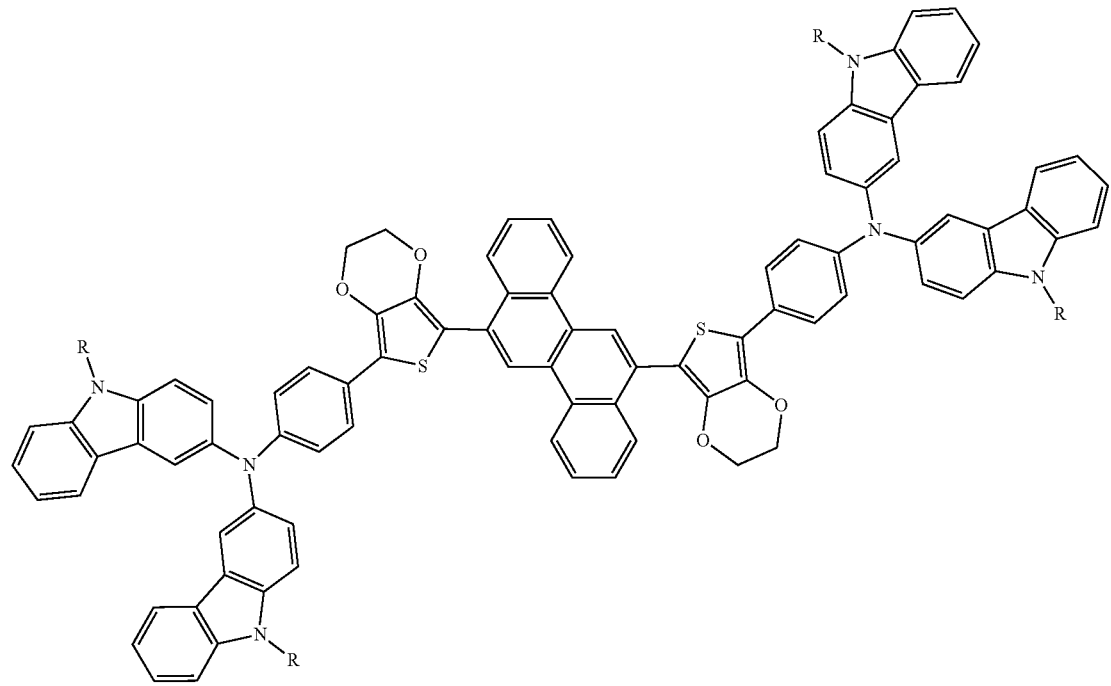
(85)
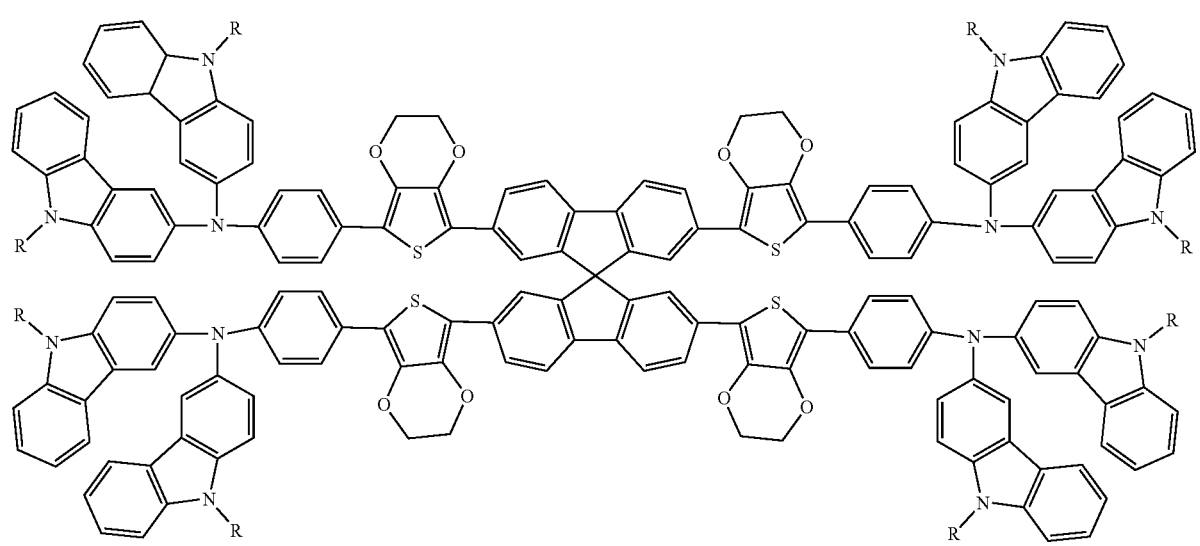

-continued
(86)
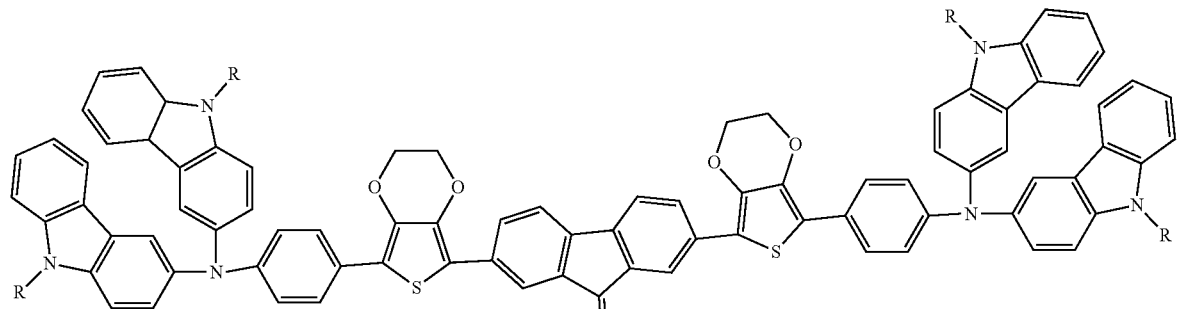
(87)
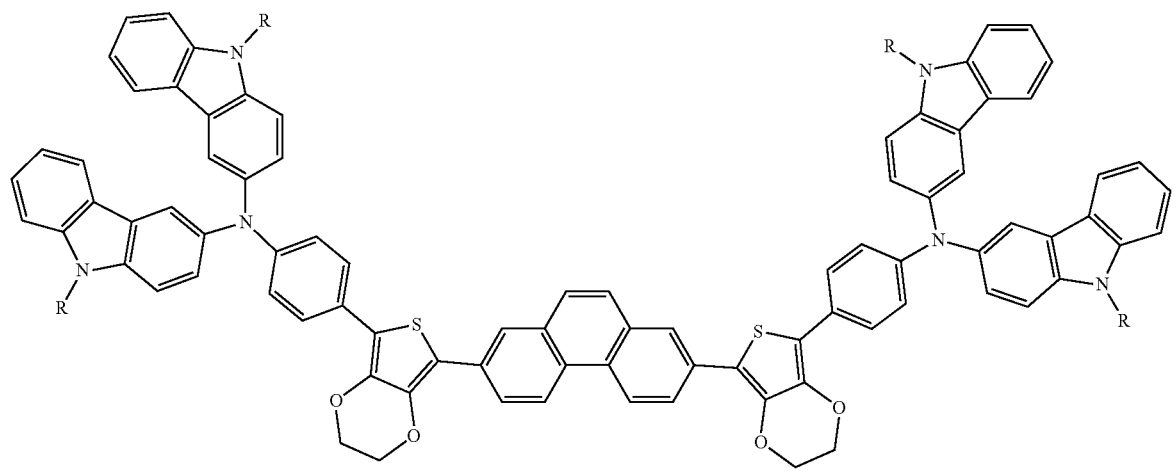
(88)
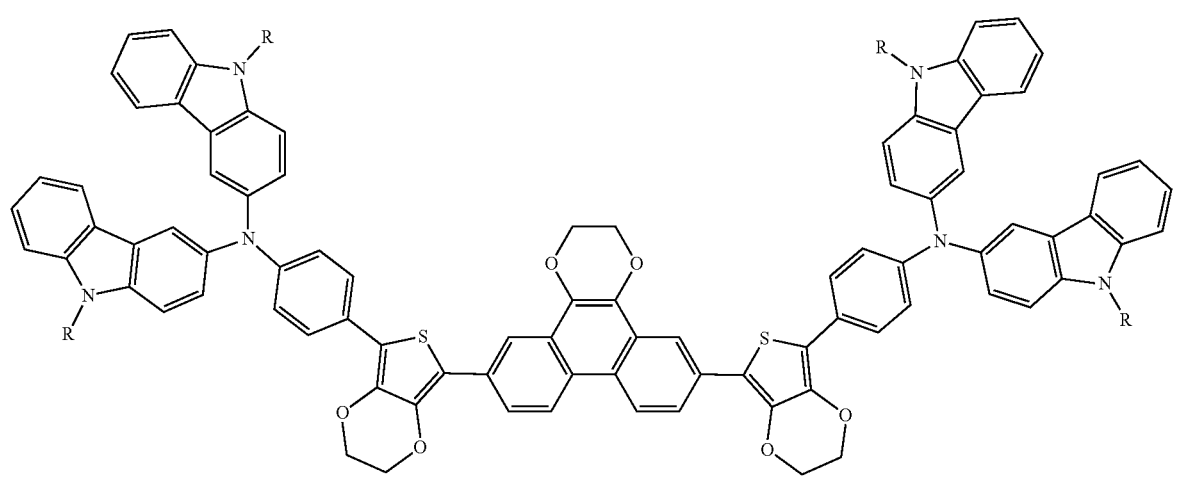

(89)
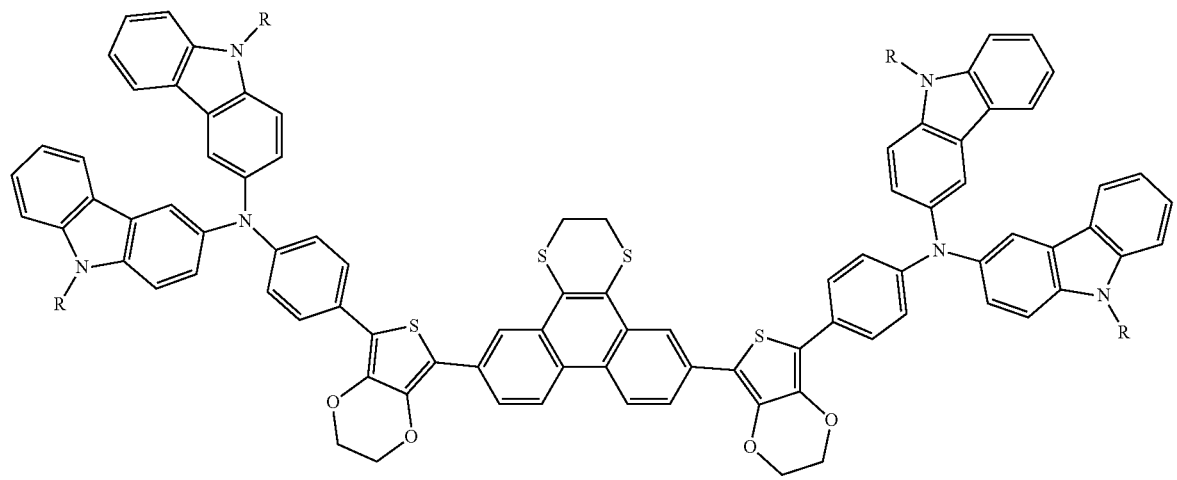
(90)
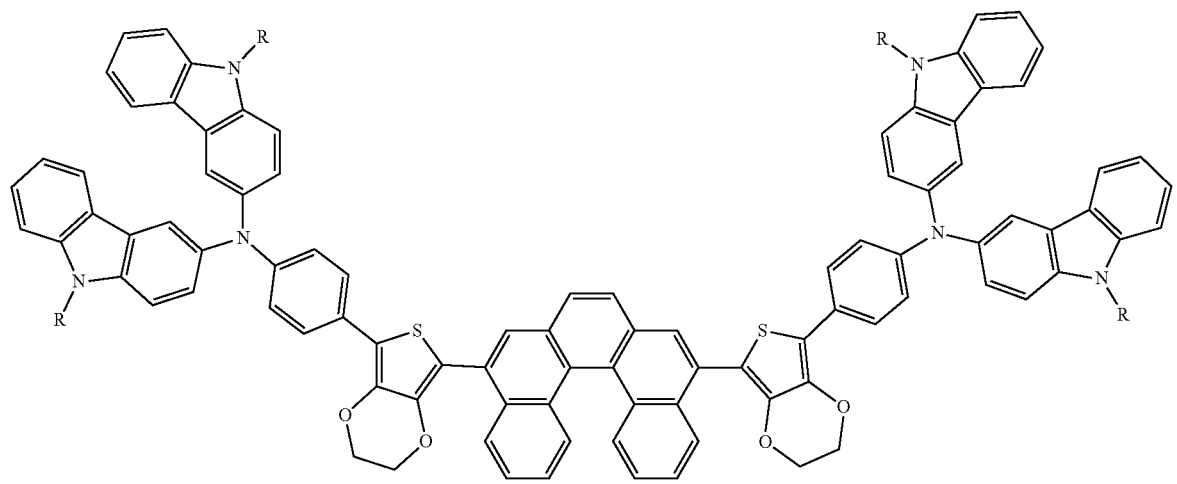
(91)
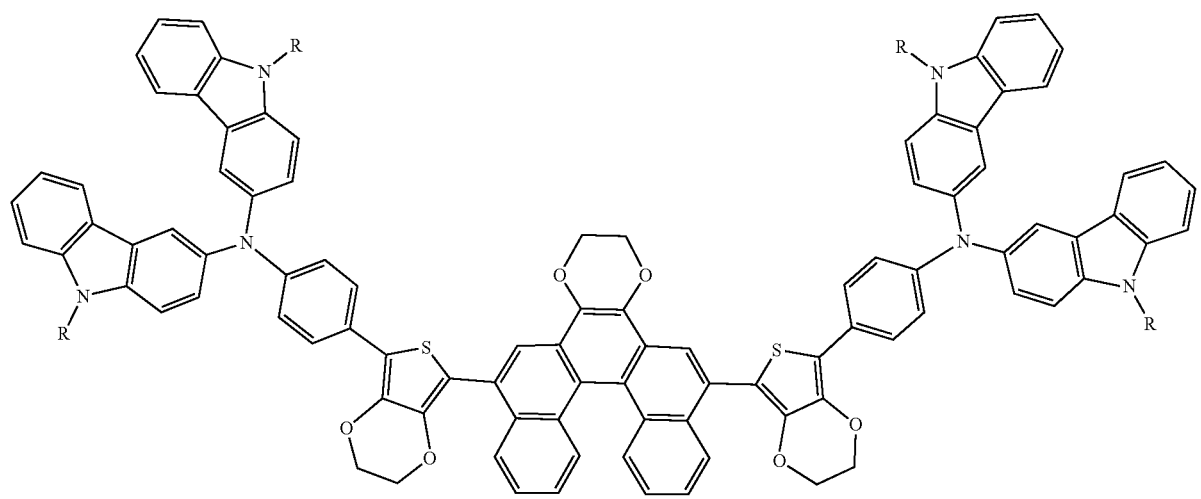

(92)
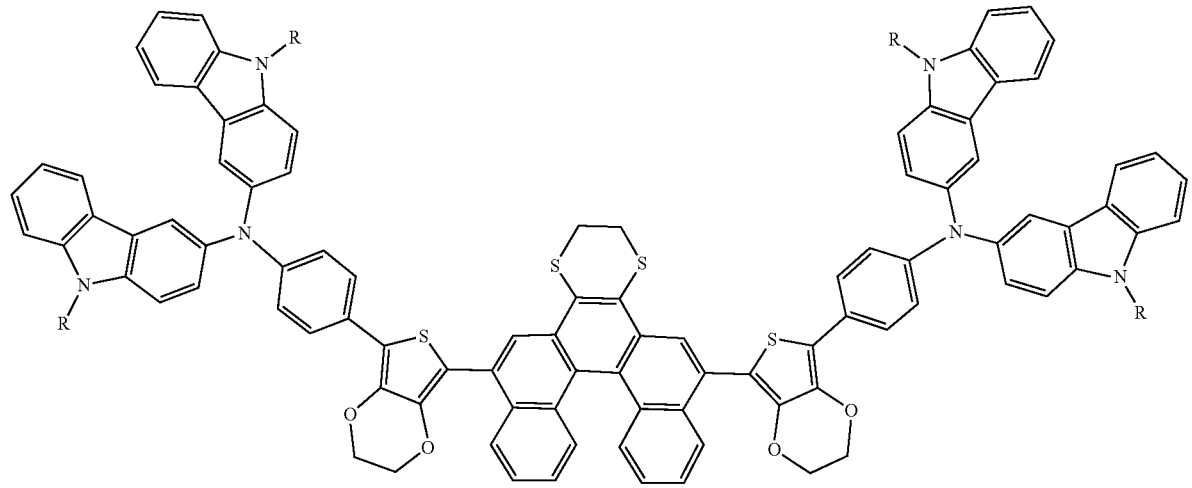
(93)
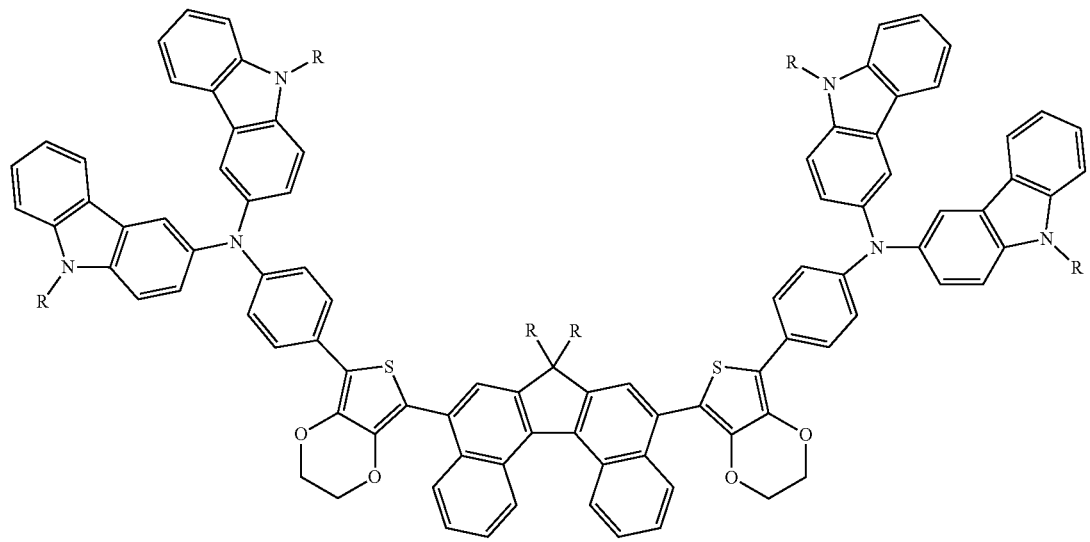
(94)
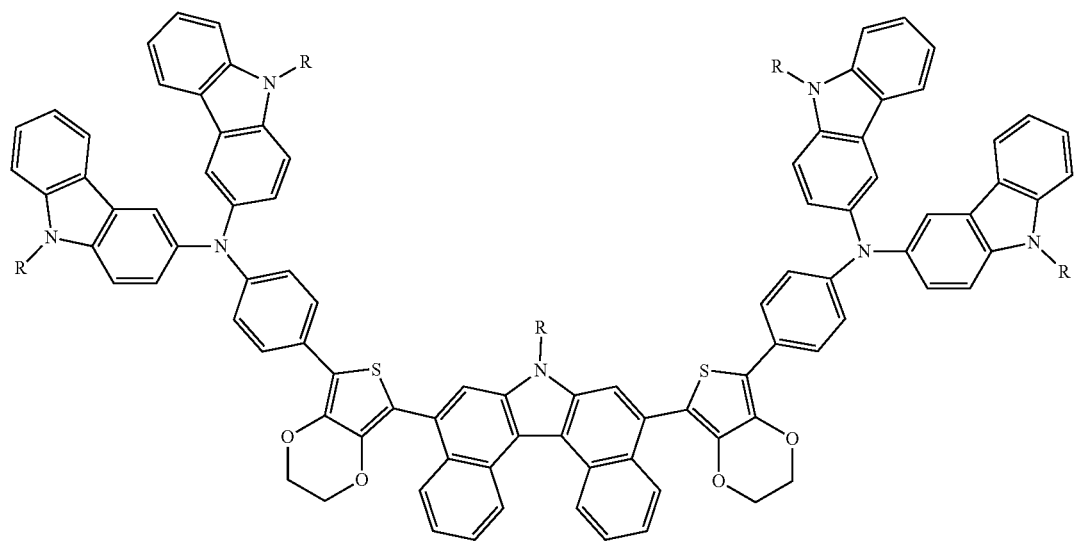

(95)
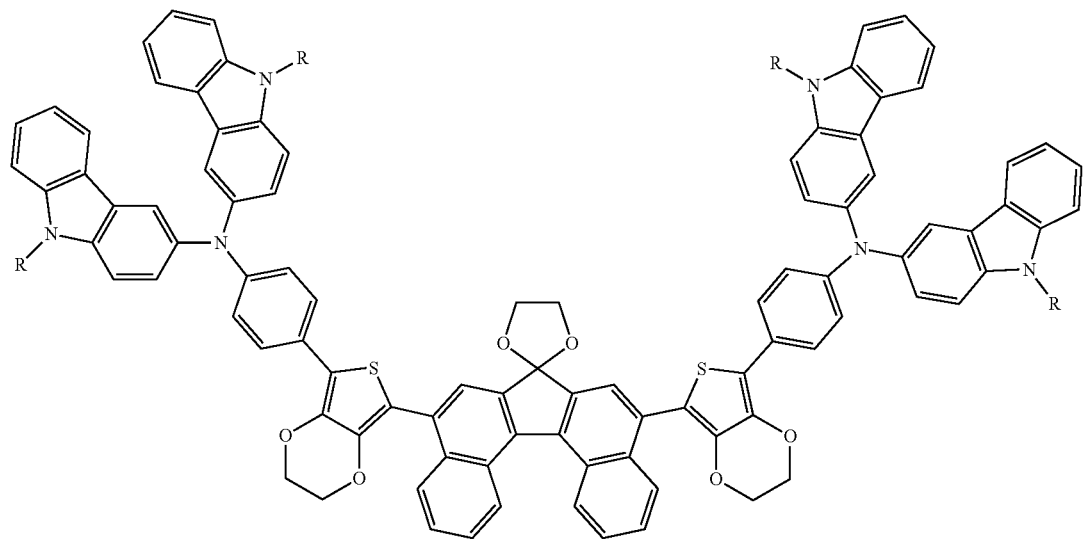
(96)
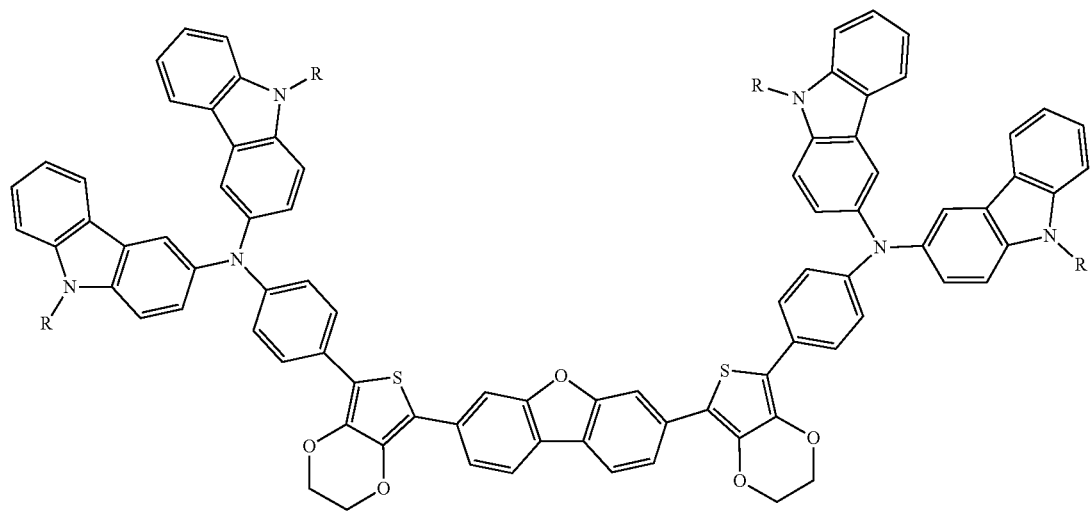
(97)
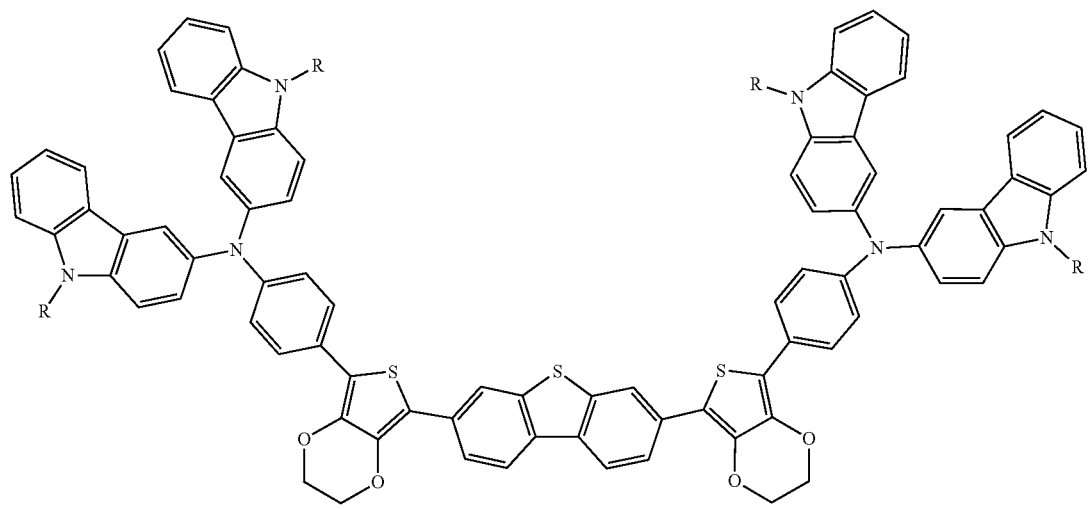

(98)
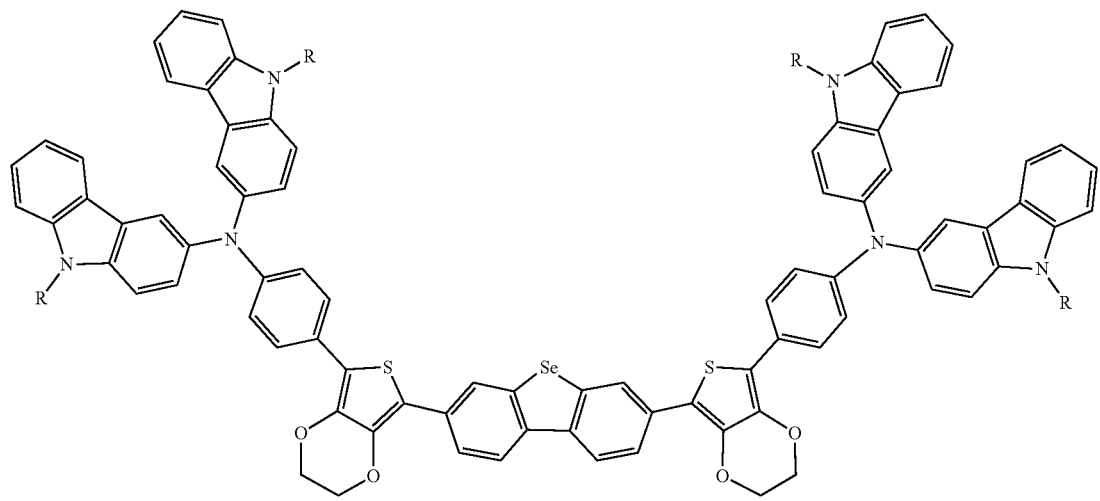
(99)
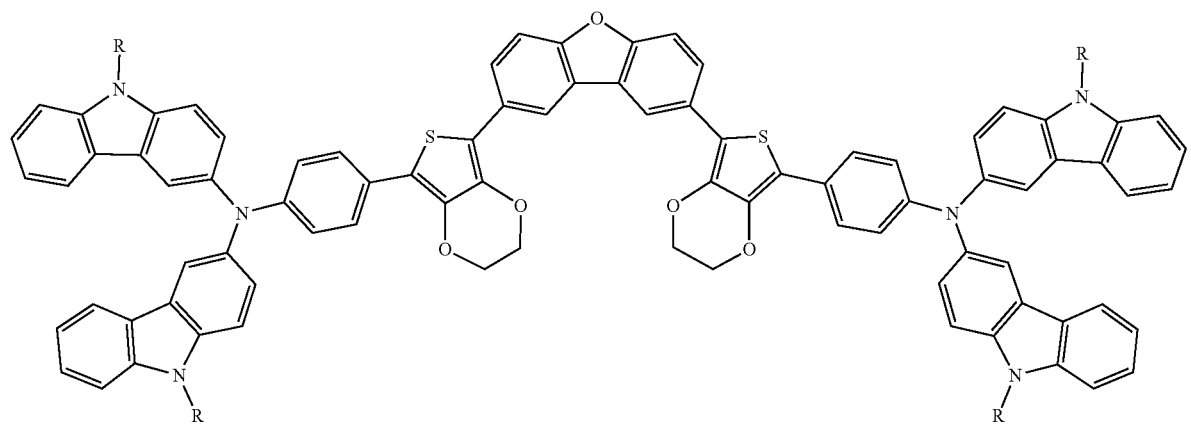
(100)
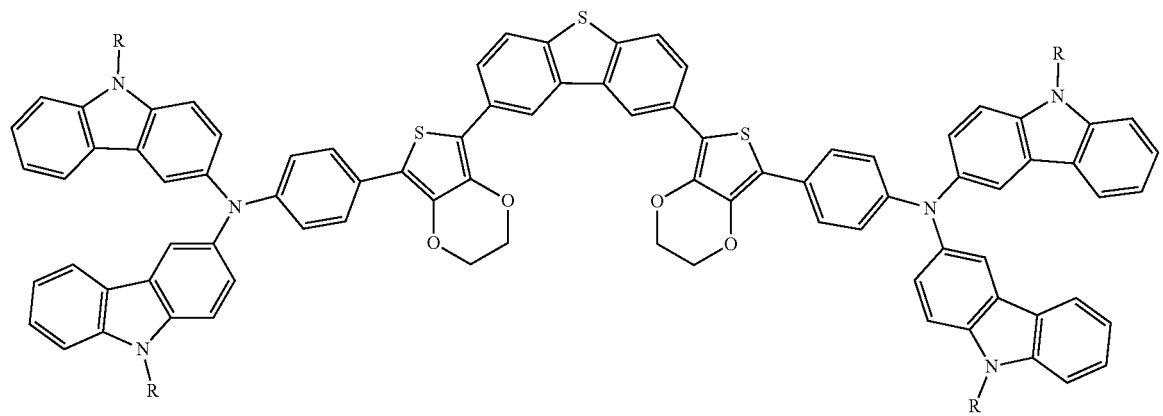

(101)
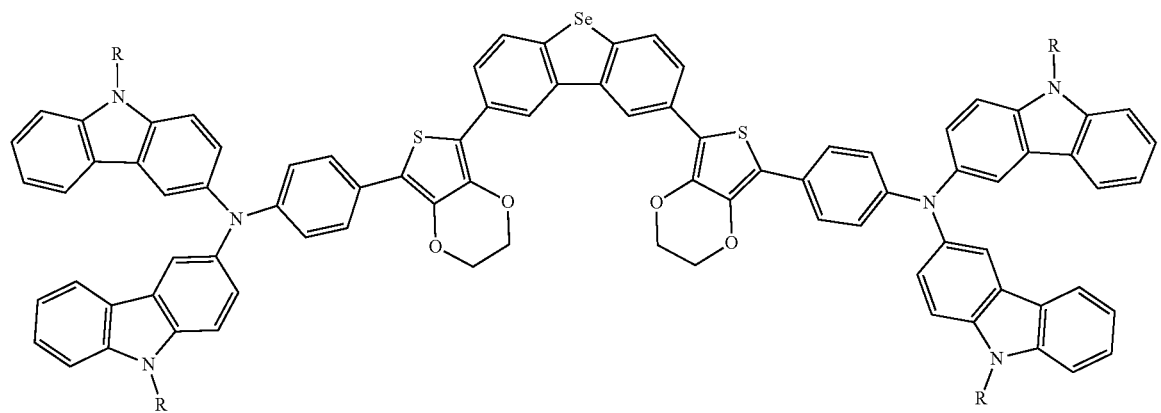
(102)
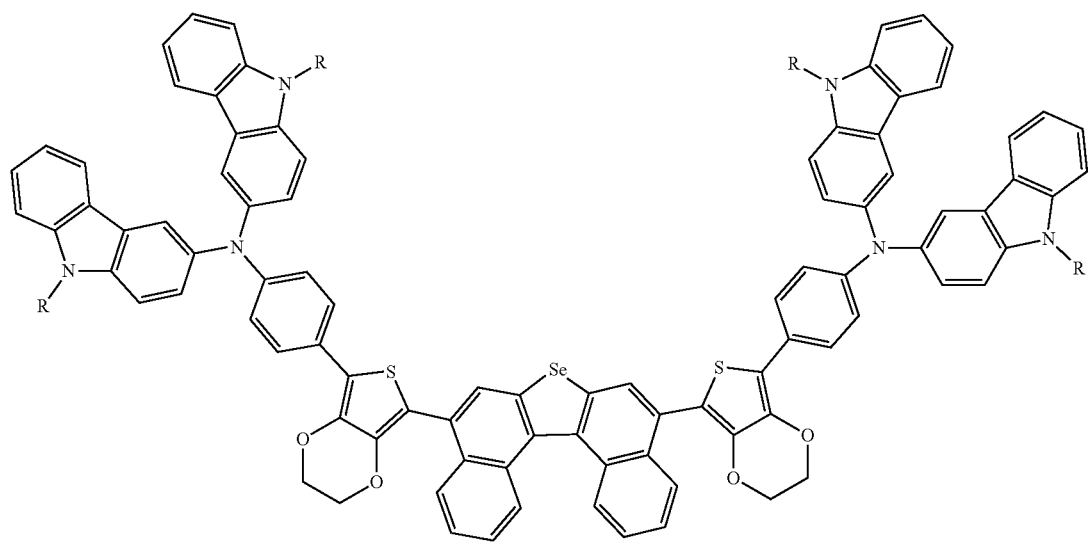
(103)
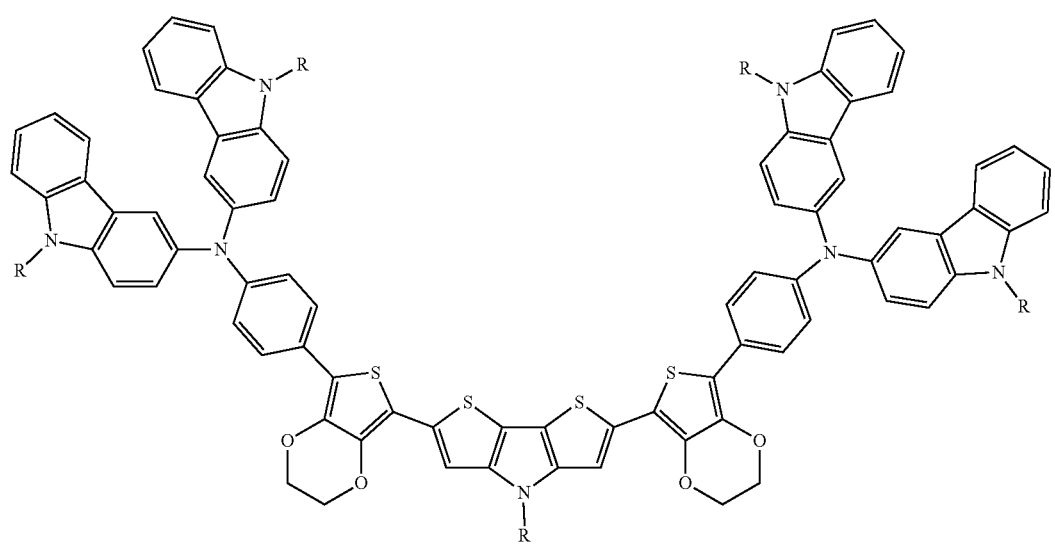

(104)
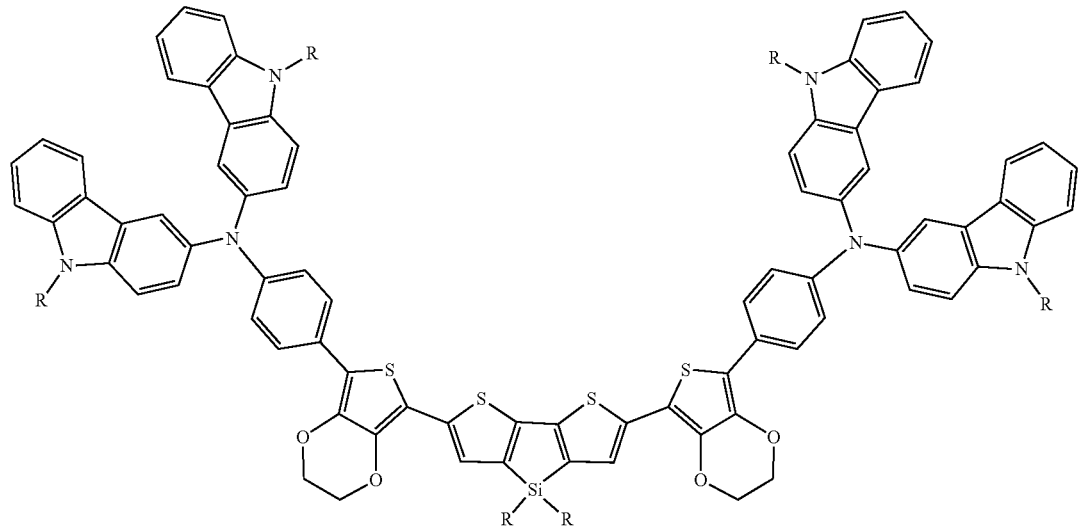
(105)
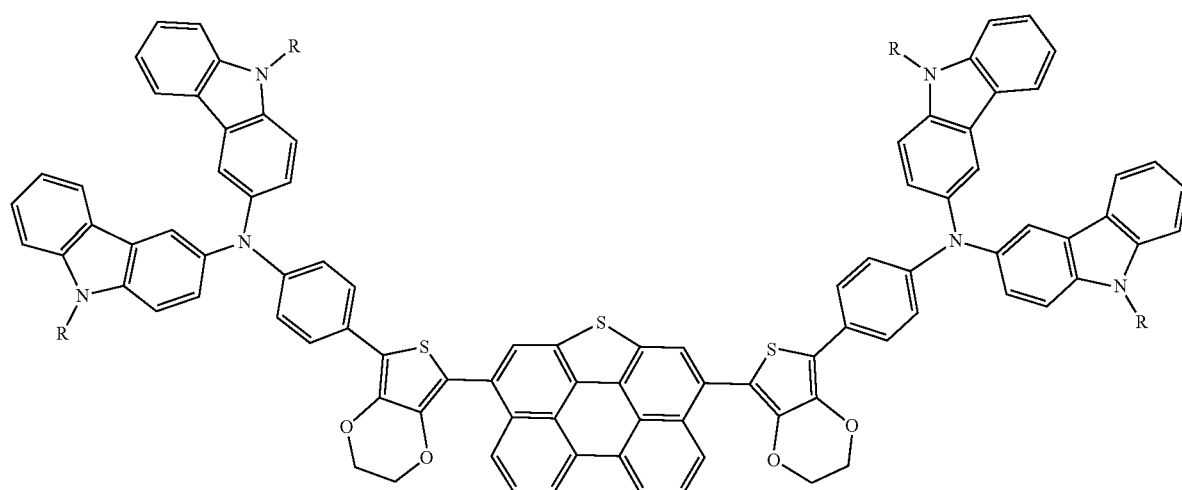
(106)
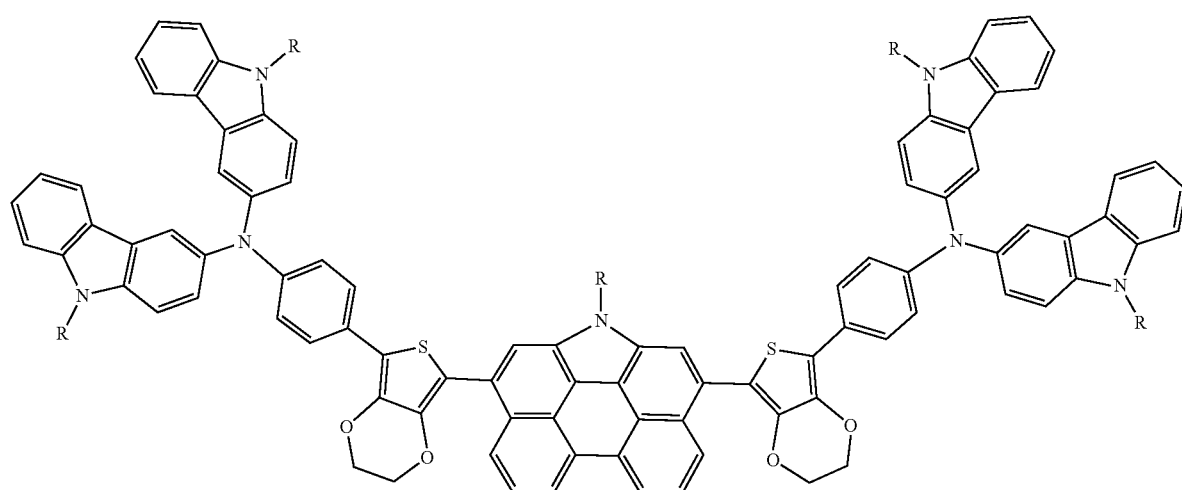

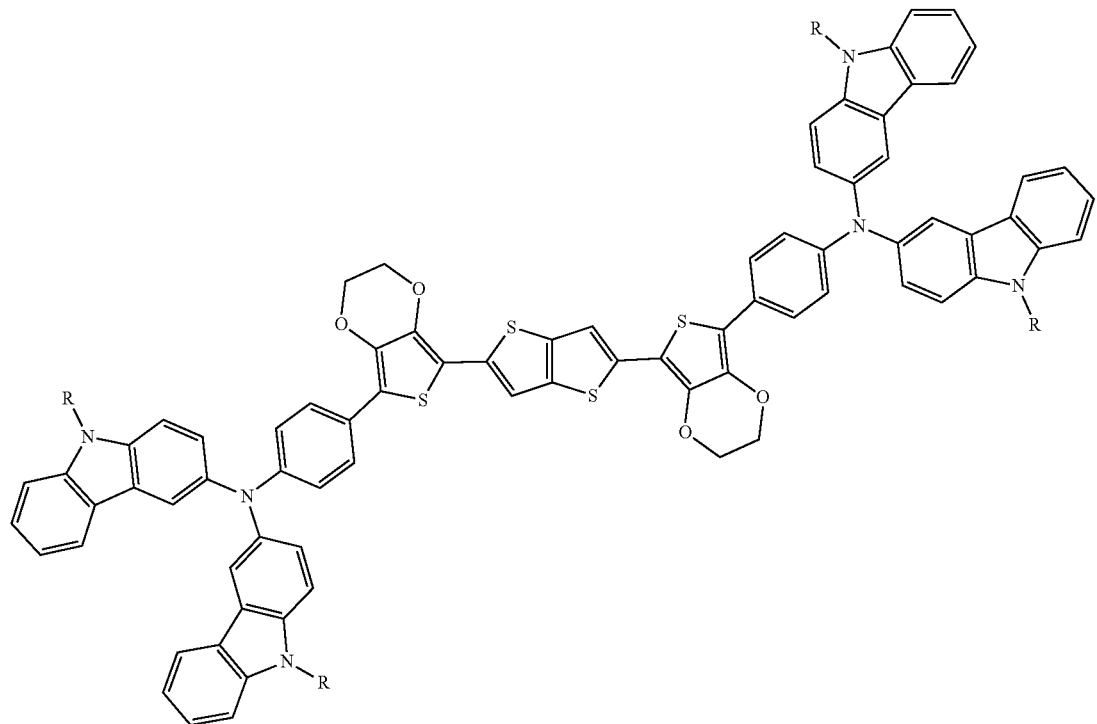
(107)
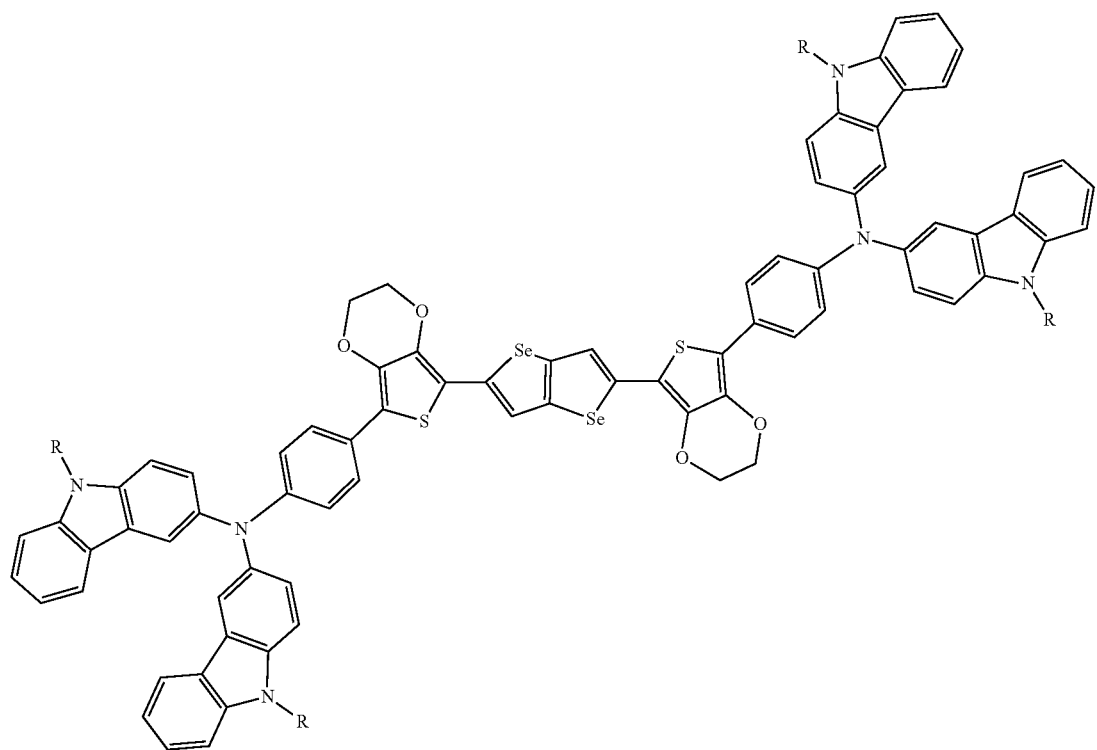
(108)

(109)
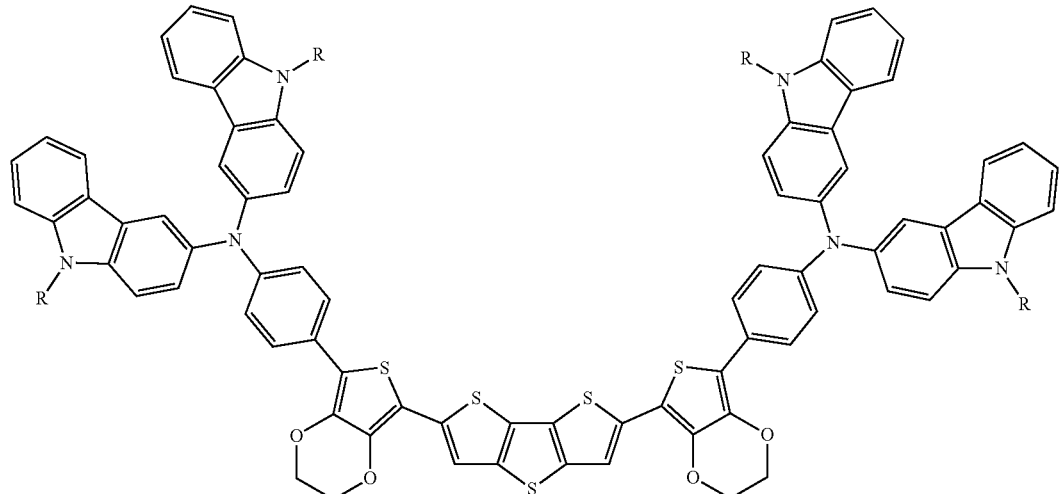
(110)
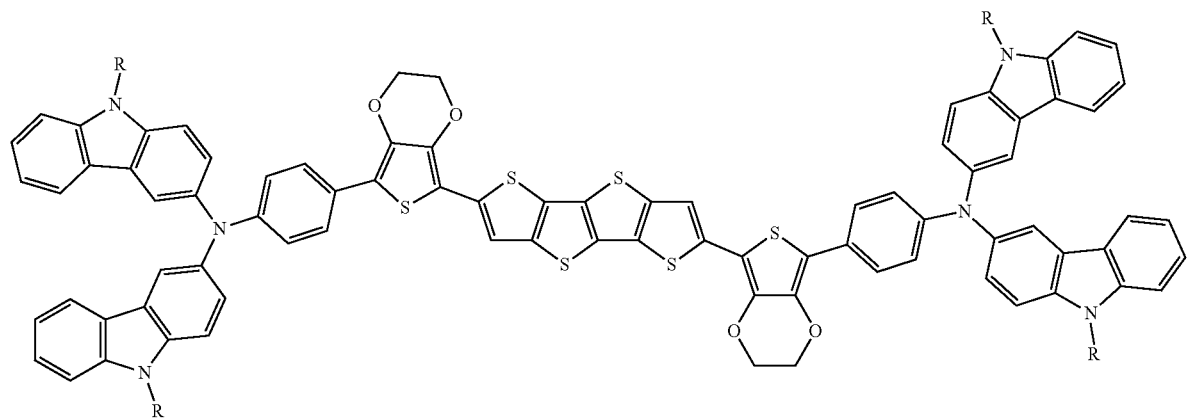
(111)
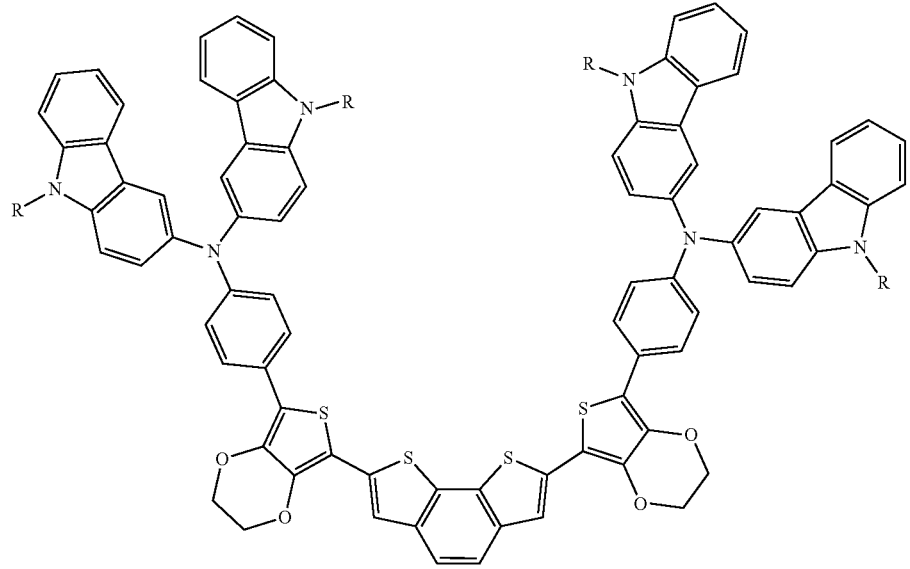

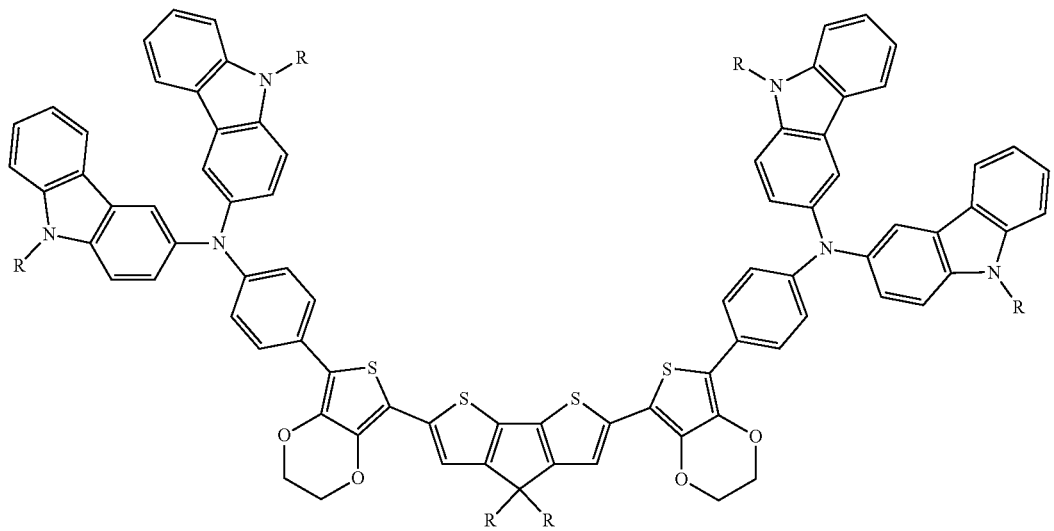

(112)

In each formula, R is a C1-C3 alkyl.

The present application further provides a method for preparation of the above arylamine compound, comprising the following steps:

adding a compound containing π conjugated units into toluene together with N,N-dimethyl-dicarbazole amine, tris(dibenzylideneacetone) dipalladium, tri-tert-butylphosphine tetrafluoroborate and sodium tert-butoxide at a molar ratio of 1:5:0.2:0.4:15; heating to 120° C. while stirring under the protection of nitrogen, and allowing reaction for 12 h; standing and cooling to room temperature, filtering off organic solvent to obtain a crude product; and performing column chromatography purification to obtain an arylamine compound.

In the present application, the compound containing π conjugated units is any one of the following compounds: 5,9-dibromo-dinaphthofuran, 5,9-dibromo-dinaphthothiophene, 3,9-dibromo-dioxaanthanthrene, 3,6,11,14-tetrachloro-dibenzochrysene, 2,7,10,15-tetrachloro-tetra-o-phenylene or 18,23-dibromo-bis-dinaphthofuropyrrole.

The present application further provides a method for preparation of another arylamine compound, comprising the following steps:

dissolving 3,4-ethylene-dioxythiophene-methyl-carbazole triarylamine in ultra-dry tetrahydrofuran in a dry three-necked round bottom flask, and cooling to −78° C.; under the protection of argon, slowly adding a hexane solution of 1.5 times equivalent of n-butyllithium into the above solution with a needle and stirring for half an hour; adding 2 times equivalent of isopropanol pinacol borate to the above system with a syringe, and slowly heating the system to room temperature and stirring for 2 hours; adding deionized water therein after the reaction is finished, performing extraction and separating with dichloromethane, and retaining the obtained organic phase; and performing column chromatography purification to obtain 3,4-ethylene-dioxythiophene-methyl-carbazole-triarylamine borate as an intermediate; and adding the compound containing π conjugated units, 3,4-ethylene-dioxythiophene-methyl-carbazole-triarylamine borate, palladium acetate, tri-tert-butylphosphine tetrafluoroborate and potassium phosphate at a molar ratio of 1:5:0.08:0.08:10 into a mixed solvent of dioxane and water, wherein the volume ratio of dioxane to water in the mixed solvent is 5:1; under the protection of argon, heating to 100° C. while stirring, performing reaction for 6 h; standing and cooling to room temperature, adding deionized water, performing extraction and separating with dichloromethane, and retaining the obtained organic phase to obtain a crude product; and performing column chromatography purification to obtain an arylamine compound.

In the present application, the compound containing π conjugated units is any one of the following compounds: 5,9-dibromo-dinaphthofuran, 5,9-dibromo-dinaphthophene, 3,9-dibromo-dioxaanthanthrene, 3,6,11,14-tetrachloro-dibenzochrysene, 2,7,10,15-tetrachloro-tetra-o-phenylene or 18,23-dibromo-bis-dinaphthofuropyrrole.

The present application further provides use of the arylamine compound as an organic hole transport material for preparing photoelectric devices.

BRIEF DESCRIPTION OF INVENTION PRINCIPLE

According to the present application, a π unit with a large conjugated system modified by a N,N'-dialkyl-dicarbazole amine functional group is used to synthesize an arylamine compound. The semiconductor material provided by the present application has high glass transition temperature, high solubility, good film forming property and high thermal stability of film morphology, and can be used as a hole transport material in photoelectric devices to realize excellent thermal stability.

Compared with the prior art, the present application has the beneficial effects that:

(1) the compound of the present application has simple preparation process, readily available raw materials and low price, and is very suitable for industrial production.

(2) the compound of the present application has high glass transition temperature and good thermal stability, which is beneficial to prolonging the service life of photoelectric devices.

(3) the compound of the present application has high solubility, can form an amorphous film with excellent quality, and is beneficial to application in photoelectric devices;

the high photoelectric conversion efficiency of the device indicates that the compound is a hole transport material with excellent performance.

DETAILED DESCRIPTION OF EMBODIMENTS

Figure 1:
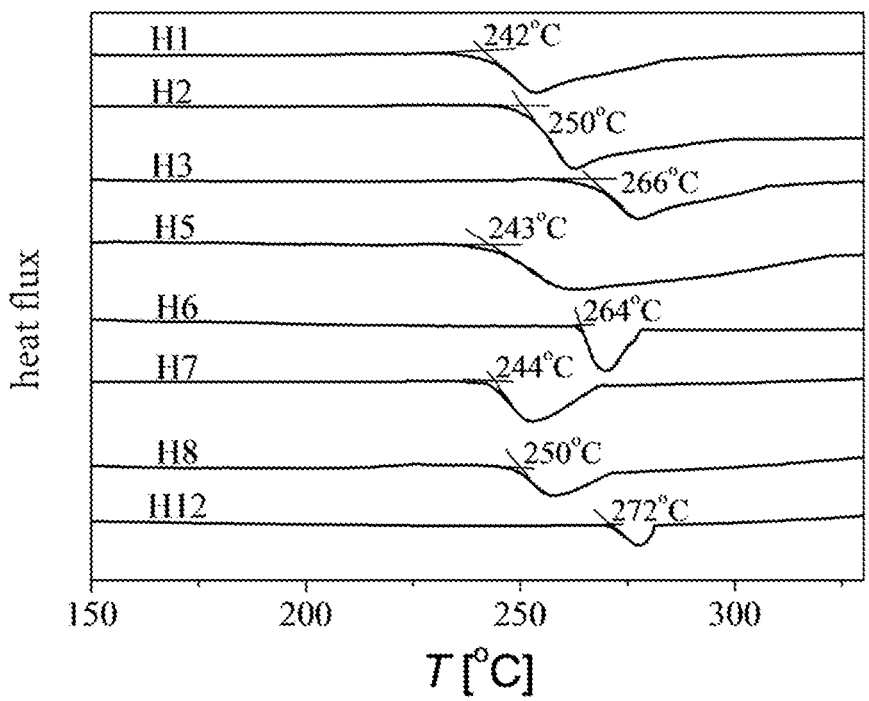
FIG. 1 shows the glass transition temperature of the compound of the present application measured by differential scanning calorimetry.
Figure 2:
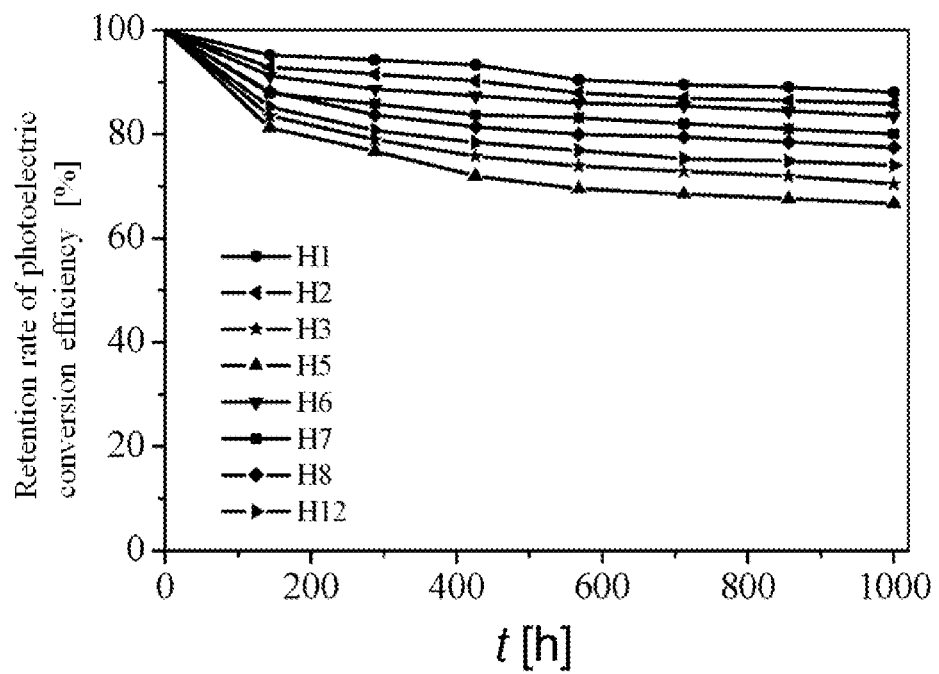
FIG. 2 shows a data graph of the stability of perovskite solar cells made of the compound of the present application as a hole transport material aging in the dark at 85° C. (the horizontal refers to the aging time of the cells, and the vertical axis refers to the retention rate of photoelectric conversion efficiency).

The present application will be further explained in conjunction with specific examples below.

In order to make the object, technical scheme and advantages of the present application clearer, the present application will be further explained in detail with reference to the following drawings and examples. It should be understood that the specific embodiments described herein are used to explain rather than limit the present application. In addition, the technical features involved in each embodiment of the present application described below can be combined with each other as long as they do not conflict with each other.

The following compounds can be obtained respectively, by changing different π conjugated units by modifying the N,N-dimethyl-dicarbazole amine substituent. The adopted π conjugated units and corresponding compounds H1-H12 obtained by synthesis are shown in the following table:

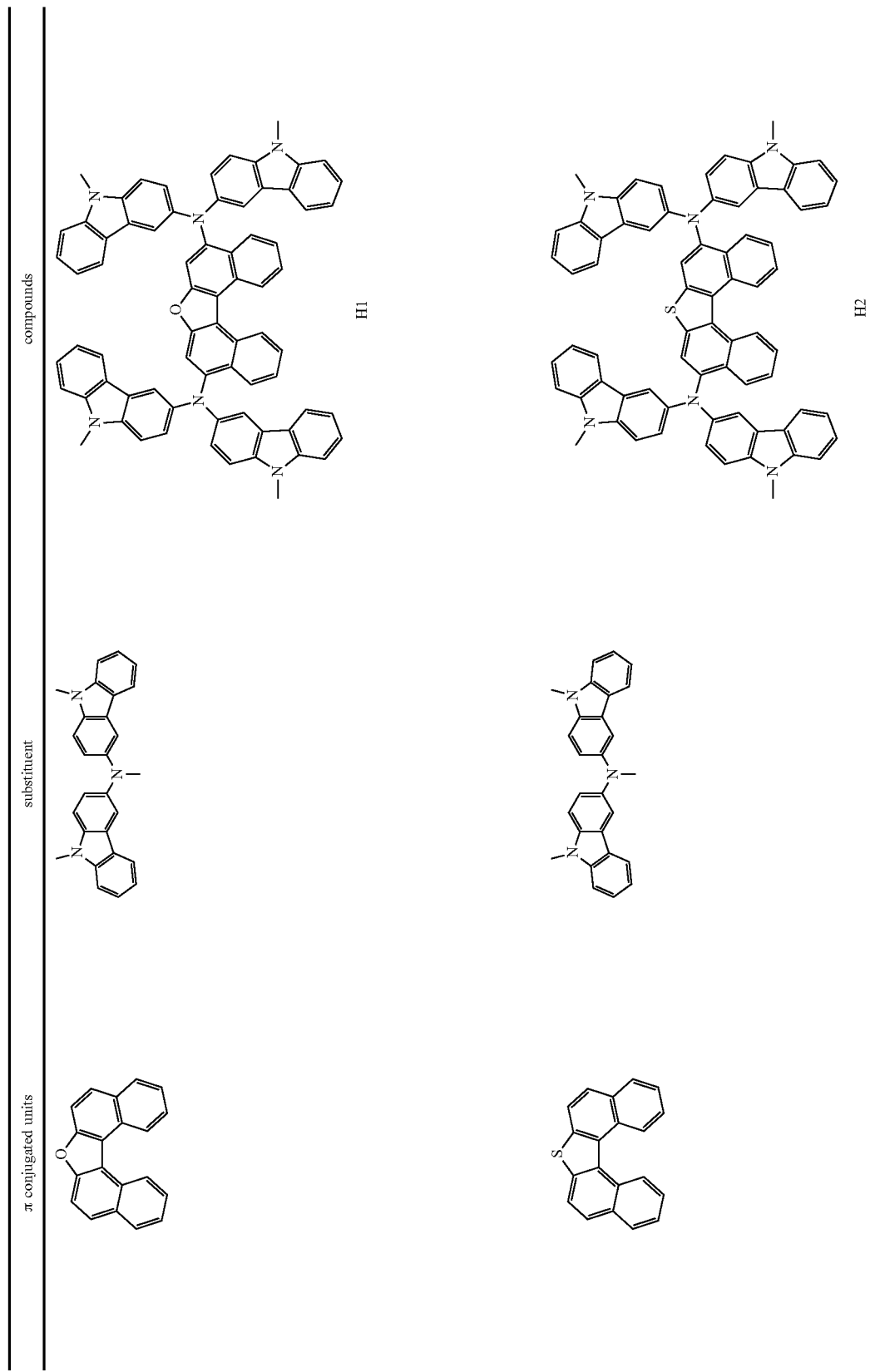

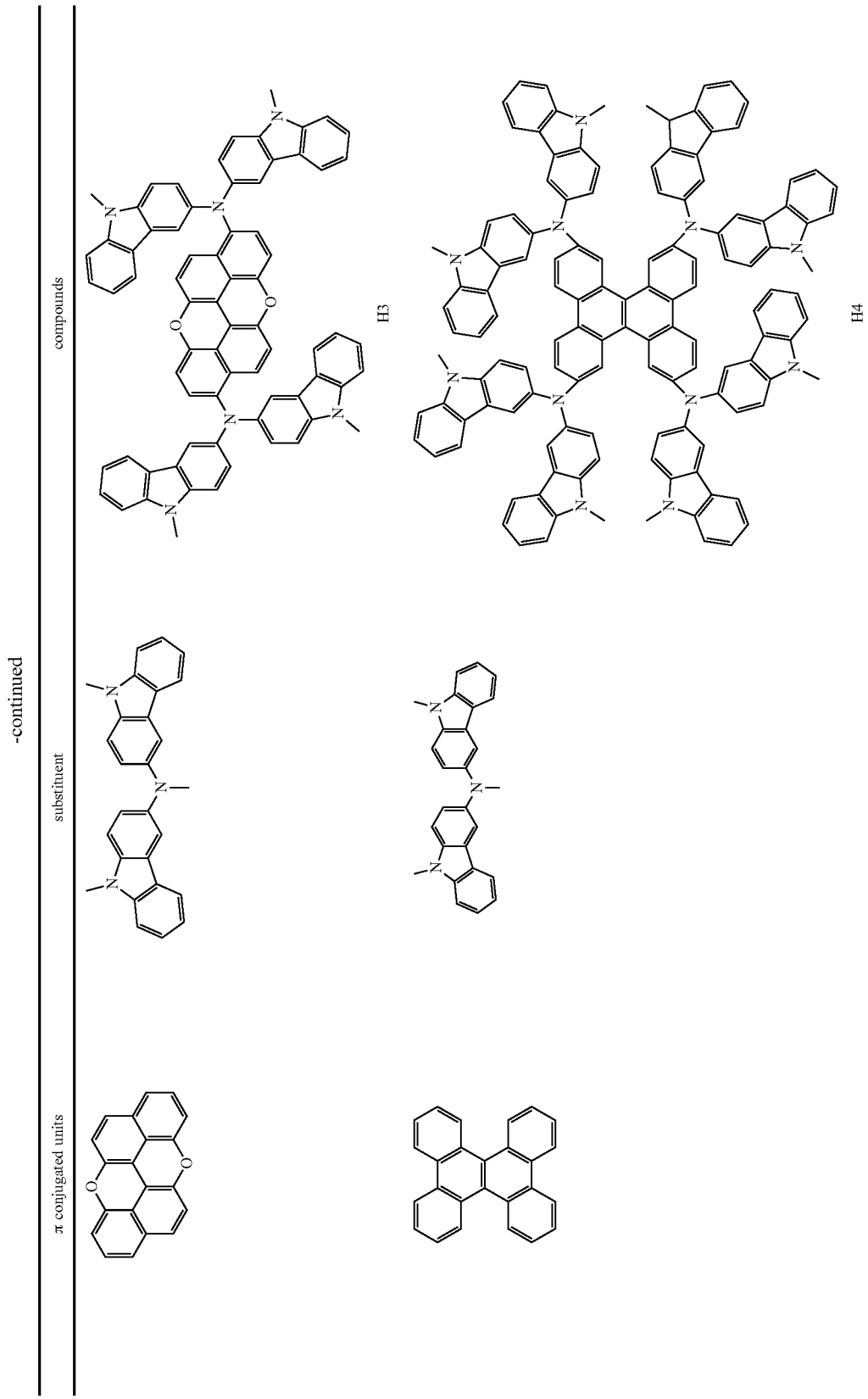

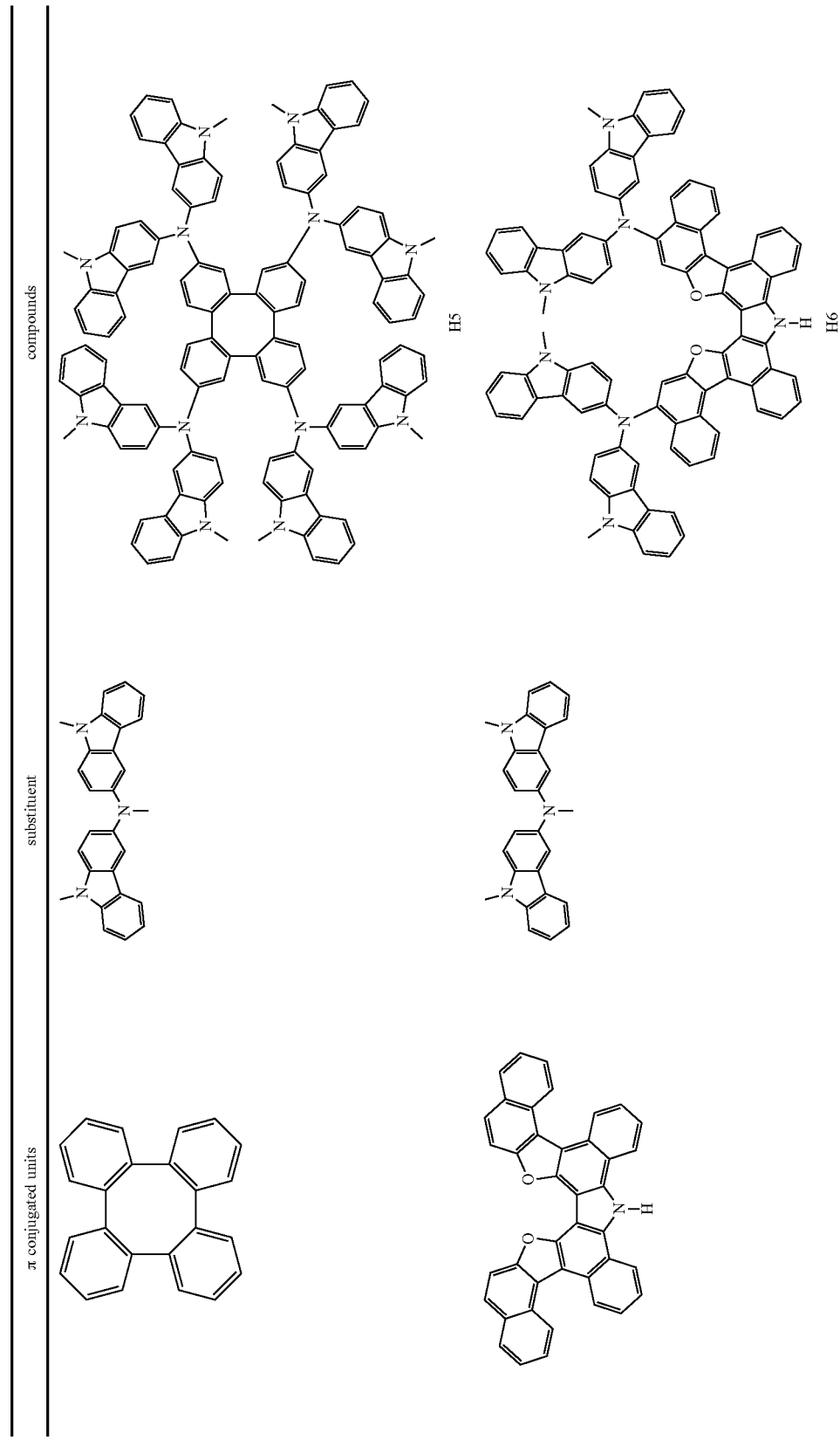

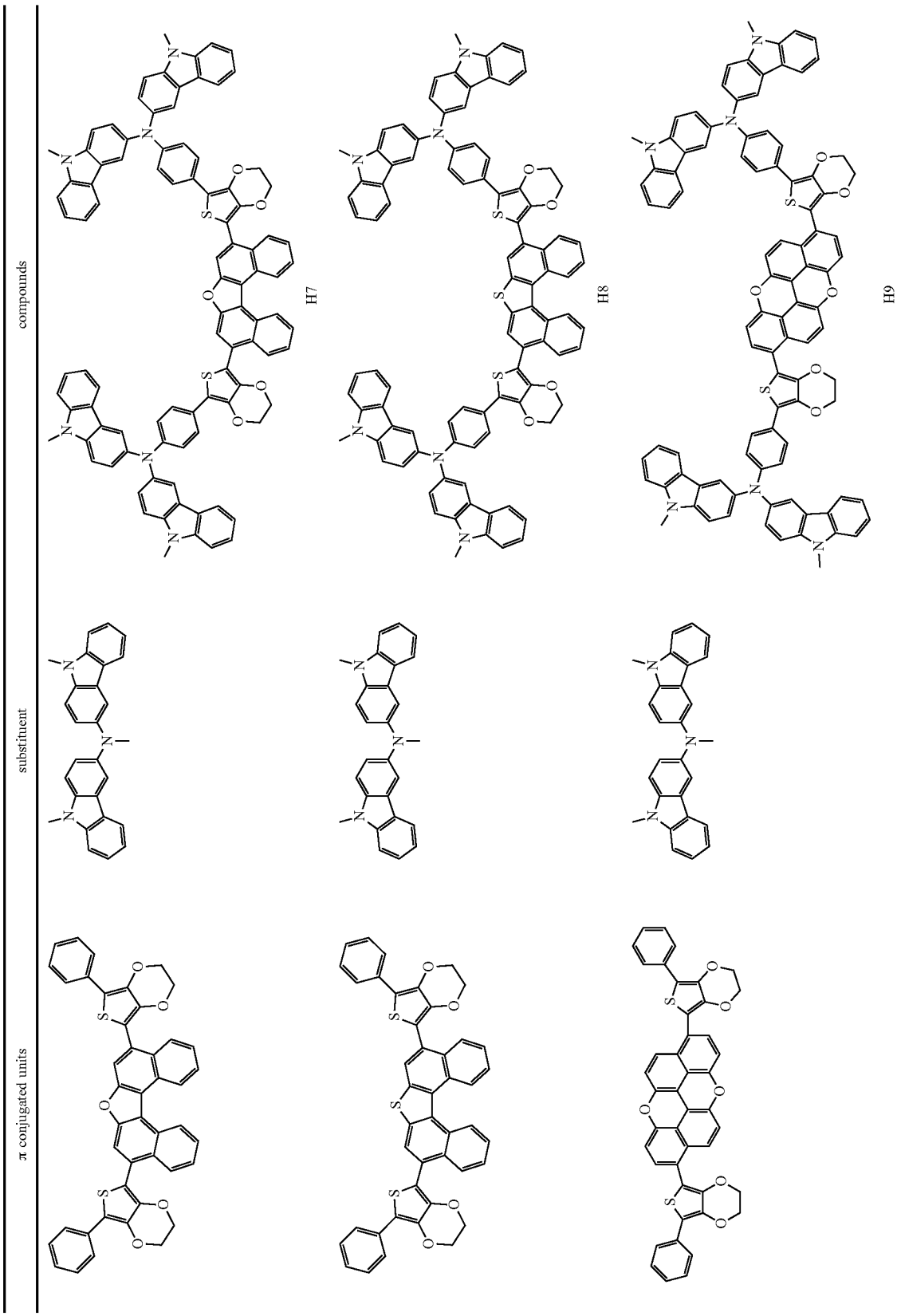

| π conjugated units | substituent | compounds |
|---|---|---|
| 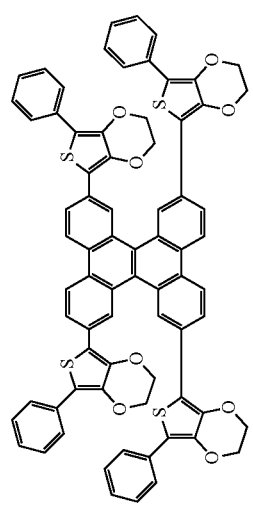 | 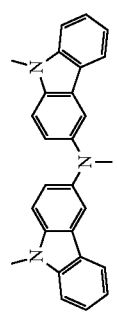 | 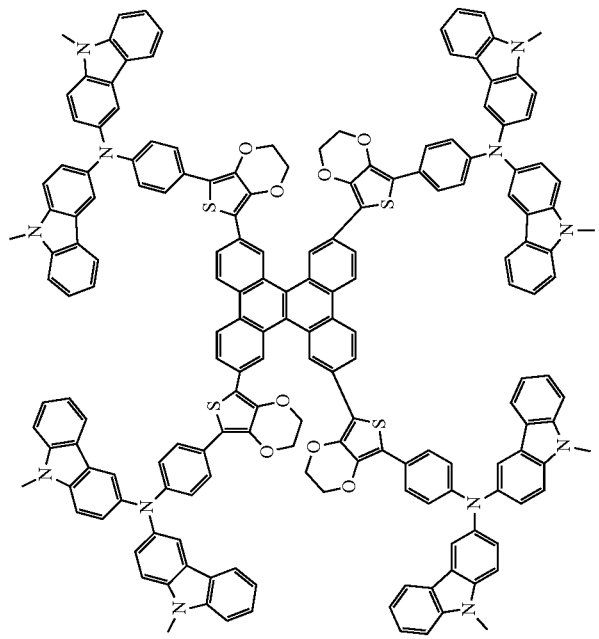 H10 |

| π conjugated units | substituent | compounds |
|---|---|---|
| 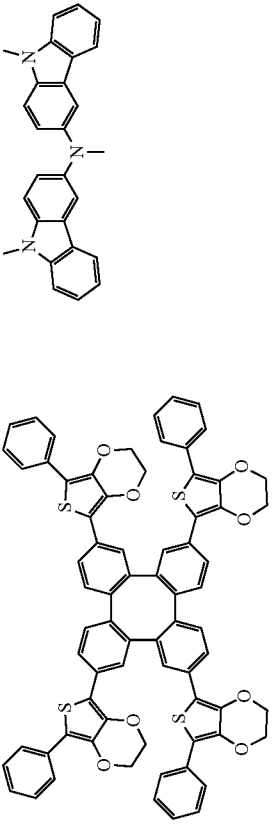 | 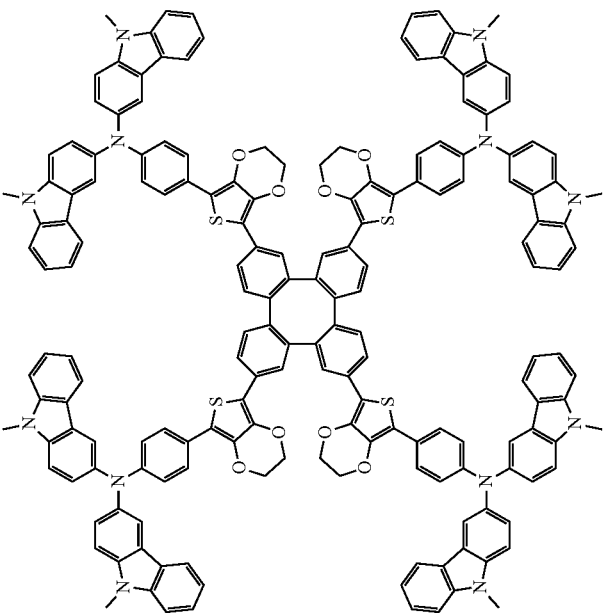 | H11 |

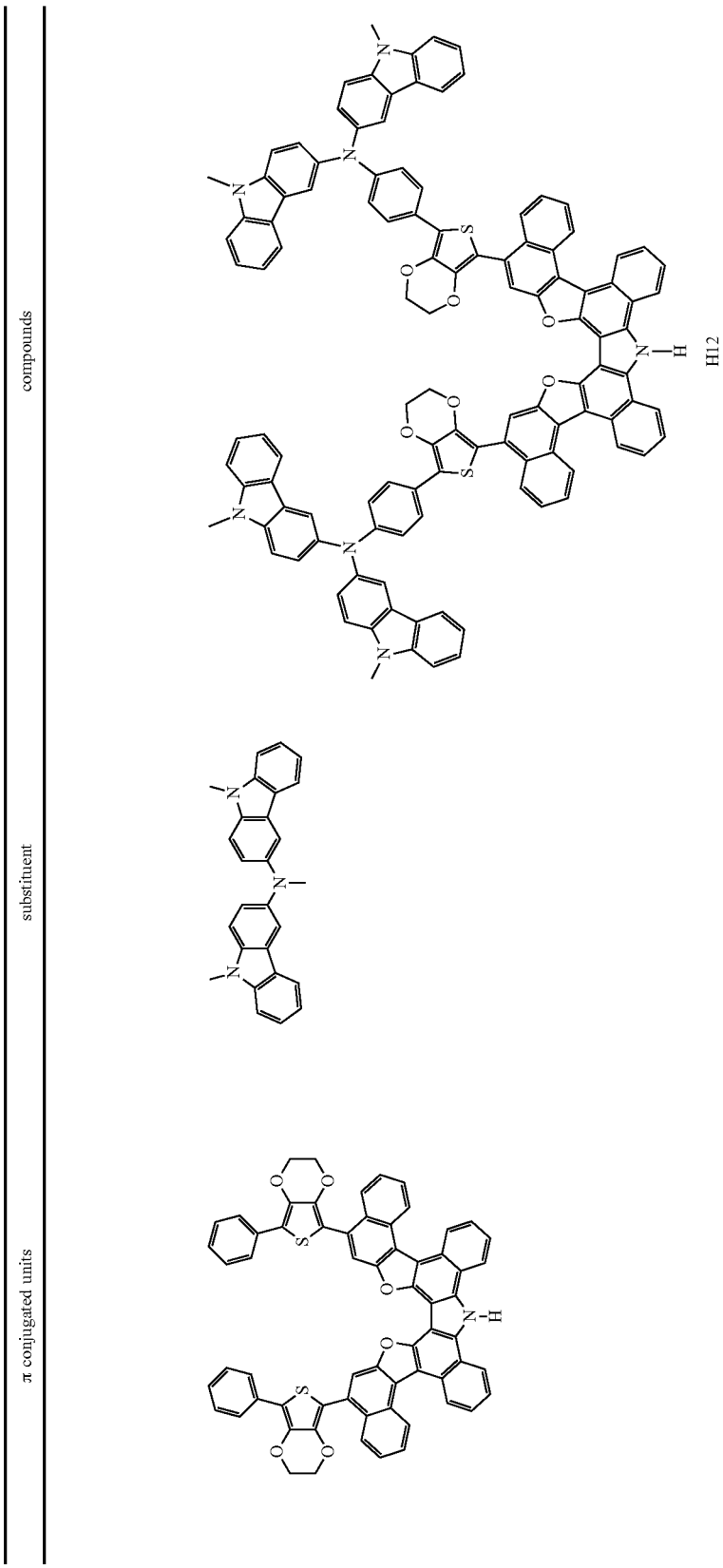

Example 1

Synthesis of Compound H1:

5,9-dibromo-dinaphthofuran, N,N-dimethyl-dicarbazole amine, tris (dibenzylideneacetone) dipalladium, tri-tert-butylphosphine tetrafluoroborate and sodium tert-butoxide, at a molar ratio of 1:5:0.2:0.4:15, were added into toluene; the mixture was heated to 120° C. while stirring under the protection of nitrogen, and allowed to react for 12 h; the reactant was allowed to stand and cool down to room temperature, and organic solvent was filtered off to obtain a crude product; and column chromatography purification was performed to obtain a compound H1 (yield 90%). $^1$H NMR (600 MHz, THF-$d_8$) δ: 9.21 (d, J=8.5 Hz, 2H), 8.51 (d, J=8.6 Hz, 2H), 7.89-7.79 (m, 8H), 7.65 (t, J=7.6 Hz, 2H), 7.56 (s, 2H), 7.35 (ddt, J=15.4, 8.2, 7.7 Hz, 18H), 7.00 (t, J=7.5 Hz, 4H), 3.82 ppm (d, J=4.9 Hz, 6H). $^{13}$C NMR (150 MHz, THF-$d_8$) δ: 156.15, 147.45, 144.18, 142.81, 138.57, 130.79, 129.76, 127.81, 127.03, 126.87, 126.48, 125.25, 124.73, 123.83, 123.76, 121.28, 119.33, 117.67, 116.02, 112.67, 110.20, 109.37, 29.29 ppm. HR-MS (MALDI-TOF) m/z (molecular formula $C_{72}H_{50}N_6O$), theoretical value: 1014.4046, measured value: 1014.4041.

The chemical structural formula of the obtained compound H1 is shown in formula (1).

Example 2

Synthesis of Compound H2:

The preparation method of compound H2 is the same as that in Example 1, except that 5,9-dibromo-dinaphthothiophene is used to replace 5,9-dibromo-dinaphthofuran, to obtain the compound H2 (with a yield of 87%). $^1$H NMR (600 MHz, THF-$d_8$) δ: 8.94 (d, J=8.5 Hz, 2H), 8.45 (d, J=8.4 Hz, 2H), 7.87 (dd, J=7.3, 5.0 Hz, 8H), 7.65 (s, 2H), 7.55-7.23 (m, 18H), 7.02 (t, J=7.4 Hz, 4H), 3.85 ppm (s, 12H). $^{13}$C NMR (150 MHz, THF-$d_8$) δ: 146.69, 144.36, 143.04, 139.93, 138.86, 132.53, 130.86, 129.85, 127.60, 127.41, 126.72, 126.21, 125.82, 124.99, 124.33, 124.00, 121.53, 120.18, 119.58, 116.57, 110.46, 109.60, 29.52 ppm. HR-MS (MALDI-TOF) m/z (molecular formula $C_{72}H_{50}N_6S$), theoretical value: 1030.3818, measured value: 1030.3812.

The chemical structural formula of the obtained compound H2 is shown as formula (2).

Example 3

Synthesis of Compound H3:

The preparation method of compound H3 is the same as that in Example 1, except that 3,9-dibromo-dioxaanthanthrene was used to replace 5,9-dibromo-dinaphthofuran to obtain a compound H3 (with a yield of 70%). $^1$H NMR (600 MHz, THF-$d_8$) δ: 7.87 (d, J=7.7 Hz, 4H), 7.77 (d, J=2.0 Hz, 4H), 7.50 (d, J=9.4 Hz, 2H), 7.44-7.32 (m, 12H), 7.23 (dd, J=8.7, 2.2 Hz, 4H), 7.07-7.01 (m, 4H), 6.89 (d, J=8.3 Hz, 2H), 6.78 (d, J=9.4 Hz, 2H), 6.66 ppm (d, J=8.3 Hz, 2H). $^{13}$C NMR (150 MHz, THF-$d_8$) δ: 150.14, 145.53, 143.36, 142.70, 142.10, 140.85, 138.32, 134.99, 128.68, 126.34, 125.73, 124.57, 123.70, 123.67, 123.33, 121.13, 119.20, 117.66, 115.29, 110.35, 109.99, 109.25, 30.69 ppm. HR-MS (MALDI-TOF) m/z (molecular formula $C_{72}H_{48}N_6O_2$), theoretical value: 1028.3839, measured value: 1028.3833.

The chemical structural formula of the obtained compound H3 is shown as formula (3).

Example 4

Synthesis of Compound H4:

The preparation method of compound H4 is the same as that in Example 1, except that 3,6,11,14-tetrachloro-dibenzochrysene was used to replace 5.9-dibromo-dinaphthofuran to obtain a compound H4 (with a yield of 74%). $^1$H NMR (600 MHz, THF-$d_8$) δ: 8.27 (d, J=2.3 Hz, 4H), 8.19 (d, J=9.0 Hz, 4H), 7.80 (dd, J=4.9, 2.9 Hz, 16H), 7.39-7.29 (m, 16H), 7.23 (d, J=8.7 Hz, 8H), 7.20-7.09 (m, 12H), 7.04-6.95 (m, 8H), 3.70 ppm (s, 24H). $^{13}$C NMR (150 MHz, THF-$d_8$) δ: 147.41, 141.60, 141.01, 137.67, 129.74, 125.19, 125.04, 124.16, 123.54, 123.43, 122.69, 122.28, 120.16, 119.24, 118.20, 117.68, 116.71, 109.13, 108.23, 28.18 ppm. HR-MS (MALDI-TOF) m/z (molecular formula $C_{130}H_{92}N_{12}$), theoretical value: 1821.7601, measured value: 1821.7596.

The chemical structural formula of the obtained compound H4 is shown as formula (4).

Example 5

Synthesis of Compound H5:

The preparation method of compound H5 is the same as that in Example 1, except that 2,7,10,15-tetrachloro-tetra-o-phenylene was used to replace 5,9-dibromo-dinaphthofuran to obtain a compound H5 (with a yield of 75%). $^1$H NMR (600 MHz, THF-$d_8$) δ: 7.92 (s, 8H), 7.88 (d, J=7.7, 8H), 7.37 (d, J=8.2, 8H), 7.35-7.16 (m, 24H), 6.97 (t, J=7.4, 8H), 6.92 (s, 4H), 6.87-6.66 (m, 8H), 3.81 ppm (s, 24H). $^{13}$C NMR (150 MHz, THF-$d_8$) δ: 148.58, 141.60, 140.59, 137.77, 130.98, 128.87, 125.28, 124.74, 123.63, 122.51, 120.24, 120.16, 119.75, 118.33, 117.91, 117.60, 109.06, 108.12, 27.96 ppm. HR-MS (MALDI-TOF) m/z (molecular formula $C_{128}H_{92}N_{12}$), theoretical value: 1797.7601, measured value: 1797.7596.

The chemical structural formula of the obtained compound H5 is shown as formula (5).

Example 6

Synthesis of Compound H6:

The preparation method of compound H6 is the same as that in Example 1, except that 18,23-dibromo-bis-dinaphthofuropyrrole was used to replace 5,9-dibromodinaphthofuran to obtain a compound H6 (with a yield of 85%). $^1$H NMR (600 MHz, THF-$d_8$) δ: 12.40 (s, 1H), 9.28 (d, J=8.0 Hz, 2H), 9.22 (d, J=8.4 Hz, 2H), 8.79 (d, J=8.0 Hz, 2H), 8.51 (d, J=8.3 Hz, 2H), 8.03 (s, 2H), 7.83 (dd, J=12.1, 4.6 Hz, 8H), 7.73-7.55 (m, 6H), 7.45-7.18 (m, 18H), 6.97 (t, J=6.8 Hz, 4H), 3.74 ppm (s, 12H). $^{13}$C NMR (150 MHz, THF-ds) δ: 158.82, 154.57, 148.71, 147.47, 146.07, 141.55, 140.00, 133.88, 131.43, 130.78, 130.29, 129.76, 129.68, 129.30, 128.61, 128.51, 127.99, 127.13, 127.09, 126.45, 125.07, 124.62, 122.54, 122.37, 118.53, 118.43, 117.78, 113.36, 112.62, 83.02, 82.80, 82.58, 32.63 ppm. HR-MS (MALDI-TOF) m/z (molecular formula $C_{92}H_{59}N_7O_2$), theoretical value: 1293.4730, measured value: 1293.4725.

Chemical structural formula of the obtained compound H6 is shown as formula (6).

Example 7

Synthesis of Compound H7:

3,4-ethylene-dioxythiophene-methyl-carbazole-tri-arylamine was dissolved in ultra-dry tetrahydrofuran in a dry three-necked round bottom flask, and the mixture was cooled to −78° C.; under the protection of argon, a hexane solution of 1.5 times the equivalent of n-butyllithium was slowly added into the above solution with a needle and stirred for half an hour; 2 times equivalent of isopropanol pinacol borate was added to the above system with a syringe, and the system was slowly heated to room temperature and stirred for 2 hours; deionized water was added therein after the reaction was finished, extraction and liquid separation were performed using dichloromethane, and the obtained organic phase was retained; and column chromatography purification was performed to obtain 3,4-ethylene-dioxy-thiophene-methyl-carbazole-triarylamine borate as an intermediate.

5,9-dibromodinaphthofuran, 3,4-ethylene-dioxythiophene-methyl-carbazole-triarylamine borate, palladium acetate, tri-tert-butylphosphine-tetrafluoroborate and potassium phosphate at a molar ratio of 1:5:0.08:0.08:10 were added into a mixed solvent of dioxane and water, wherein the volume ratio of dioxane to water in the mixed solvent was 5:1; under the protection of argon, the mixture was heated to 100° C. while stirring, and allowed to react for 6 h; the reactant was allowed to stand and cooled to room temperature, deionized water was added, and extraction and liquid separation was performed with dichloromethane, the obtained organic phase was retained to obtain a crude product; and column chromatography purification was performed to obtain a compound H7 (with a yield of 60%). $^1$H NMR (600 MHz, THF-d$_8$) δ: 9.21 (d, J=8.4 Hz, 2H), 8.42 (d, J=8.5 Hz, 2H), 8.00 (d, J=1.7 Hz, 4H), 7.99-7.93 (m, 6H), 7.76 (t, J=7.6 Hz, 2H), 7.63 (d, J=8.7 Hz, 4H), 7.61-7.54 (m, 2H), 7.44 (t, J=8.6 Hz, 8H), 7.38 (t, J=7.5 Hz, 8H), 7.09 (t, J=7.4 Hz, 4H), 7.03 (d, J=8.8 Hz, 4H), 4.36 (d, J=2.4 Hz, 4H), 4.27 (d, J=2.1 Hz, 4H), 3.87 ppm (s, 12H). $^{13}$C NMR (150 MHz, THF-d$_8$) δ: 155.01, 149.89, 142.69, 141.30, 140.60, 139.14, 138.20, 131.94, 130.92, 129.84, 129.73, 129.35, 129.20, 127.58, 127.11, 126.52, 125.79, 125.50, 124.74, 123.63, 121.20, 120.59, 119.94, 119.45, 119.01, 118.63, 115.64, 111.44, 110.27, 109.41, 65.72, 65.54, 29.23 ppm. HR-MS (MALDI-TOF) m/z (molecular formula $C_{96}H_{66}N_6O_5S_2$), theoretical value: 1446.4536, measured value: 1446.4531.

The chemical structural formula of the obtained compound H7 is shown as formula (7).

Example 8

Synthesis of Compound H8:

The preparation method of compound H8 is the same as that in Example 7, except that 5,9-dibromo-dinaphthothiophene was used to replace 5,9-dibromodinaphthofuran to obtain a compound H8 (with a yield of 60%). $^1$H NMR (600 MHz, THF-d$_8$) δ: 8.94-8.86 (m, 2H), 8.40-8.31 (m, 2H), 8.13 (s, 2H), 8.00 (d, J=1.9 Hz, 4H), 7.96 (d, J=7.8 Hz, 4H), 7.66-7.60 (m, 4H), 7.56 (dd, J=9.3, 5.0 Hz, 4H), 7.44 (dd, J=8.4, 5.1 Hz, 8H), 7.42-7.32 (m, 8H), 7.14-7.05 (m, 4H), 7.02 (t, J=5.7 Hz, 4H), 4.41-4.22 (m, 8H), 3.87 ppm (s, 12H). $^{13}$C NMR (150 MHz, THF-d$_8$) δ: 148.85, 141.77, 141.69, 140.31, 139.50, 138.14, 137.21, 130.81, 130.68, 130.05, 129.91, 127.64, 126.53, 125.89, 125.47, 125.16, 124.76, 124.65, 124.59, 123.75, 122.76, 122.65, 120.18, 119.60, 118.41, 117.87, 117.61, 110.38, 109.20, 108.35, 64.71, 64.50, 28.18 ppm. HR-MS (MALDI-TOF) m/z (molecular formula $C_{96}H_{66}N_6O_4S_3$), theoretical value: 1463.4341, measured value: 1463.4345.

The chemical structural formula of the obtained compound H8 is shown as formula (8).

Example 9

Synthesis of Compound H9:

The preparation method of compound H9 is the same as that in Example 7, except that 3,9-dibromo-dioxaanthanthrene was used to replace 5,9-dibromo-dinaphthofuran to obtain a compound H9 (with a yield of 45%). $^1$H NMR (600 MHz, THF-d$_8$) δ: 8.36 (d, J=7.8 Hz, 4H), 7.87-7.85 (m, 4H), 7.70 (d, J=7.5 Hz, 4H), 7.42-7.37 (m, 16H), 7.24 (dd, J=8.3, 5.2 Hz, 4H), 7.14 (s, 4H), 7.03 (d, J=7.8 Hz, 2H), 6.99 (d, J=9.0 Hz, 4H), 6.54 (d, J=7.2 Hz, 2H), 4.28 (d, J=5.0 Hz, 4H), 4.27 (d, J=3.5 Hz, 4H), 3.82 ppm (s, 12H). $^{13}$C NMR (150 MHz, THF-d$_8$) δ: 158.57, 148.69, 148.51, 148.52, 145.96, 144.34, 134.88, 132.97, 131.11, 129.92, 128.42, 128.16, 126.83, 125.49, 125.18, 123.25, 122.44, 121.78, 121.47, 119.82, 115.33, 114.19, 114.07, 113.74, 113.72, 111.08, 110.49, 109.67, 109.26, 103.33, 65.21, 65.28, 29.90 ppm. HR-MS (MALDI-TOF) m/z (molecular formula $C_{96}H_{64}N_6O_6S_2$), theoretical value: 1461.4362, measured value: 1461.4357.

The chemical structural formula of the obtained compound H9 is shown as formula (9).

Example 10

Synthesis of compound H10:

The preparation method of compound H10 is the same as that in Example 7, except that 3,6,11,14-tetrachloro-dibenzochrysene was used to replace 5,9-dibromo-dinaphthofuran to obtain a compound H10 (with a yield of 42%). $^1$H NMR (600 MHz, THF-d$_8$) δ: 9.26 (s, 4H), 8.59 (d, J=5.0 Hz, 4H), 8.01 (d, J=5.1 Hz, 4H), 7.95 (s, 8H), 7.75 (d, J=5.0 Hz, 8H), 7.45 (t, J=9.9 Hz, 8H), 7.42-7.18 (m, 32H), 7.00 (t, J=4.8 Hz, 8H), 6.89 (t, J=6.5 Hz, 8H), 4.14 (s, 16H), 3.76 ppm (s, 24H). $^{13}$C NMR (150 MHz, THF-d$_8$) δ: 148.60, 141.62, 140.38, 139.55, 138.00, 137.78, 131.53, 130.59, 129.27, 128.86, 126.59, 125.37, 124.73, 124.57, 124.17, 123.65, 123.36, 122.64, 120.27, 119.80, 118.38, 117.49, 116.38, 113.49, 109.18, 108.24, 64.59, 64.44, 28.12 ppm. HR-MS (MALDI-TOF) m/z (molecular formula $C_{178}H_{124}N_{12}O_8S_4$), theoretical value: 2685.8581, measured value: 2685.8576.

The chemical structural formula of the obtained compound H10 is shown as formula (10).

Example 11

Synthesis of Compound H11:

The preparation method of compound H11 is the same as that in Example 7, except that 2,7,10,15-tetrachloro-tetra-o-phenylene is used to replace 5,9-dibromo-dinaphthofuran to obtain a compound H11 (with a yield of 48%). $^1$H NMR (600 MHz, THF-d$_8$) δ: 8.36 (d, J=9.0 Hz, 8H), 7.77-7.60 (m, 20H), 7.42-7.37 (m, 32H), 7.24 (dd, J=7.6, 4.5 Hz, 8H), 7.14 (s, 8H), 6.99 (d, J=8.8 Hz, 8H), 4.28 (s, 16H), 3.77 ppm (s, 24H). $^{13}$C NMR (150 MHz, THF-d$_8$) δ: 148.69, 148.55, 145.97, 138.61 135.83, 134.83, 133.78, 129.56, 129.07, 128.53, 128.40, 128.18, 127.53, 126.92, 123.21, 121.73, 121.47, 119.87, 116.53, 114.17, 114.08, 113.79, 112.37, 111.06, 109.66, 109.21, 65.35, 65.22, 29.90 ppm. HR-MS (MALDI-TOF) m/z (molecular formula $C_{176}H_{124}N_{12}O_8S_4$), theoretical value: 2661.8581, measured value: 2661.8576.

The chemical structural formula of the obtained compound H11 is shown as formula (11).

Example 12

Synthesis of Compound H12:

The preparation method of compound H12 is the same as that in Example 7, except that 18,23-dibromo-bis-dinaphthofuropyrrole was used to replace 5,9-dibromo-dinaphthofuran to obtain a compound H12 (with a yield of 50%). $^1$H NMR (600 MHz, THF-d$_8$) δ: 12.50 (s, 1H), 9.37 (d, J=8.1 Hz, 2H), 9.28 (d, J=8.4 Hz, 2H), 8.89 (d, J=7.9 Hz, 2H), 8.41 (d, J=8.2 Hz, 2H), 8.38 (s, 2H), 8.00 (d, J=1.3 Hz, 4H), 7.92 (d, J=7.8 Hz, 4H), 7.85-7.72 (m, 8H), 7.65 (d, J=8.8 Hz, 4H), 7.62-7.56 (m, 4H), 7.43-7.32 (m, 12H), 7.09-7.00 (m, 8H), 4.37 (d, J=5.0 Hz, 4H), 4.29 (d, J=3.5 Hz, 4H), 3.82 ppm (s, 12H). $^{13}$C NMR (150 MHz, THF-d$_8$) δ: 154.30, 151.33, 151.26, 150.98, 142.81, 141.60, 140.74, 140.69, 139.21, 137.10, 136.87, 136.39, 136.34, 129.69, 129.24, 129.18, 128.28, 127.62, 127.43, 126.57, 126.31, 125.93, 125.22, 124.89, 123.80, 121.70, 121.44, 121.36, 121.28, 119.56, 118.84, 118.62, 114.25, 113.95, 113.91, 112.25, 112.12, 110.33, 109.45, 106.57, 65.89, 65.66, 29.30 ppm. HR-MS (MALDI-TOF) m/z (molecular formula $C_{116}H_{75}N_7O_6S_2$), theoretical value: 1726.5254, measured value: 1726.5249.

The chemical structural formula of the obtained compound H12 is shown as formula (12).

The above are examples of the preparation method of an arylamine compound according to the present application. In addition to the above 12 products, the preparation method of the products with structural formulas (13) to (68) can refer to the preparation process of compound H1 in Example 1. The preparation method of the products with structural formulas (69) to (112) can refer to the preparation process of compound H7 in Example 7. According to the change in the π conjugated units in the structural formula, those skilled in the art can use his knowledge and skills to select corresponding reaction raw materials in the prior art. Since the above examples can be referred to in this part of contents, the present application will not be described in detail.

Use of the compounds synthesized in the present application in optoelectronic devices as a hole transport layer material and effect thereof are explained in detail through examples 13, 14, and 15.

Example 13

As a hole transport material, the compound of the present application is applied to perovskite solar cells.

The compound of the present application, which acts as a hole transport layer, were used to prepare perovskite solar cells, comprising an FTO glass substrate, a dense TiO$_2$ layer, a porous TiO$_2$ layer, a perovskite layer, a hole transport layer and a metal electrode, wherein the FTO glass substrate was composed of a glass substrate and an FTO cathode (fluorine doped tin oxide glass electrode), the dense TiO$_2$ layer and the porous TiO$_2$ layer served as the TiO$_2$ electron transport layers, and the perovskite layer served as a light absorption layer.

Example 14

Preparation of Perovskite Solar Cells;

1) cleaning: firstly, dust and other pollutants attached to the surface of FTO glass substrate was cleaned with detergent, and organic pollutants were removed through ultrasonic treatment in water, acetone and ethanol, the cleaned FTO glass substrate was blow-dried with nitrogen to obtain a transparent conductive substrate with a clean surface, which was then treated with ultraviolet and ozone for 30 min to ensure a clean and clear;

2) preparing the dense TiO$_2$ layer: bis (acetylacetonate) diisopropyl titanate was dissolved in ethanol at a volume ratio of 1:9 at 450° C., and the solution was deposited on the clean FTO glass substrate by spray pyrolysis, and cooled to room temperature, to obtain a TiO$_2$/FTO substrate;

3) preparing the porous TiO$_2$ layer: a suspension prepared from TiO$_2$ slurry and ethanol (the mass ratio of TiO$_2$ slurry to ethanol was 1:6) were spin-coated on the TiO$_2$/FTO substrate obtained above, then dried at 100° C. for 10 min, and burned at 450° C. for 30 min to form the porous TiO$_2$ layer;

4) preparing the perovskite layer: FAI, PbI$_2$, MABr, PbBr$_2$ and CsI were mixed in a mixture of DMF and DMSO (DMF:DMSO=4:1 (v:v)) to obtain a (FAPbI$_3$)$_{0.875}$(MAPbBr$_3$)$_{0.075}$(CsPbI$_3$)$_{0.05}$(PbI$_2$)$_{0.03}$ precursor solution, containing FAI with a concentration of 1.19 mol/L, PbI$_2$ with a concentration of 1.30 mol/L, MABr with a concentration of 0.14 mol/L, and PbBr$_2$ with a concentration of 0.14 mol/L, and CsI with a concentration of 0.07 mol/l. The perovskite layer was prepared by two-step spin coating, at a rotation speed of 2000 rpm for 10 s and at a rotation speed of 5000 rpm for 30 s respectively, and chlorobenzene anti-solvent was dripped in the last 15 s of the second spin coating process; and then the substrate was dried at 120° C. for 1 h to obtain the required perovskite layer;

5) preparing the hole transport layer: an acetonitrile solution of LiTFSI with a concentration of 520 mg/mL and TBP were added into chlorobenzene to obtain a mixed solution with the concentration of 20 mmol/L and 132 mmol/L, respectively, and the compound containing N,N-dialkyl-dicarbazole amine functional group was added into the mixed solution to prepare a solution with the concentration of 30 mmol/L, which was then spin-coated at the speed of 4000 rpm for 20 s to be deposited on the perovskite layer; and 6) placing the perovskite layer obtained in step 5) in a vacuum evaporation chamber, the metal electrode was evaporated on the surface of the hole transport layer by a vacuum evaporation method to prepare the perovskite solar cell.

Example 15

Photoelectric efficiency of perovskite solar cells prepared by using the compound of the present application as a hole transport material.

| Compounds | Photoelectric conversion efficiency |
|---|---|
| H1 | 21.3% |
| H2 | 21.2% |
| H3 | 20.8% |
| H4 | 20.0% |
| H5 | 20.6% |
| H6 | 21.9% |
| H7 | 21.7% |
| H8 | 21.5% |
| H9 | 20.3% |
| H10 | 20.7% |
| H11 | 19.9% |
| H12 | 21.0% |

The above examples are only preferred examples of the present application, and do not limit the present application in any form. Any simple modification, equivalent substitution and improvement made to the above examples by those skilled in the art according to the technical essence of the present application without departing from the scope of the technical solution thereof still fall within the protection scope of the technical solution of the present application.

The invention claimed is:

1. An arylamine compound, wherein the compound is composed of a π unit with a large conjugated system modified by a N,N-dialkyl-dicarbazole amine functional group, having a chemical structural formula shown as any one of formulas (1)-(44) and (46)-(112):
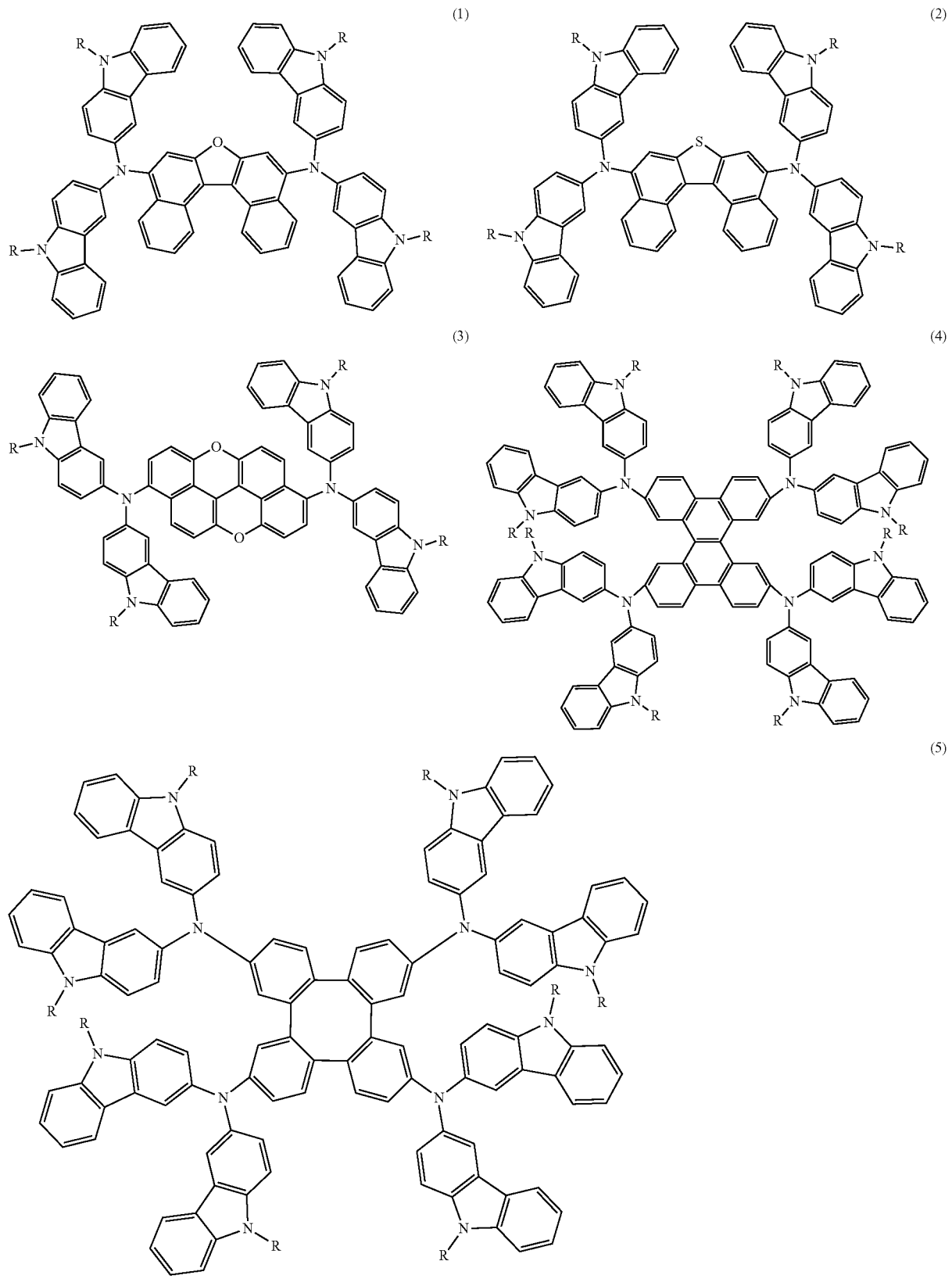

(6)
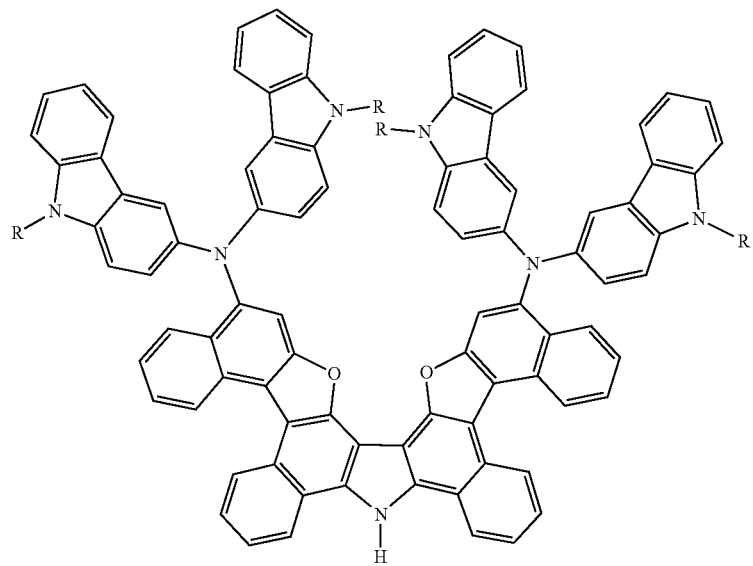
(7)
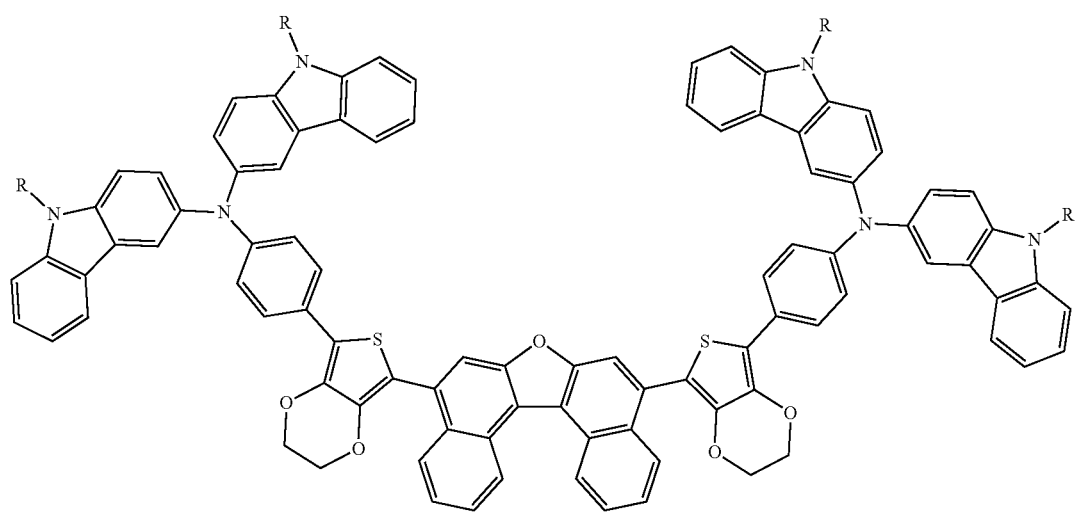
(8)
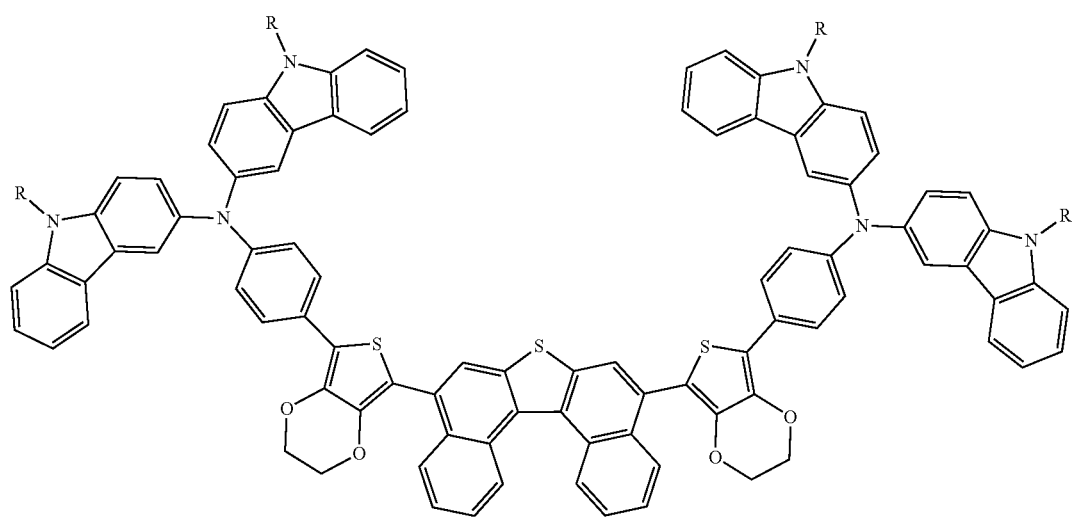

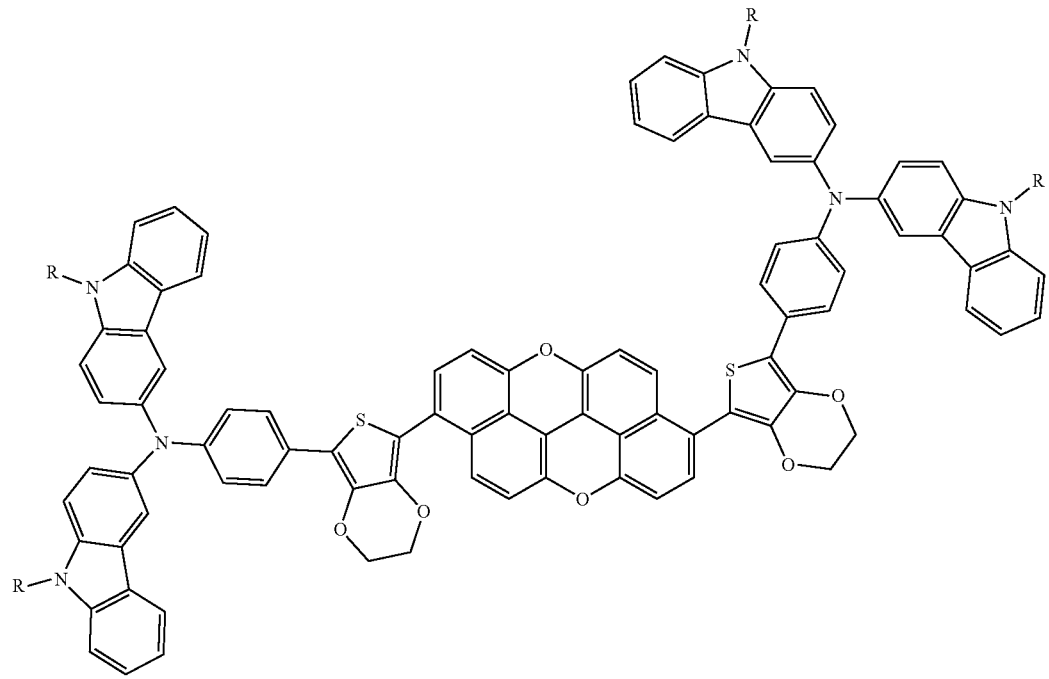
(9)
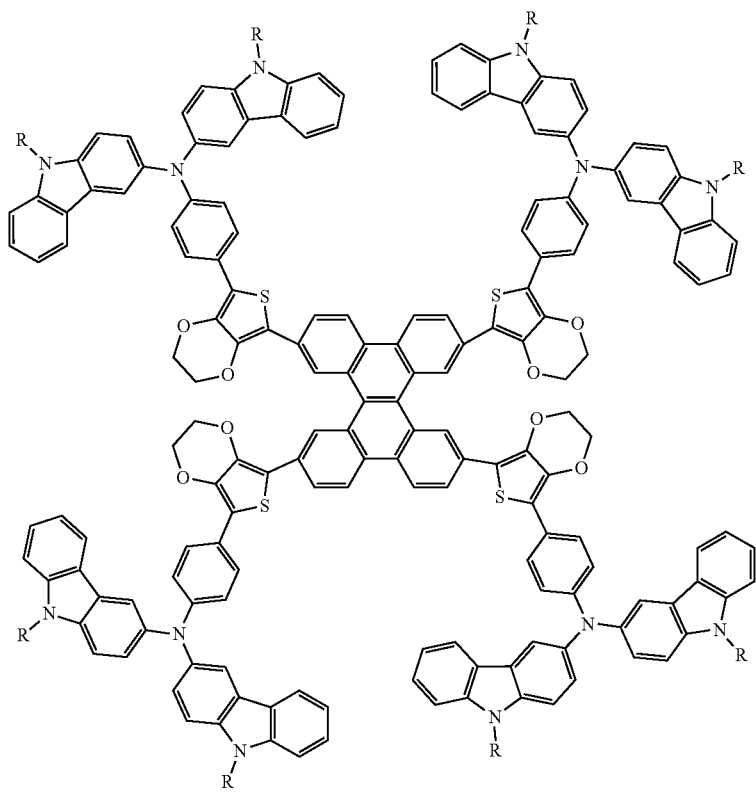
(10)

(11)
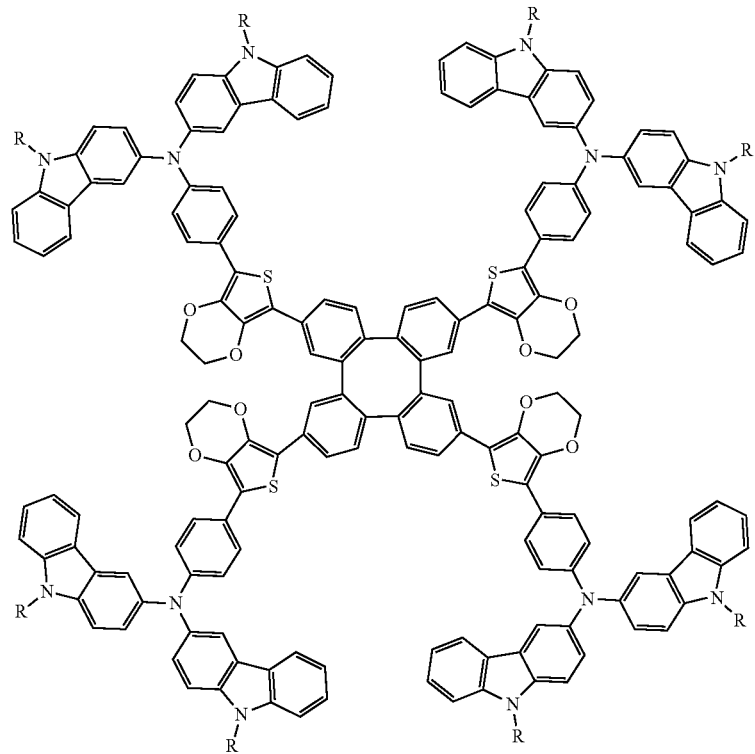
(12)
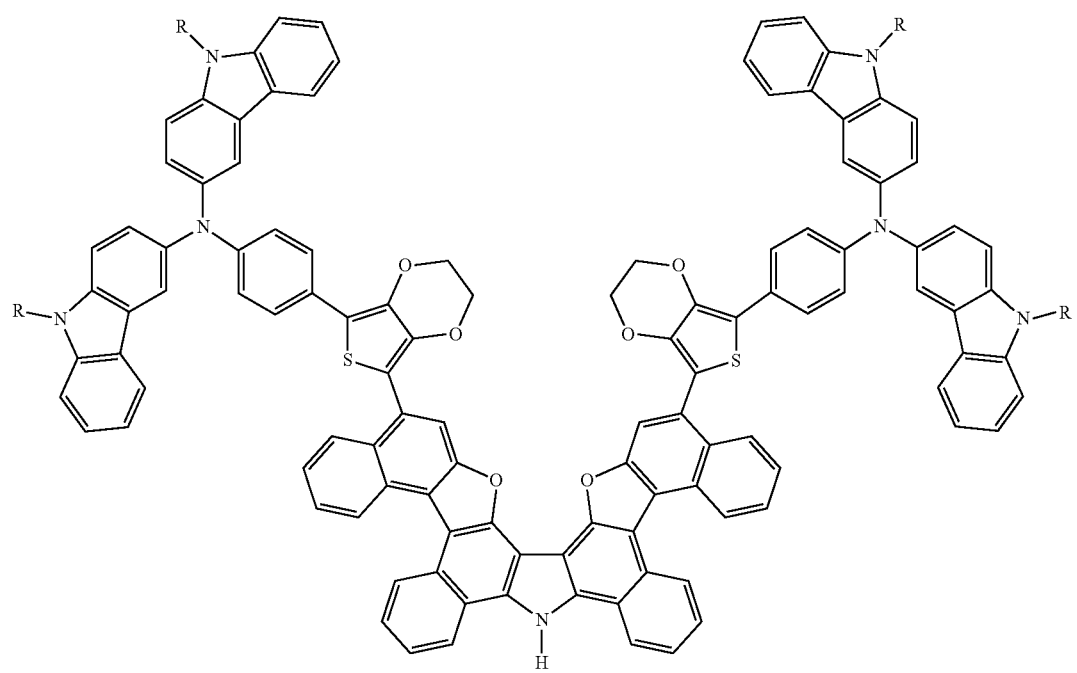

(13)
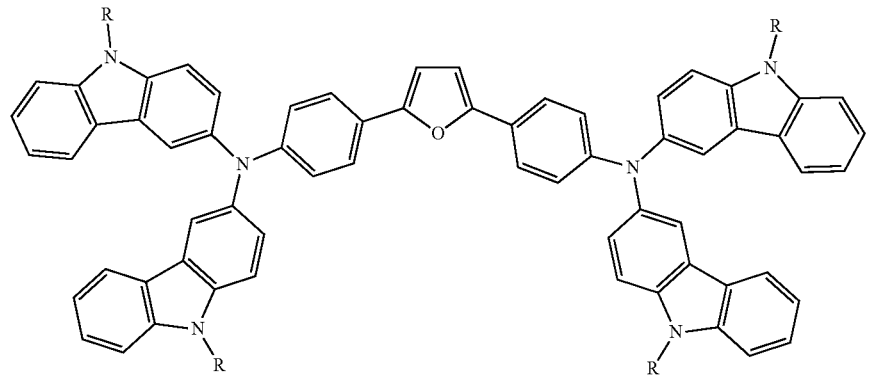
(14)
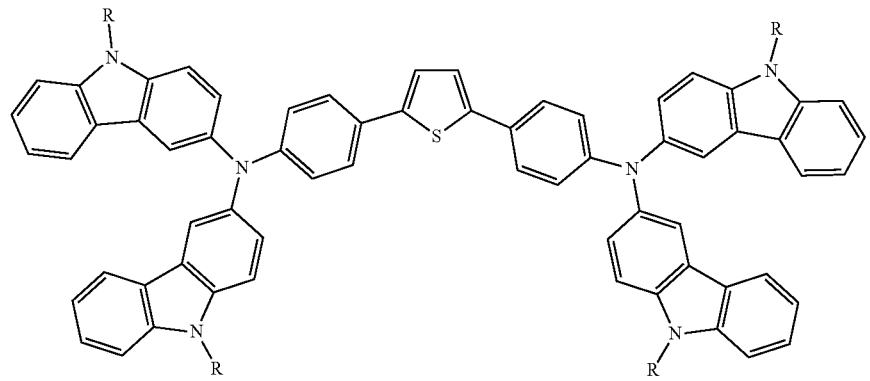
(15)
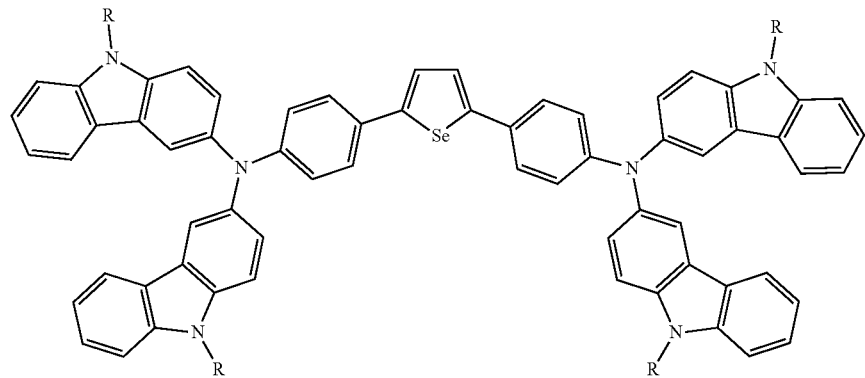
(16)
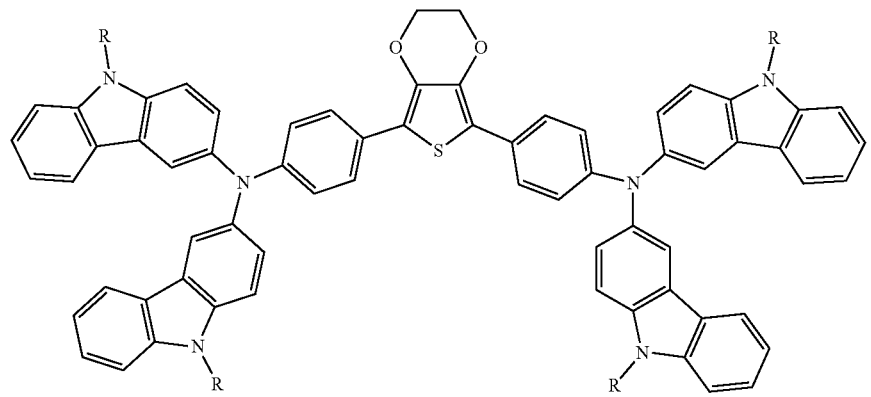

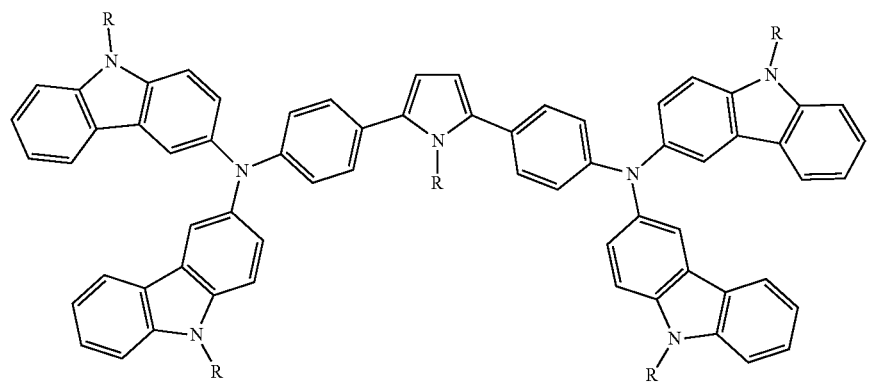
(17)
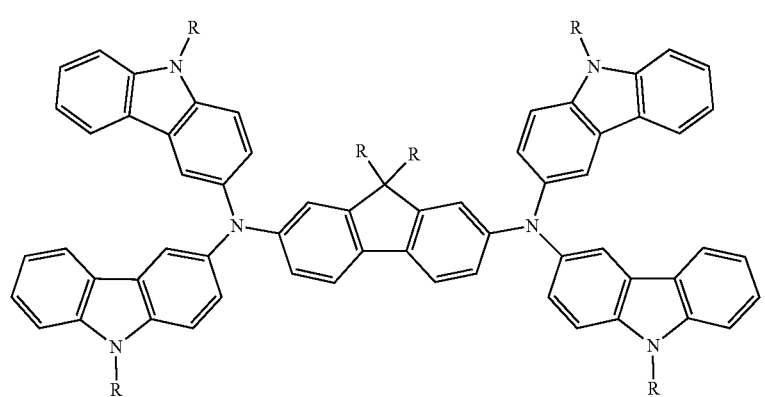
(18)
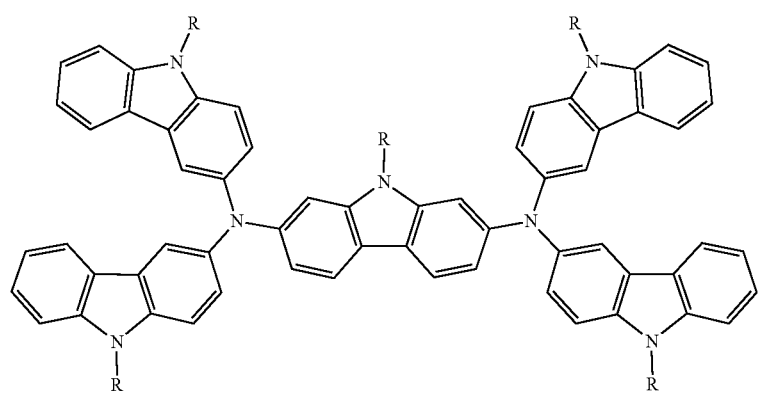
(19)
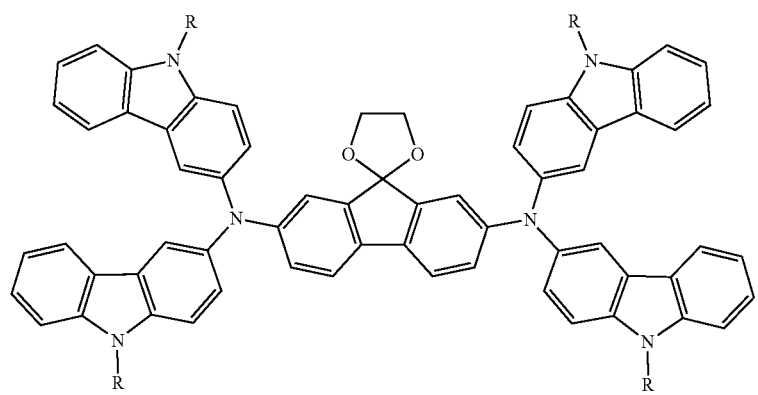
(20)

-continued
(21)
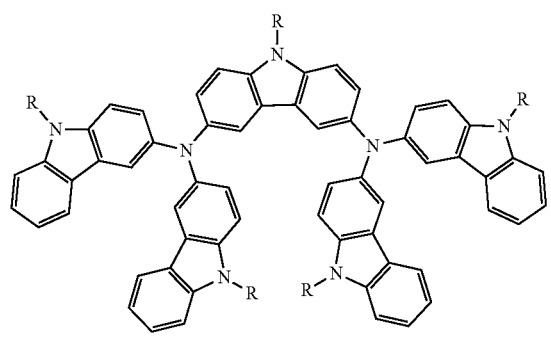
(22)
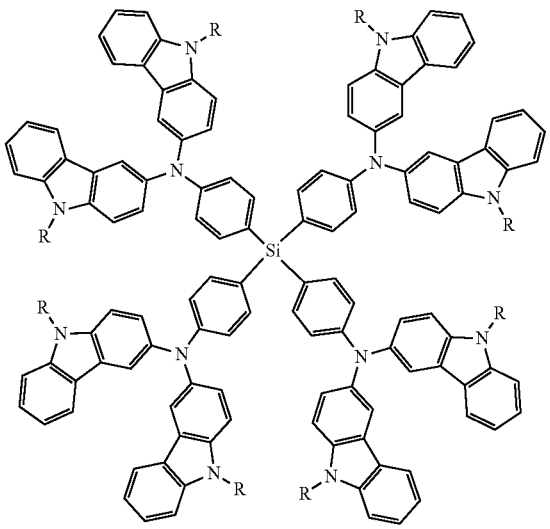
(23)
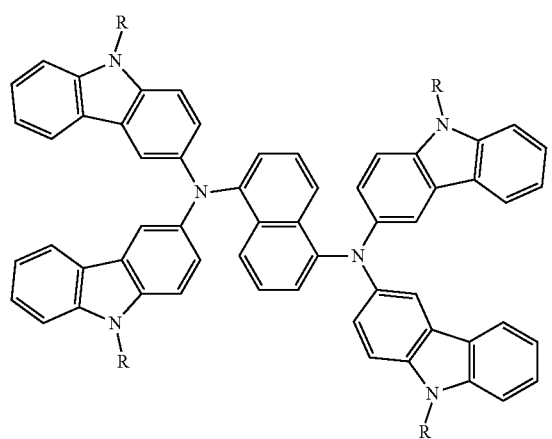
(24)
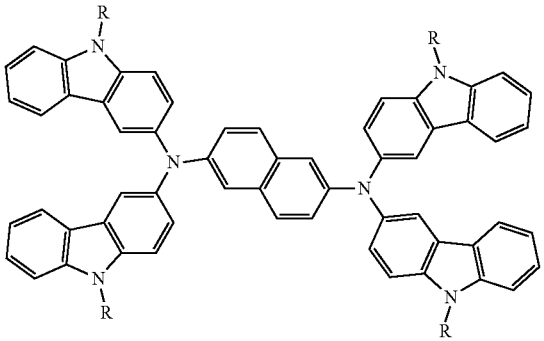
(25)
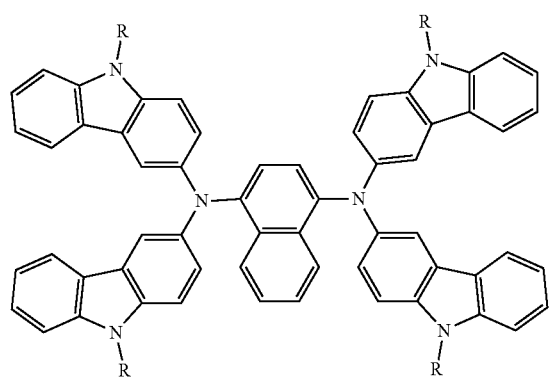
(26)
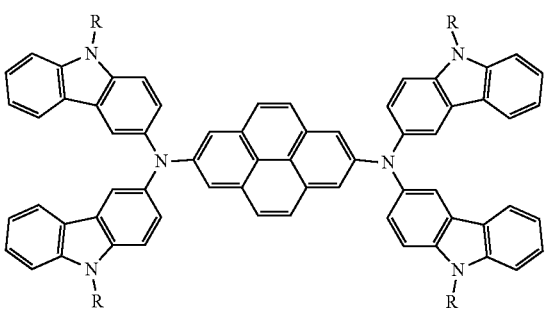

-continued
(27)
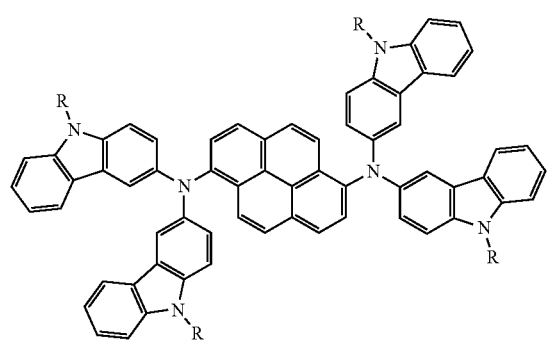
(28)
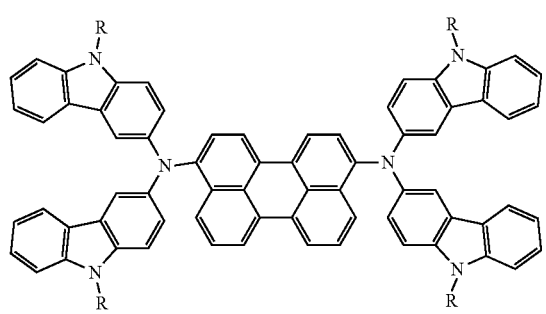
(29)
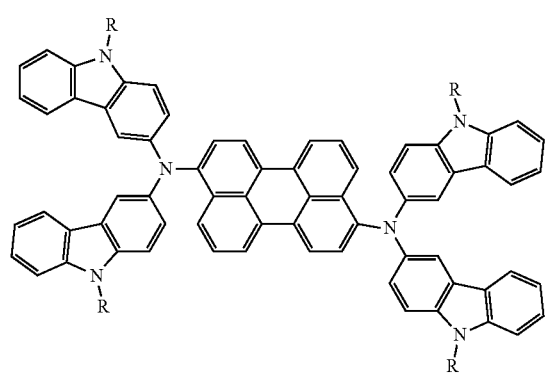
(30)
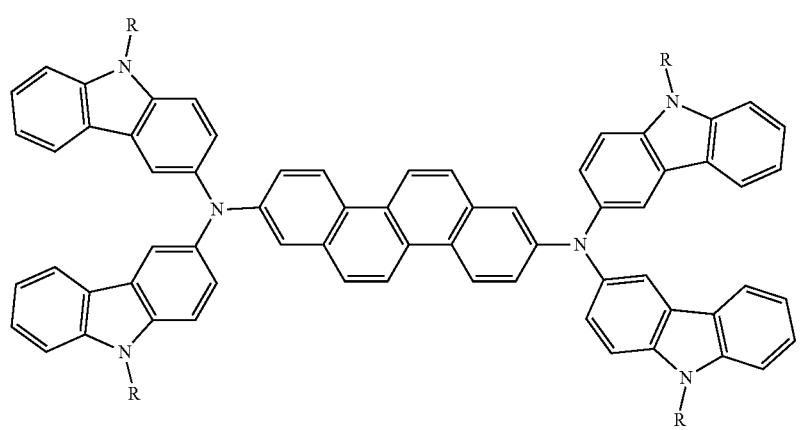
(31)
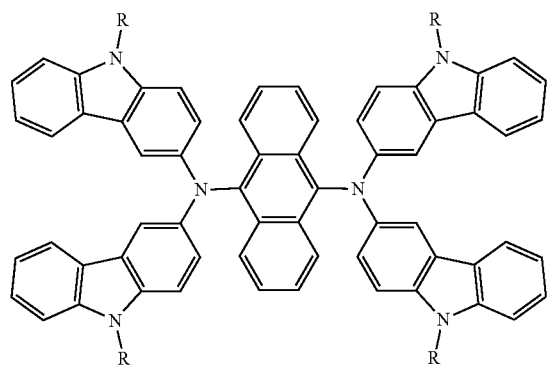
(32)
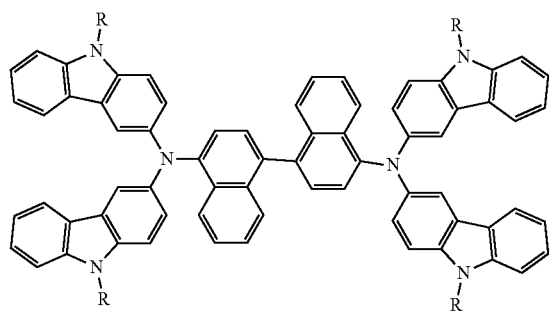

-continued
(33)
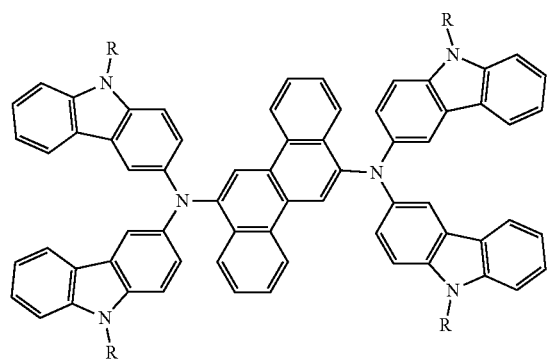
(34)
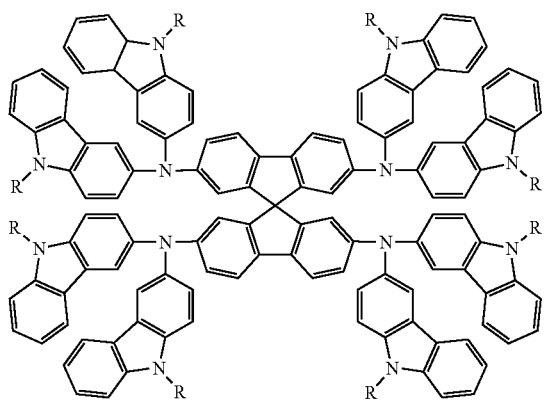
(35)
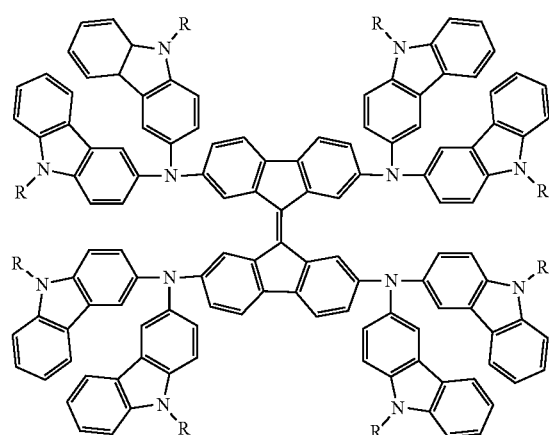
(36)
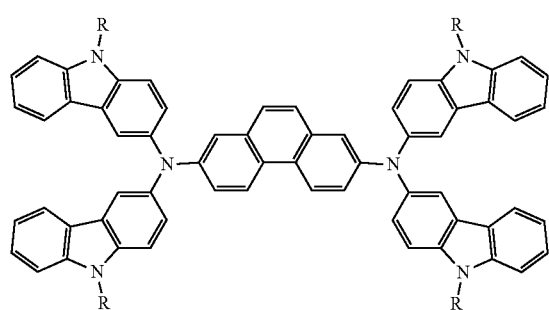
(37)
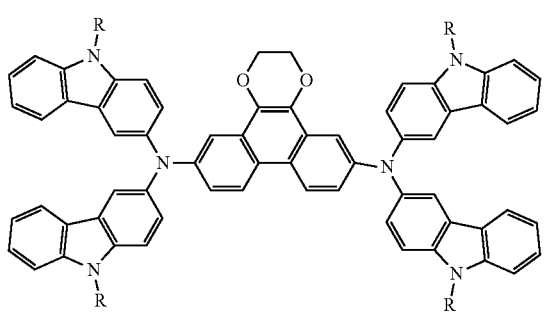
(38)
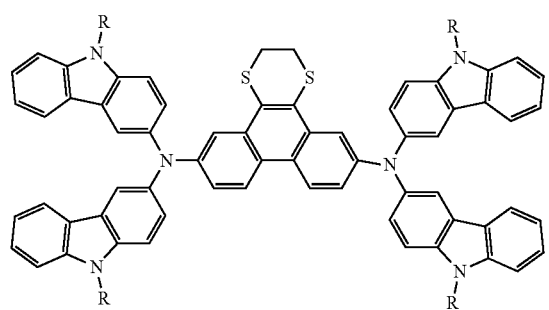
(39)
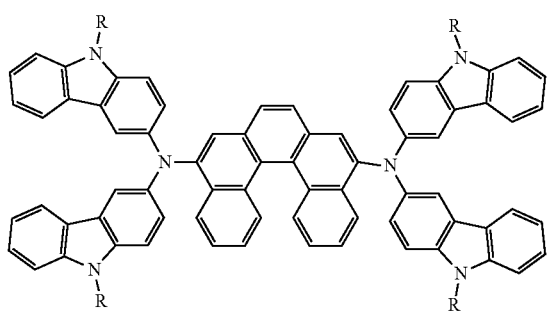

-continued
(40)
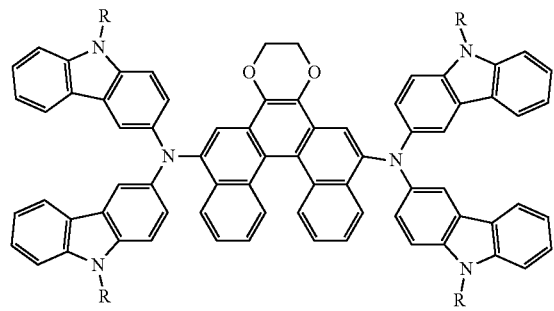
(41)
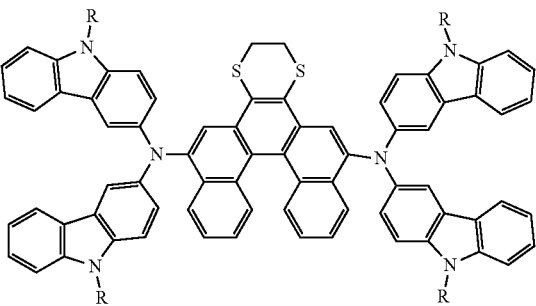
(42)
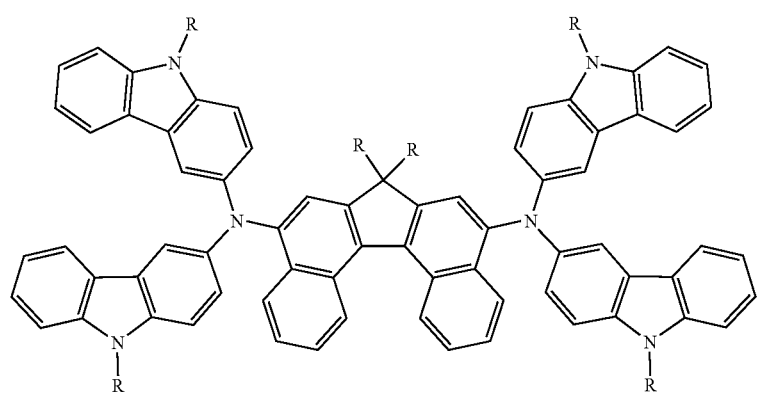
(43)
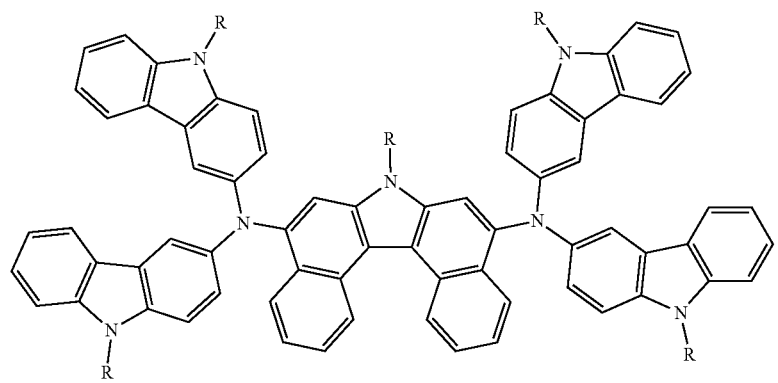
(44)
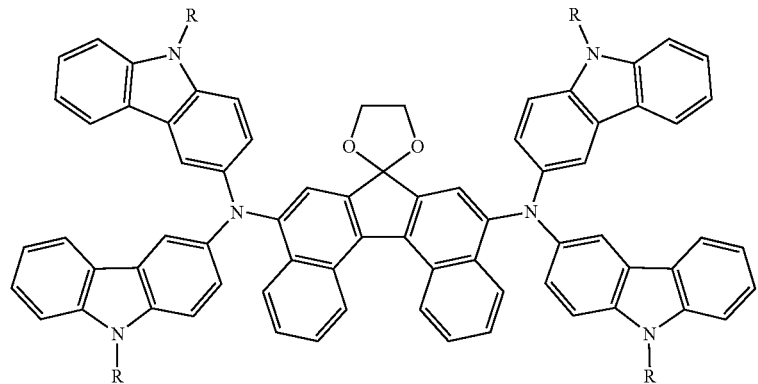

-continued
(46)
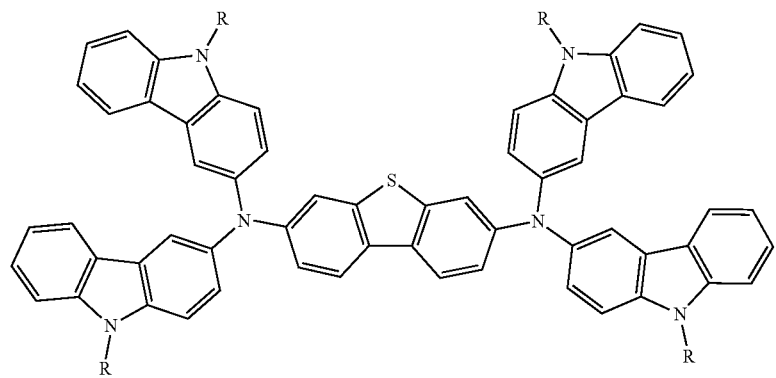
(47)
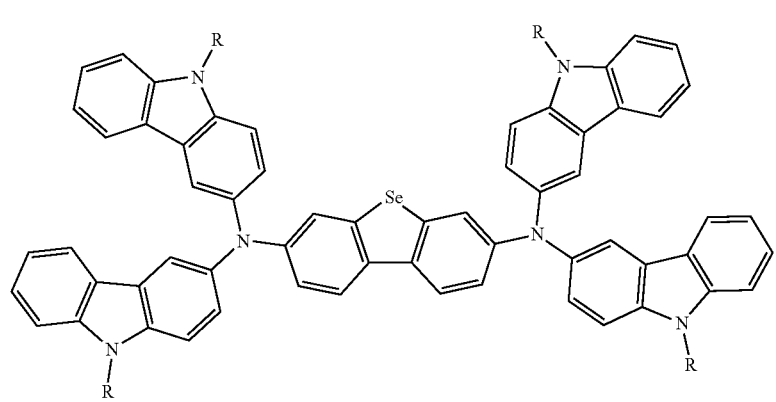
(48) (49)
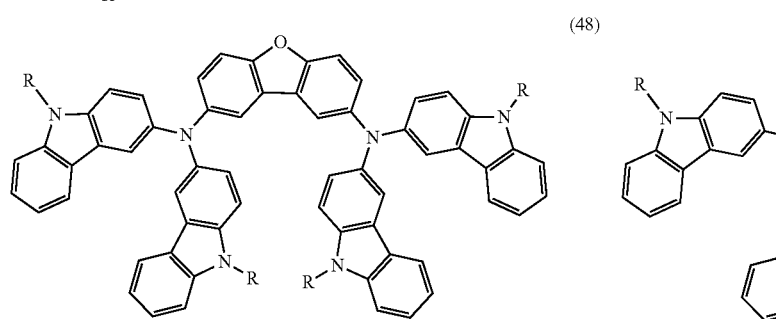
(50)
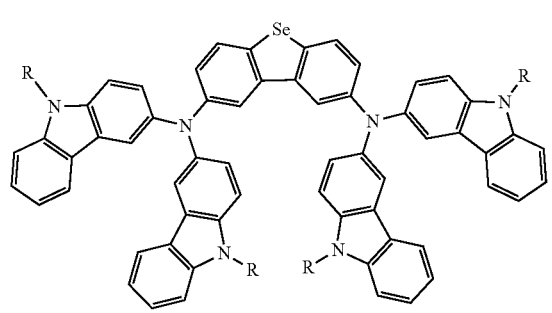

-continued
(51)
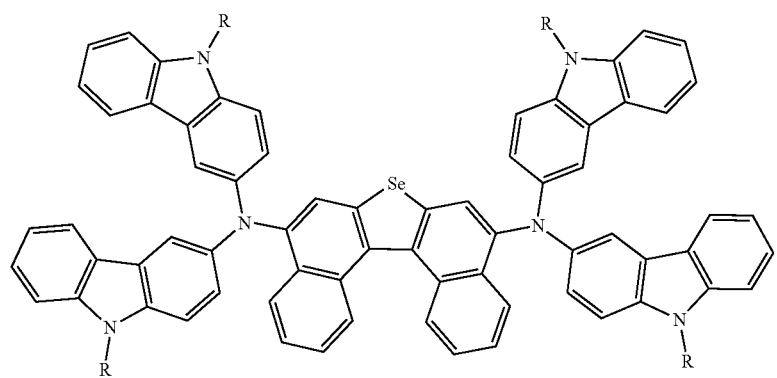
(52)
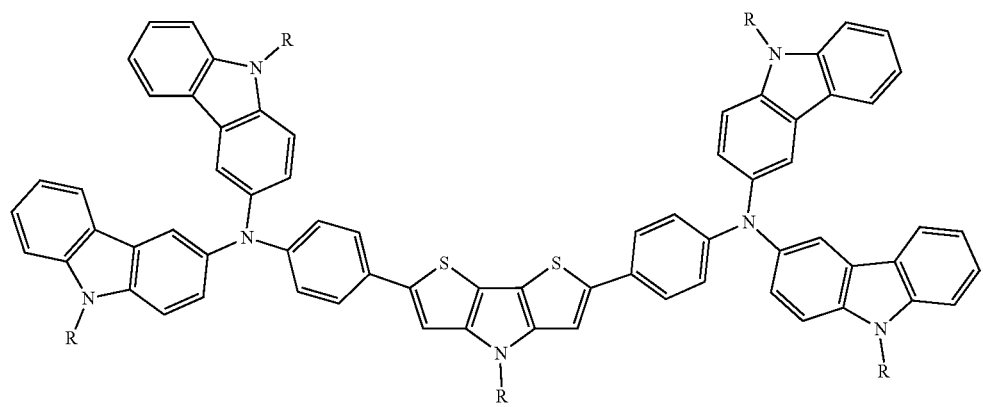
(53)
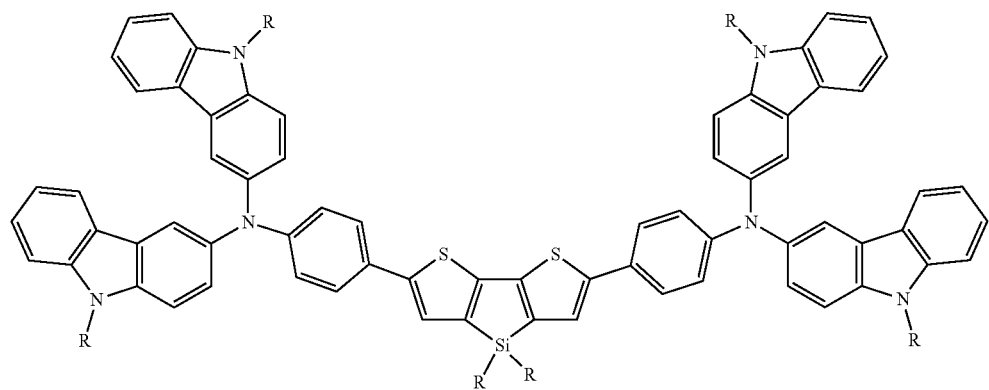
(54)
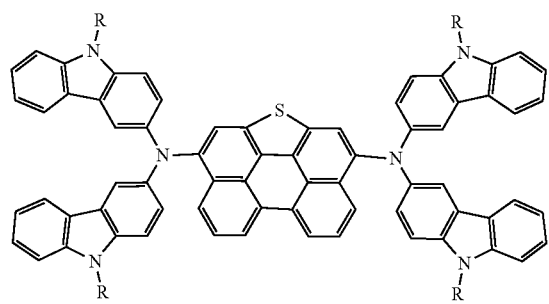
(55)
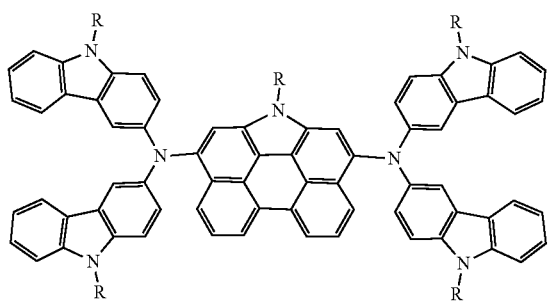

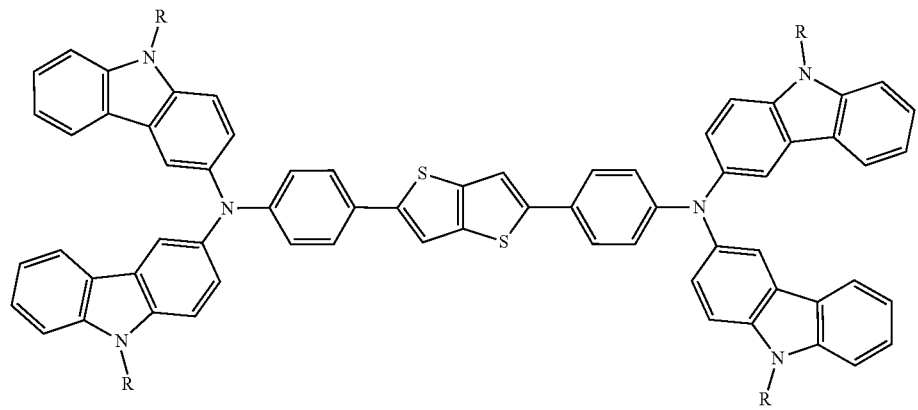
(56)
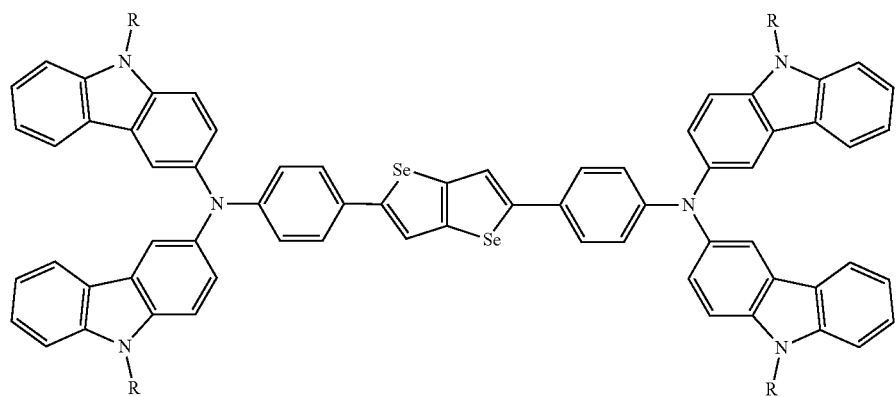
(57)
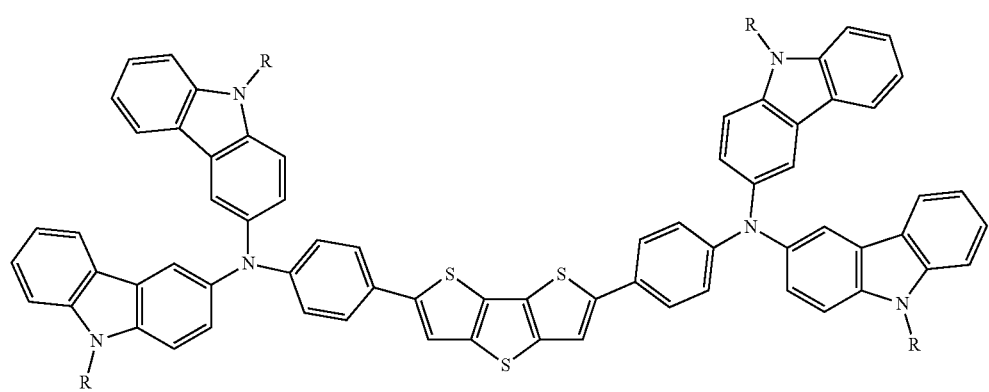
(58)

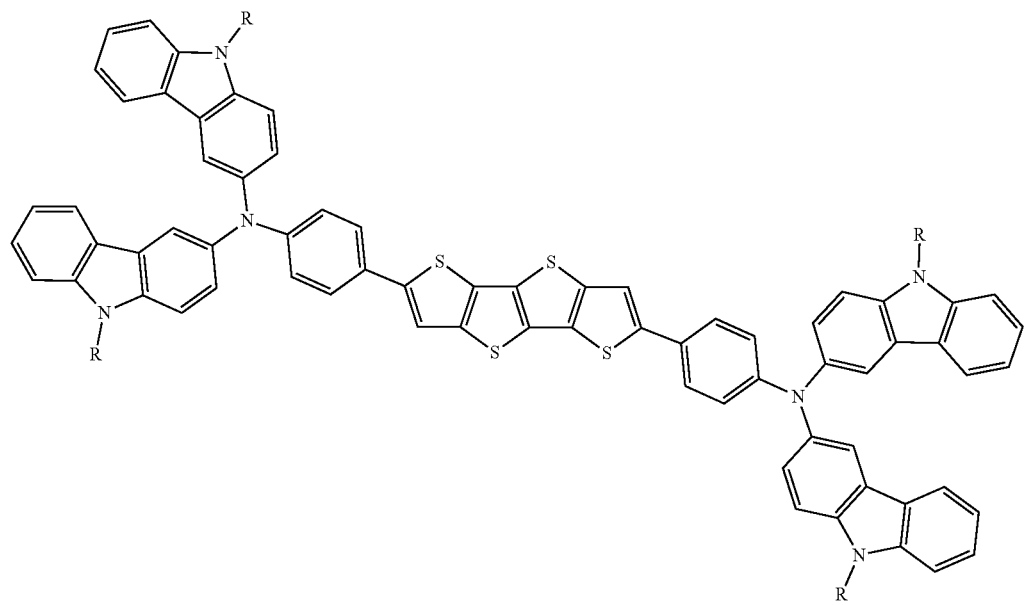
(59)
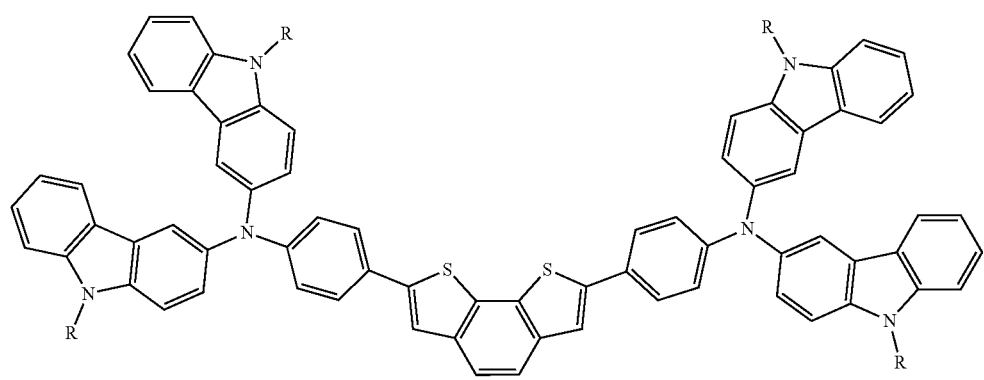
(60)
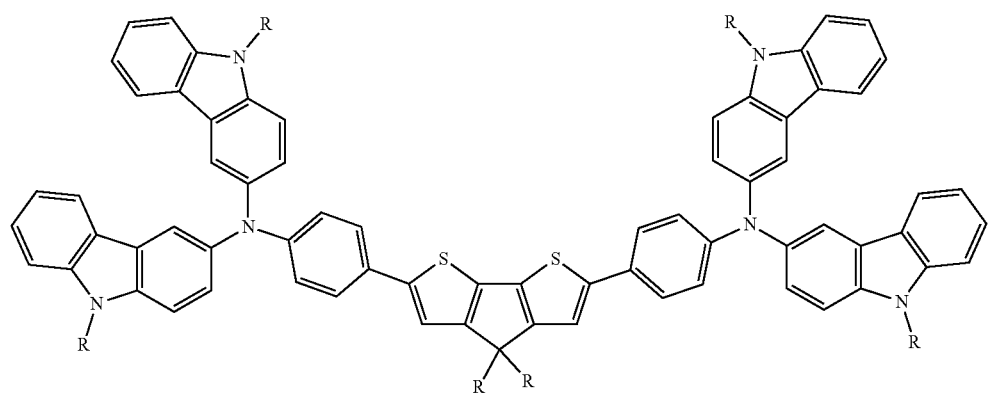
(61)

-continued
(62)
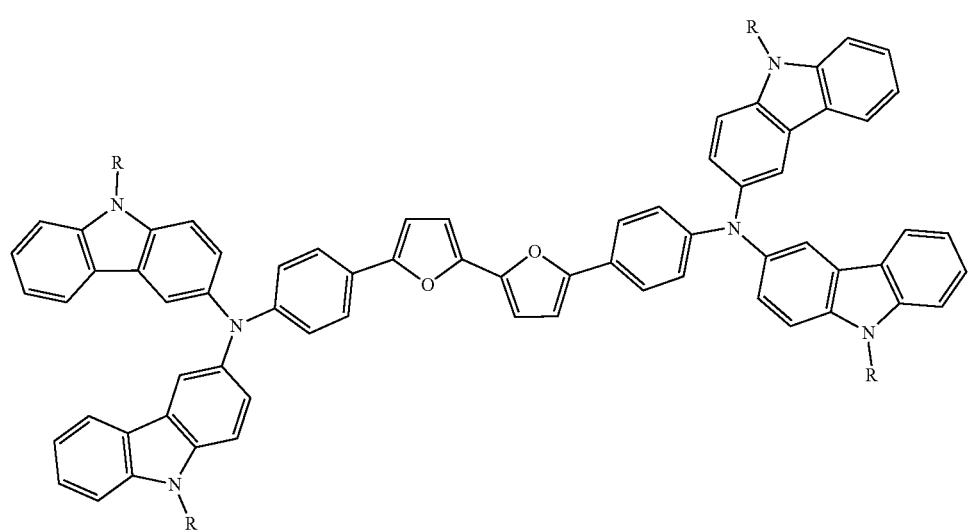
(63)
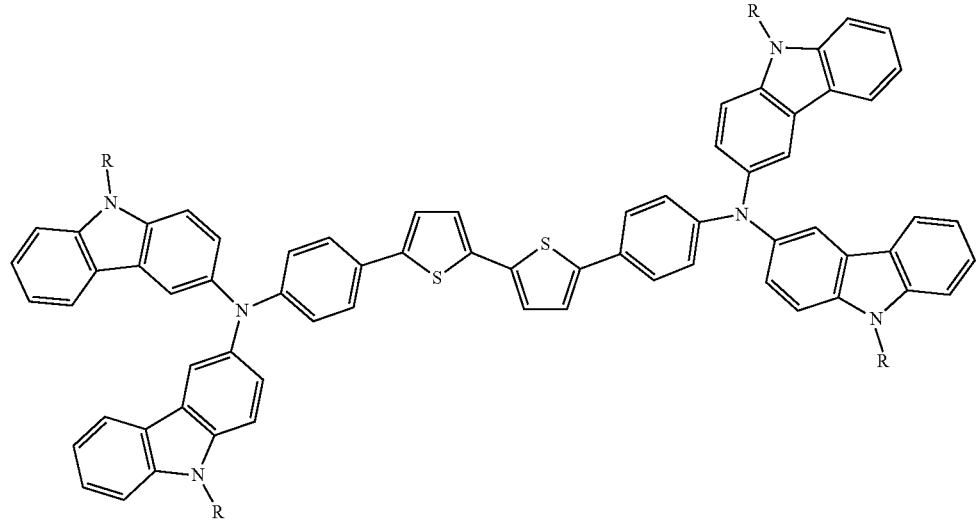
(64)
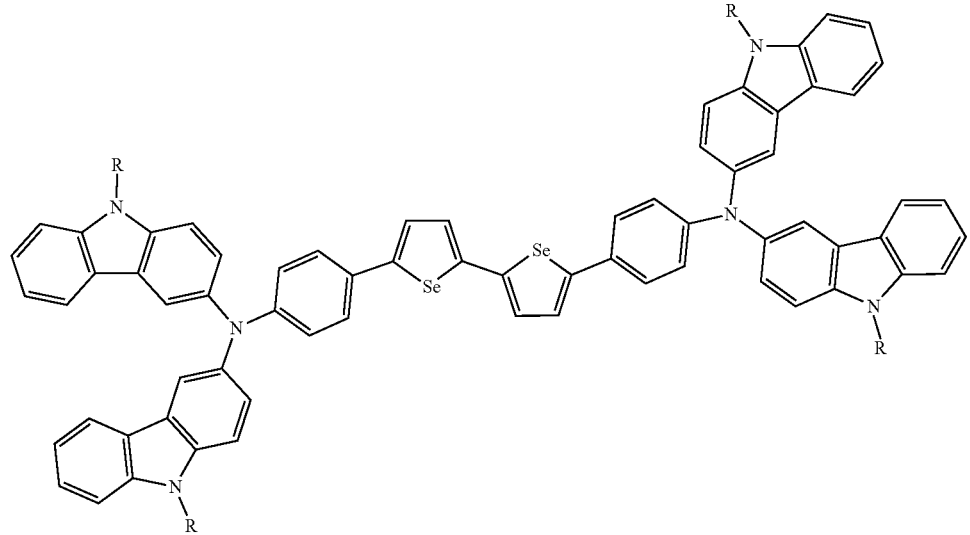

(65)
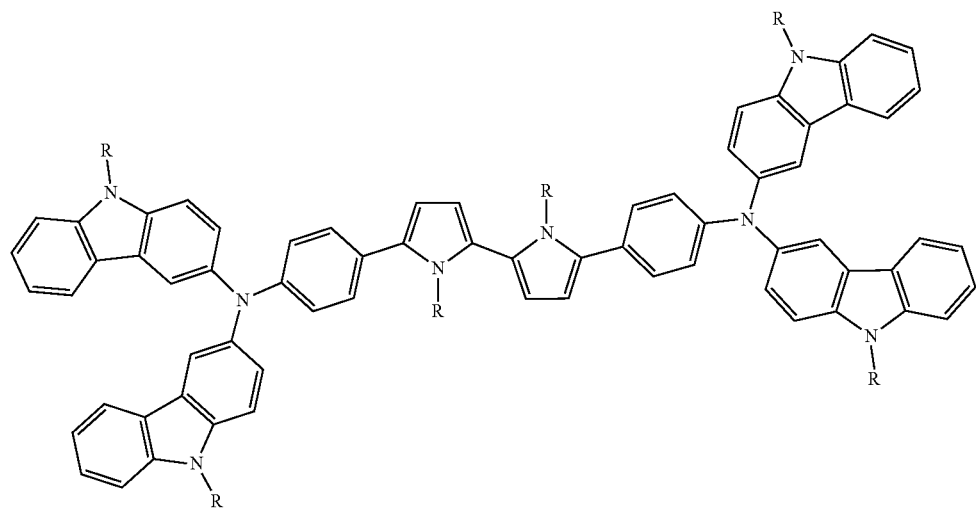
(66)
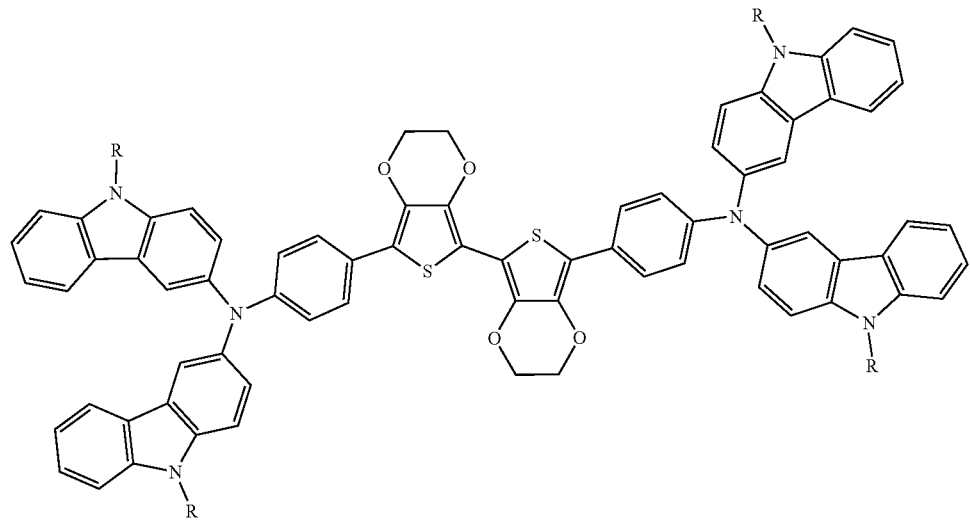
(67)
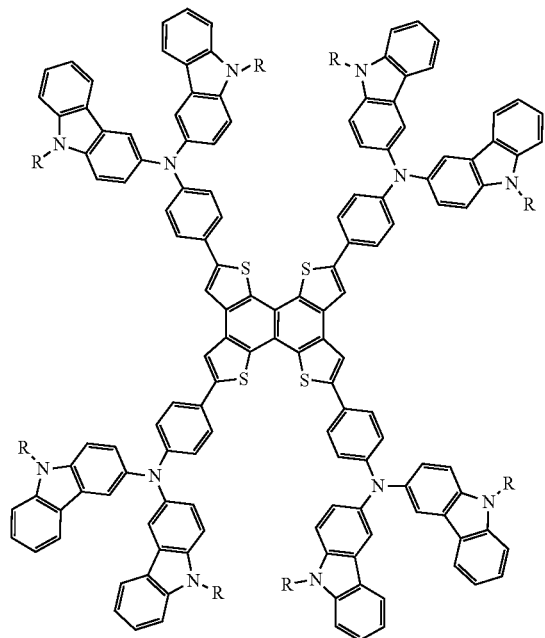
(68)
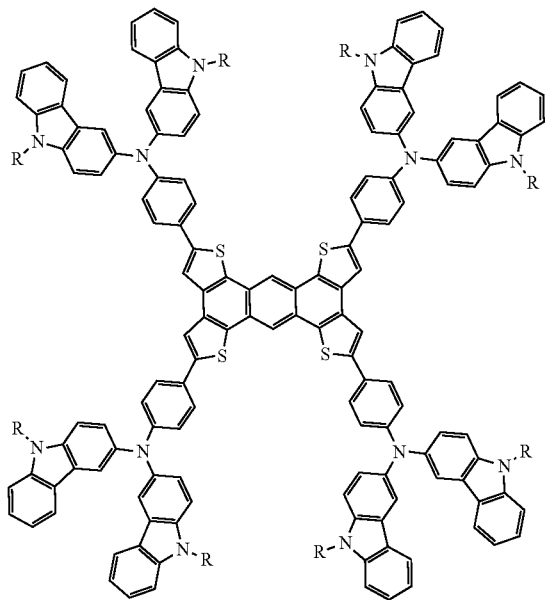

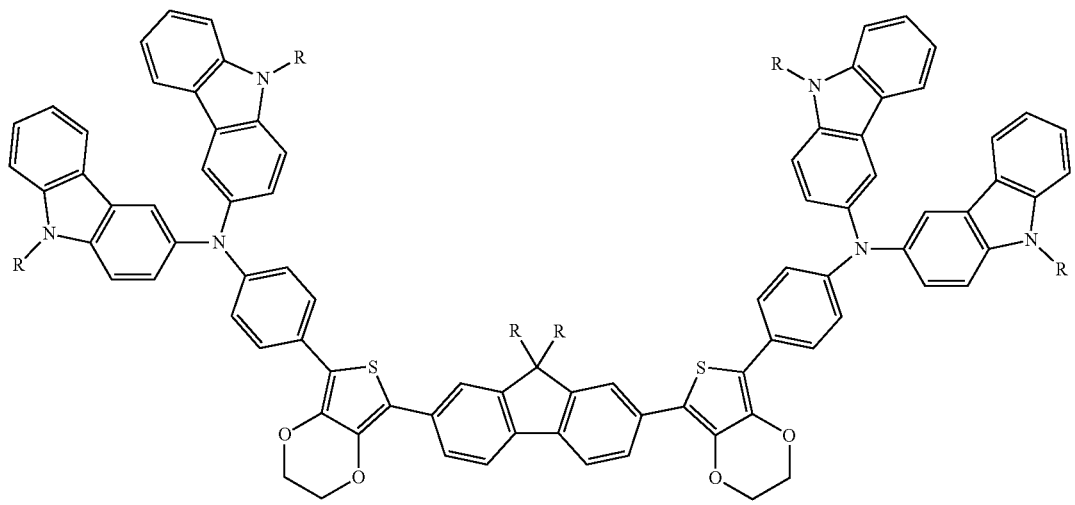
(69)
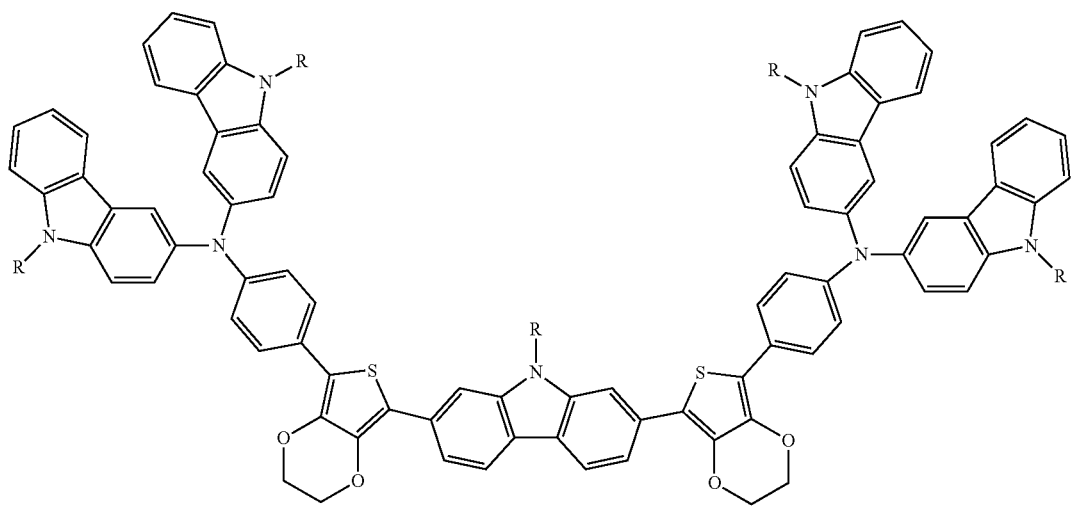
(70)
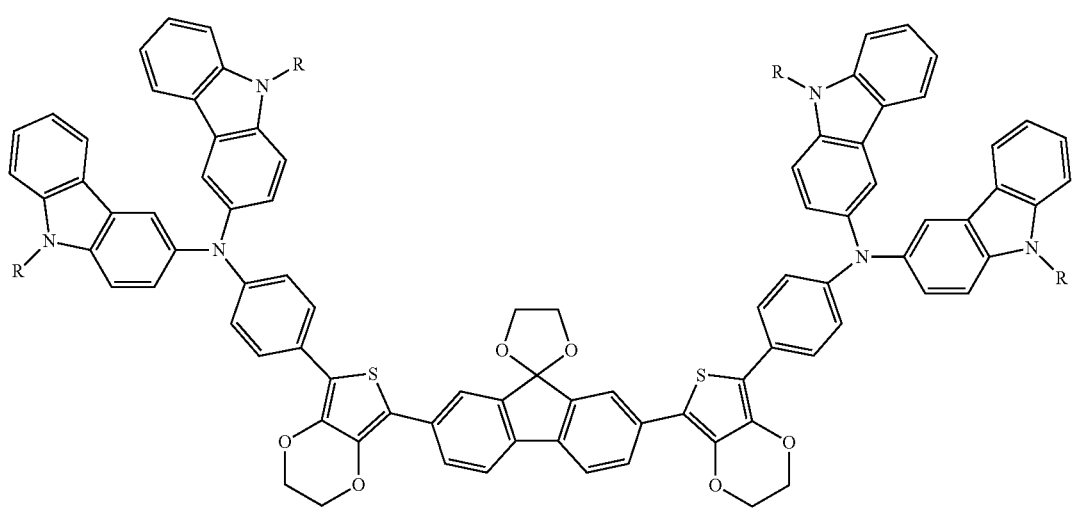
(71)

-continued
(72)
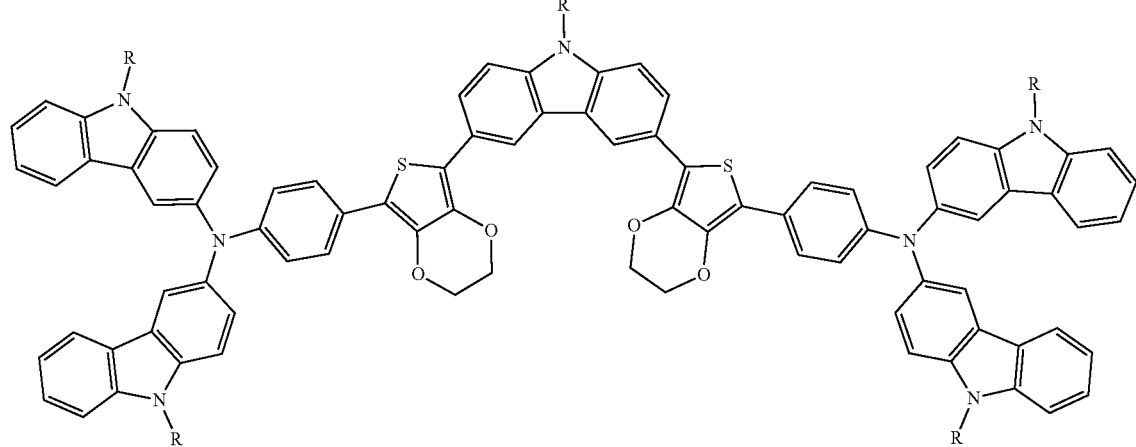
(73)
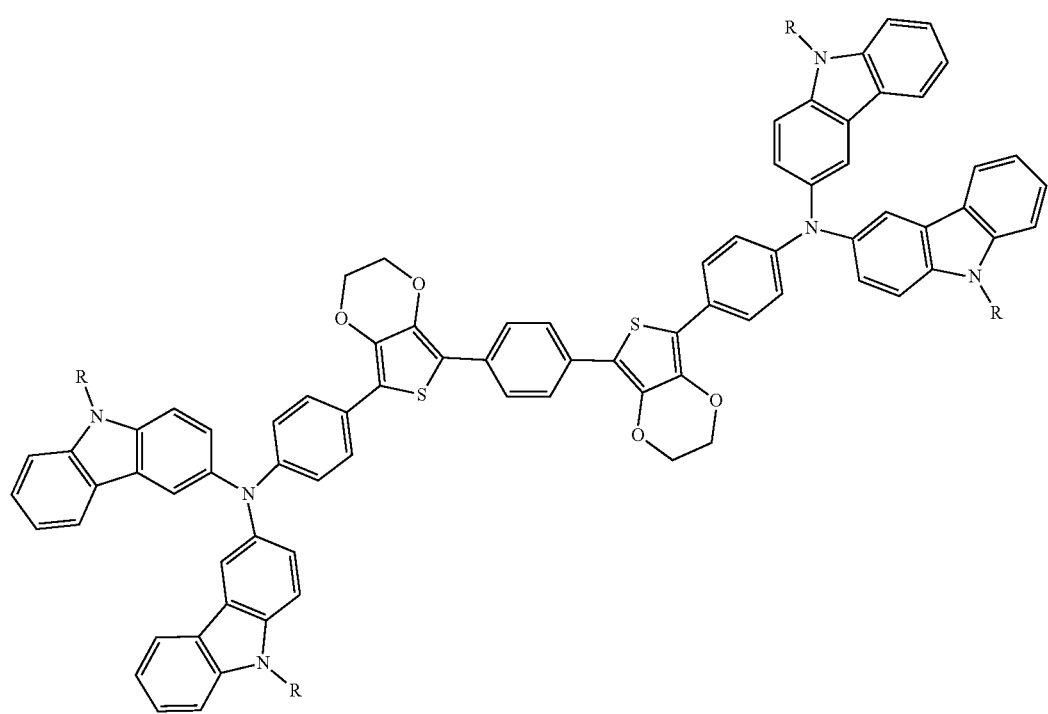

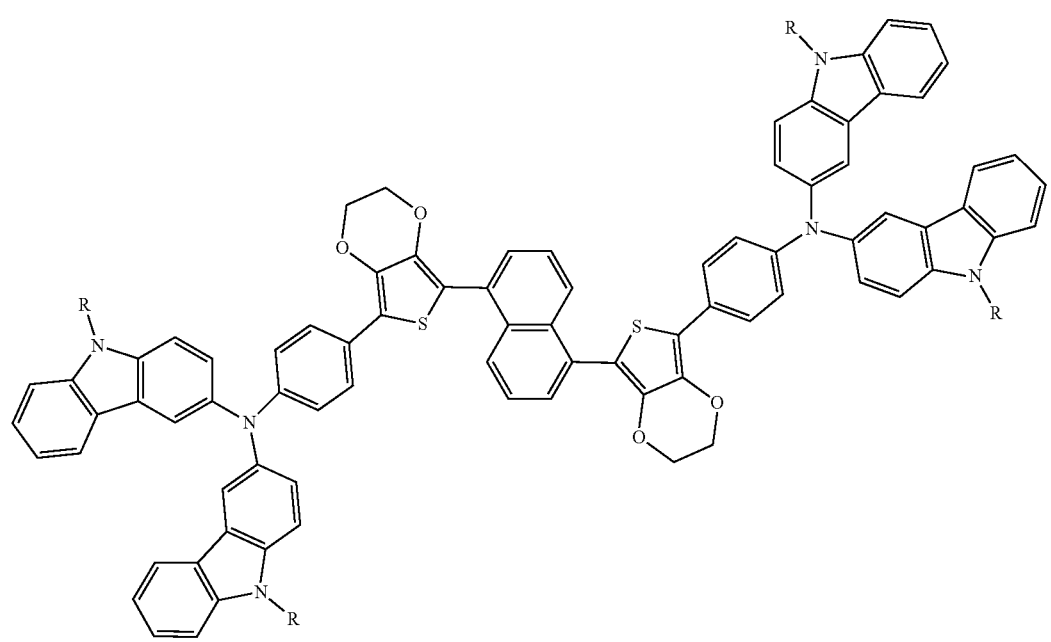
(74)
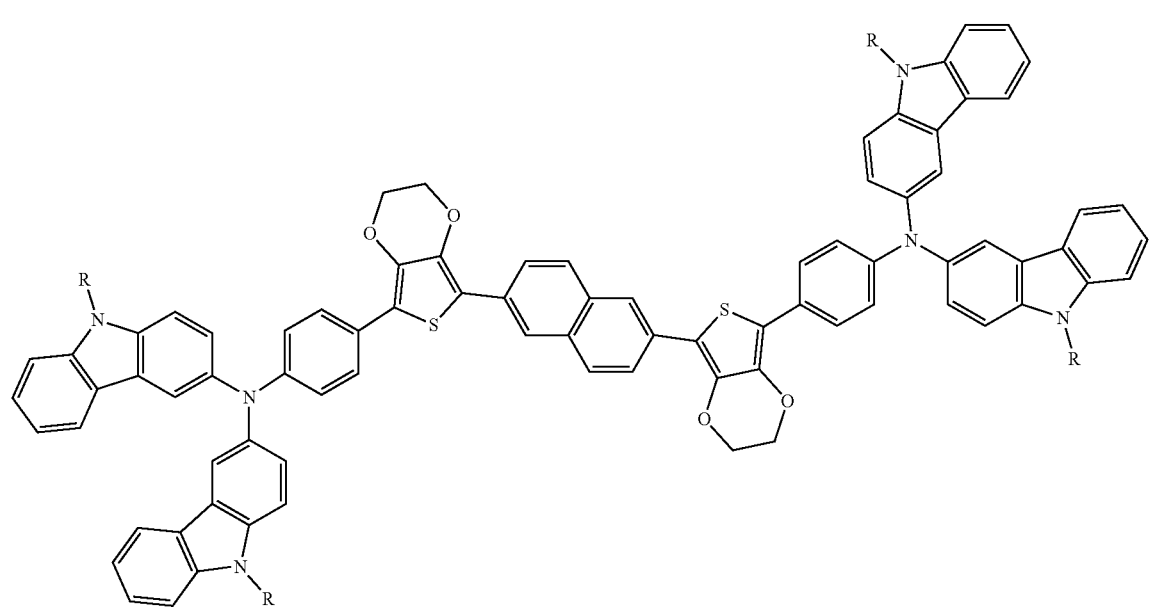
(75)

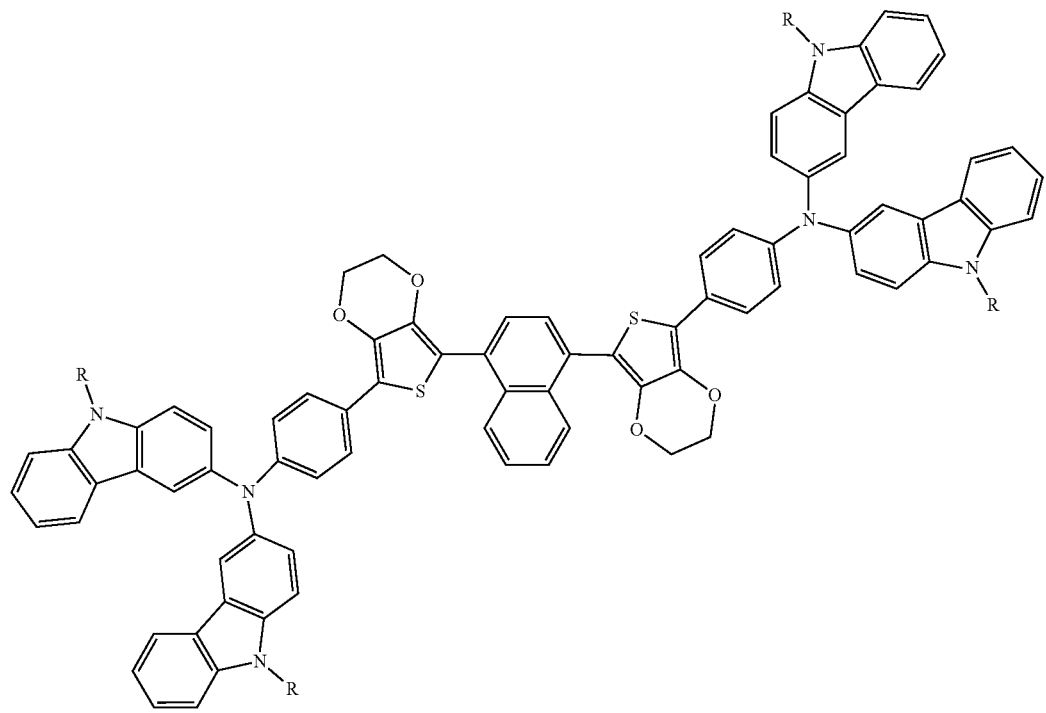
(76)
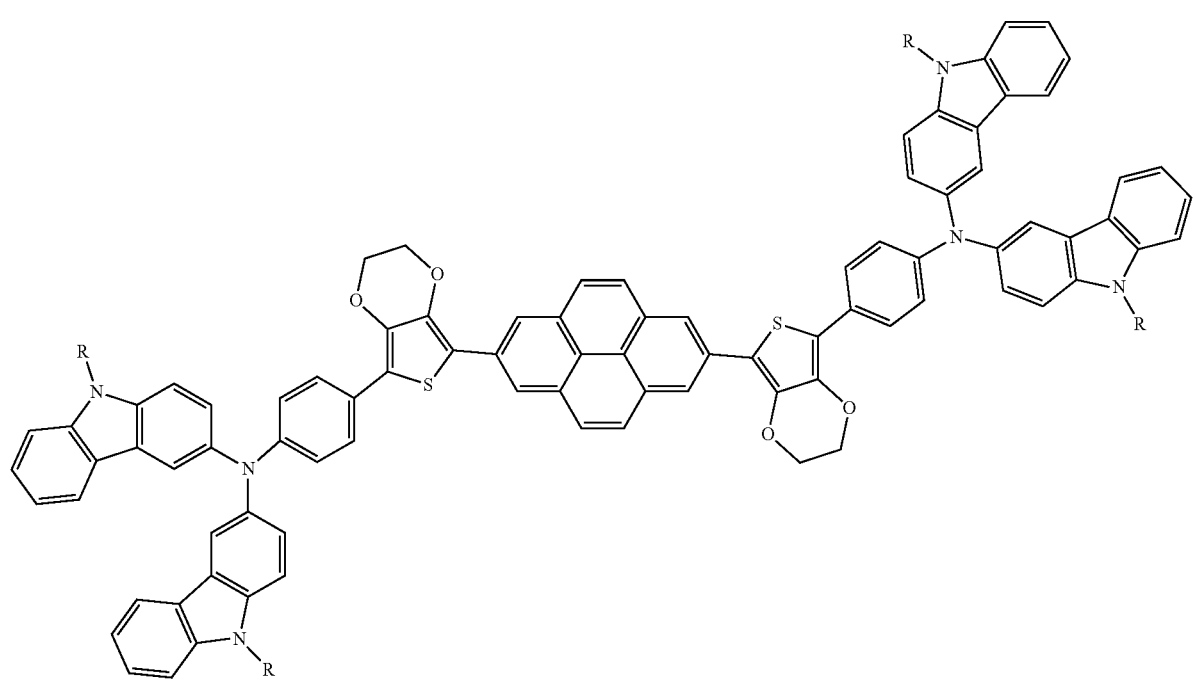
(77)

(78)
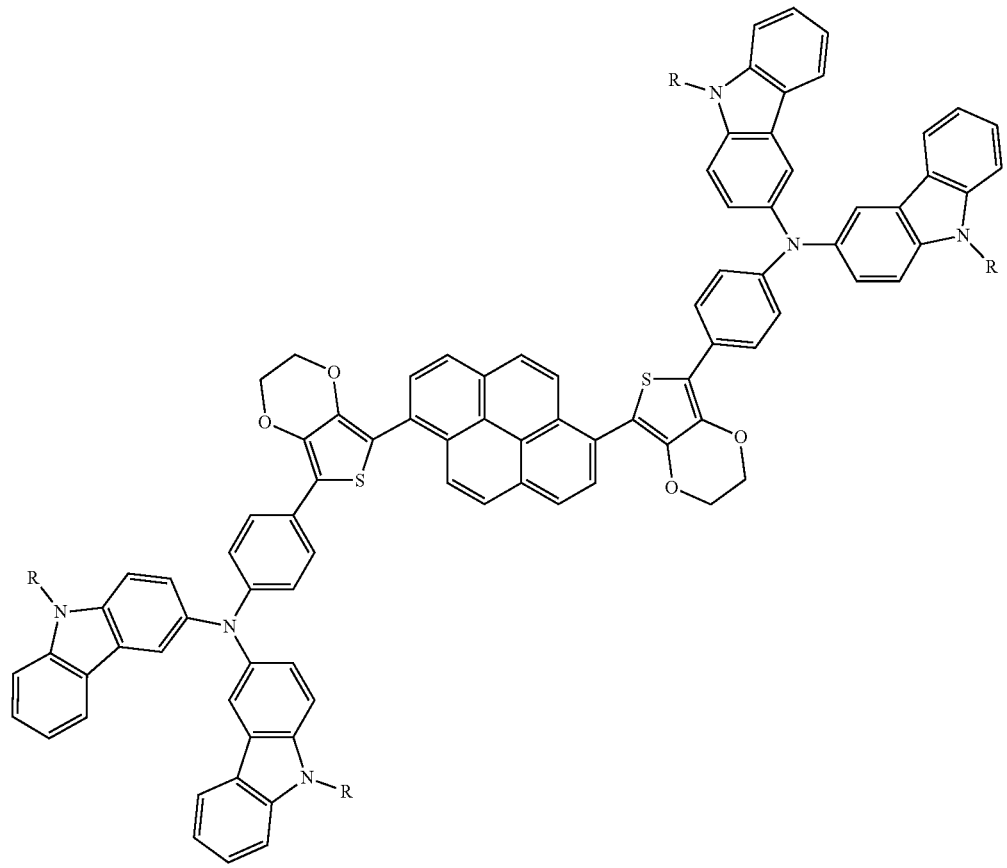
(79)
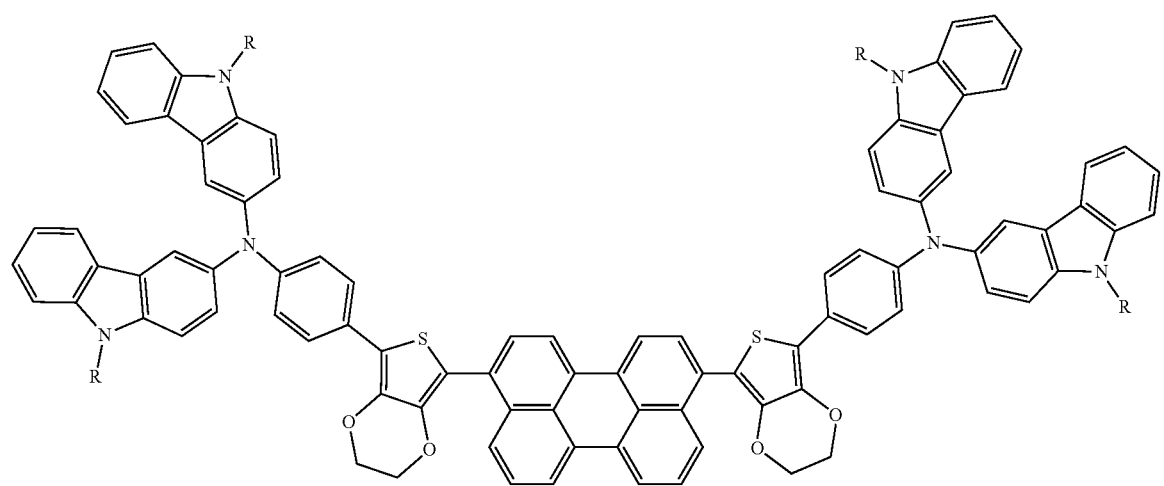

-continued
(80)
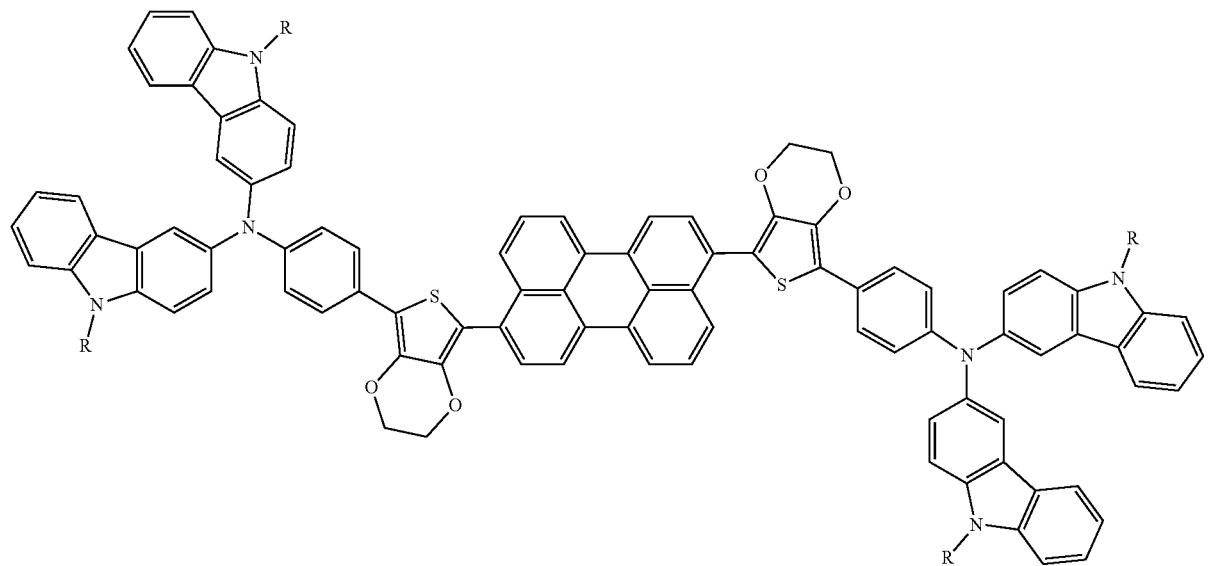
(81)
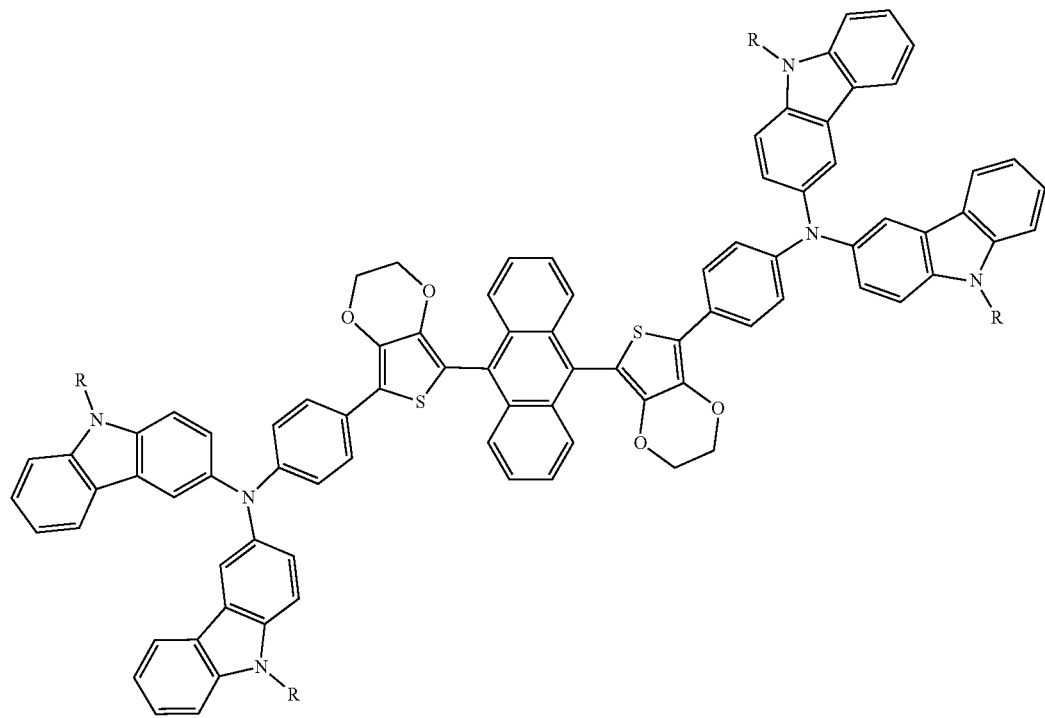

(82)
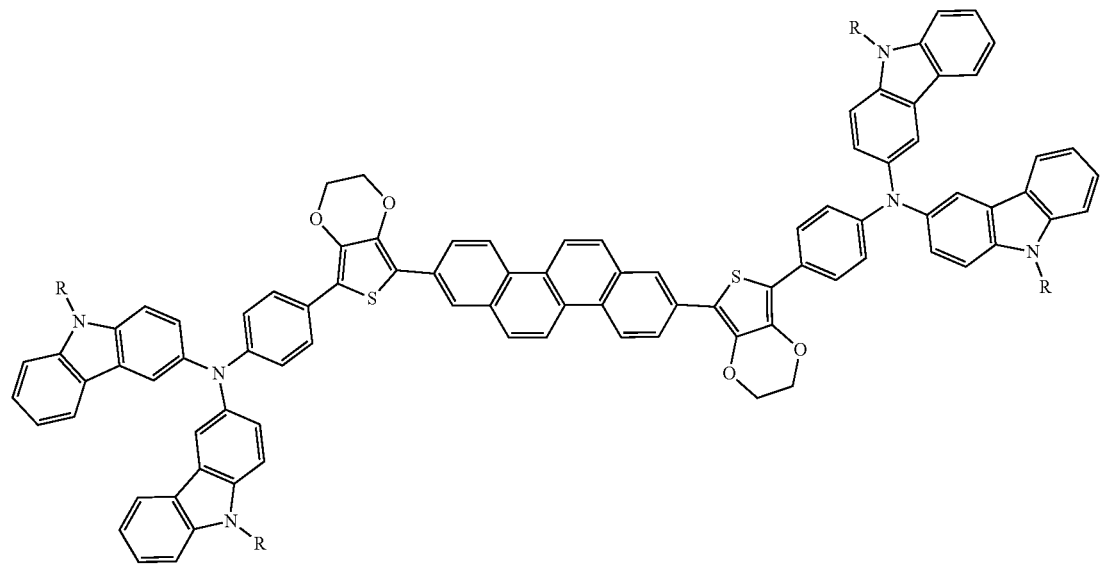
(83)
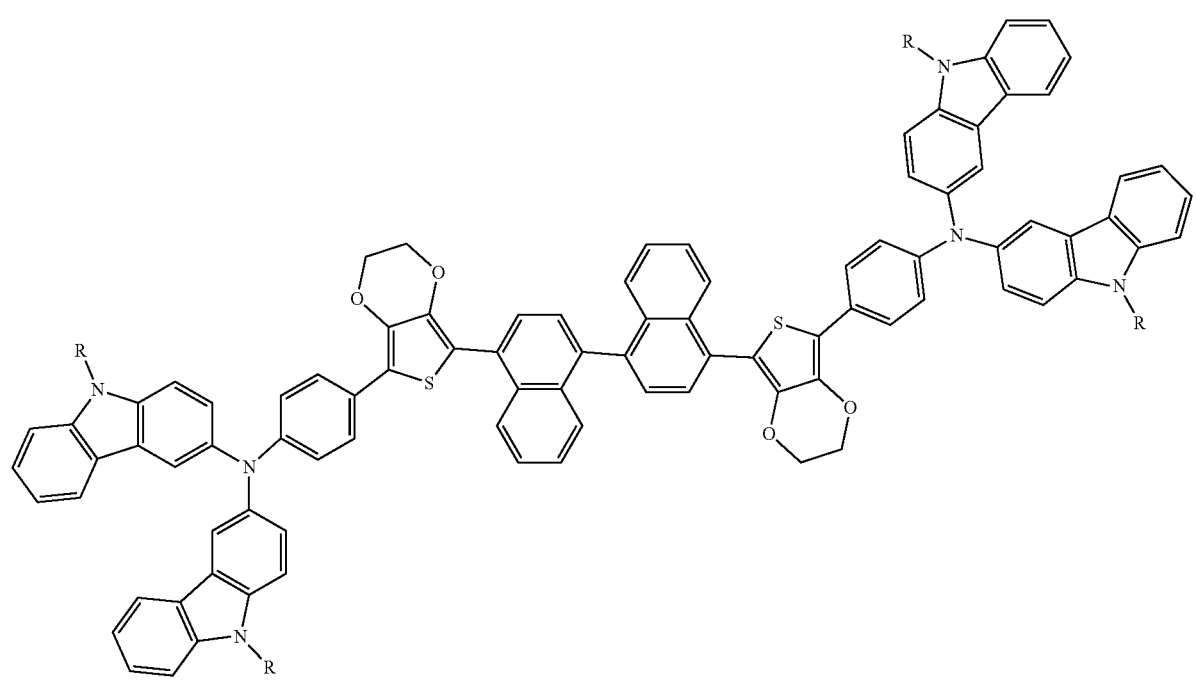

-continued
(84)
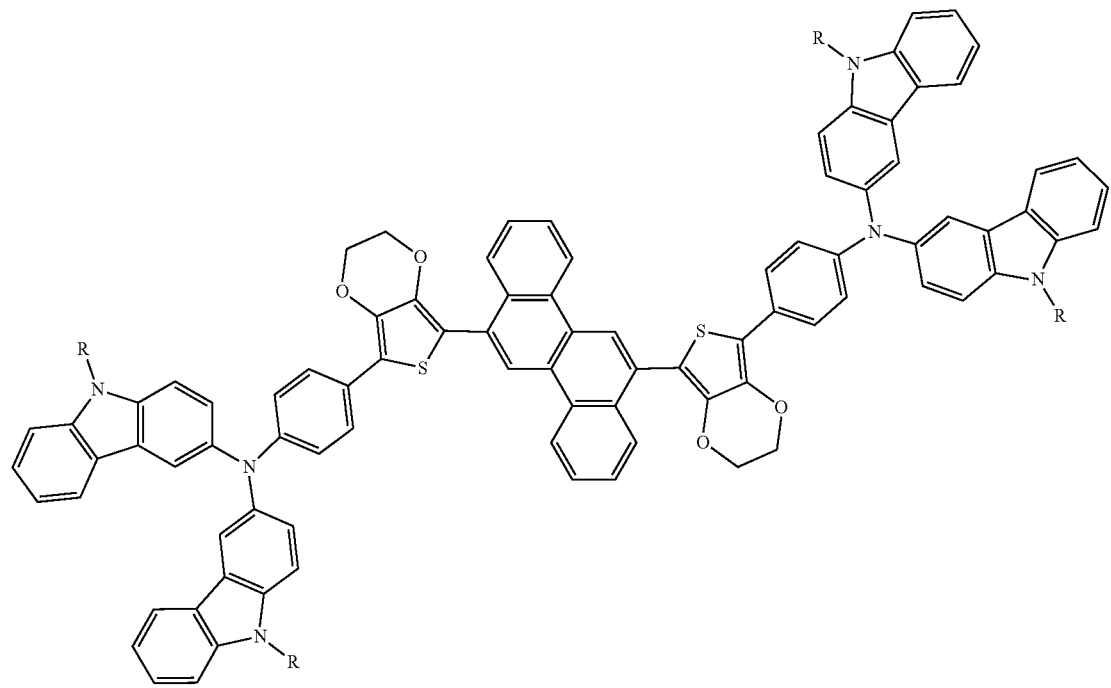
(85)
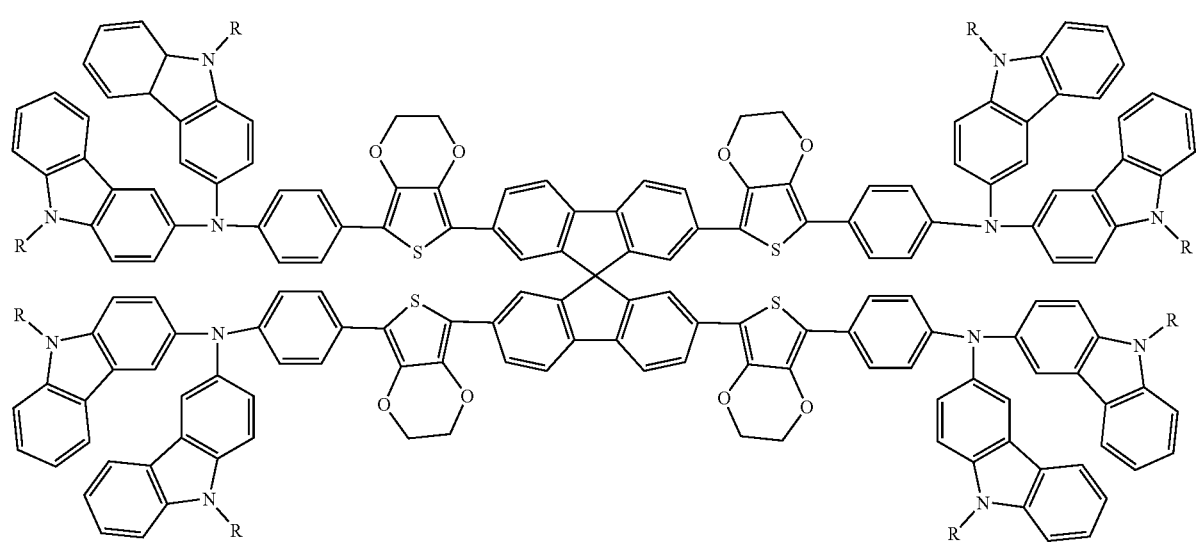

-continued
(86)
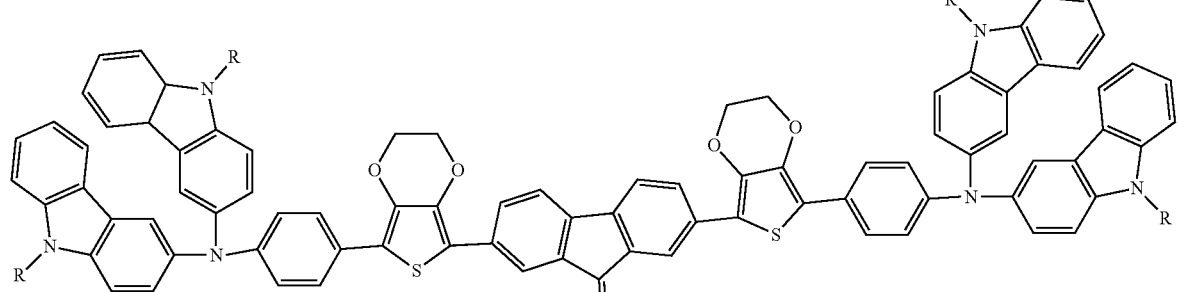
(87)
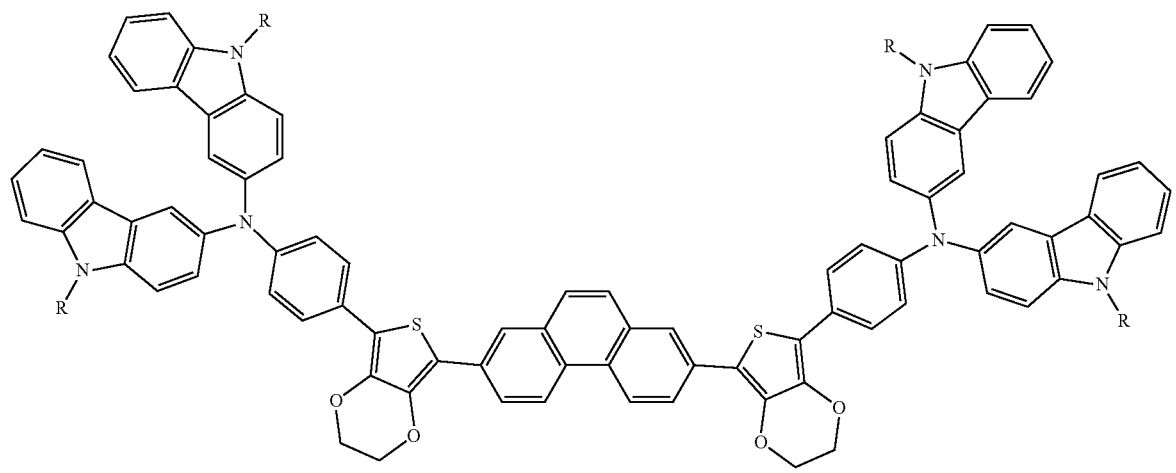
(88)
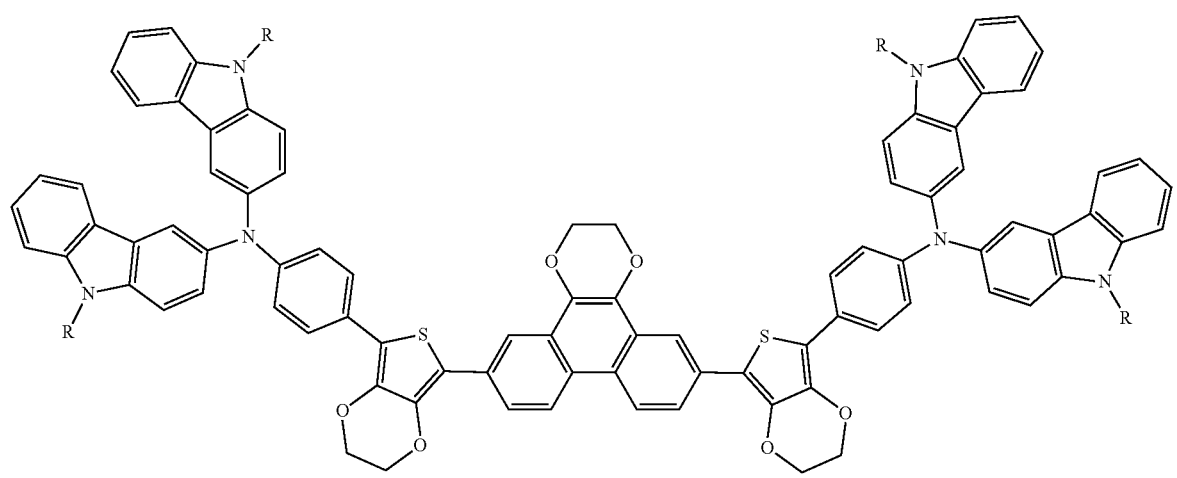

-continued
(89)
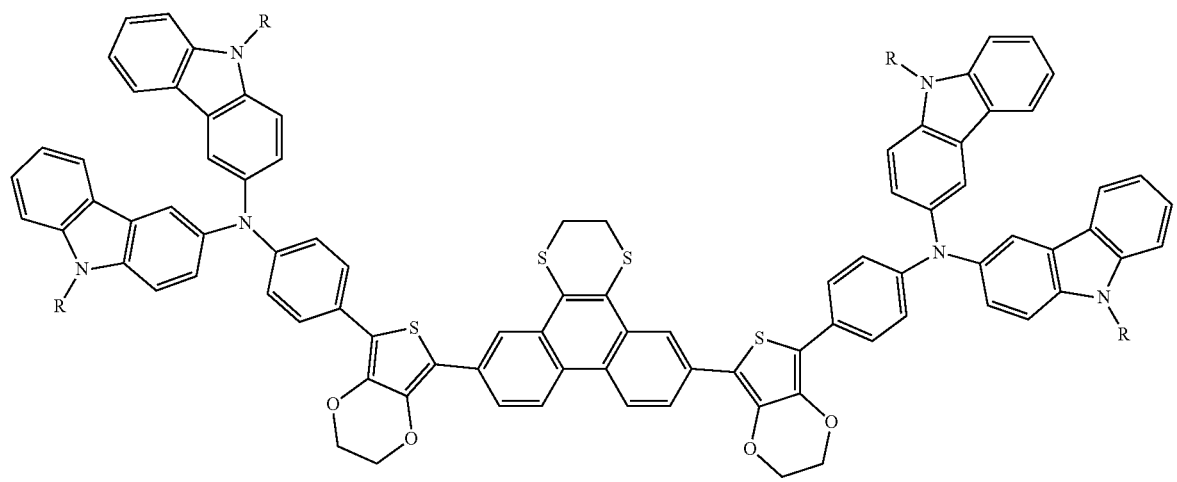
(90)
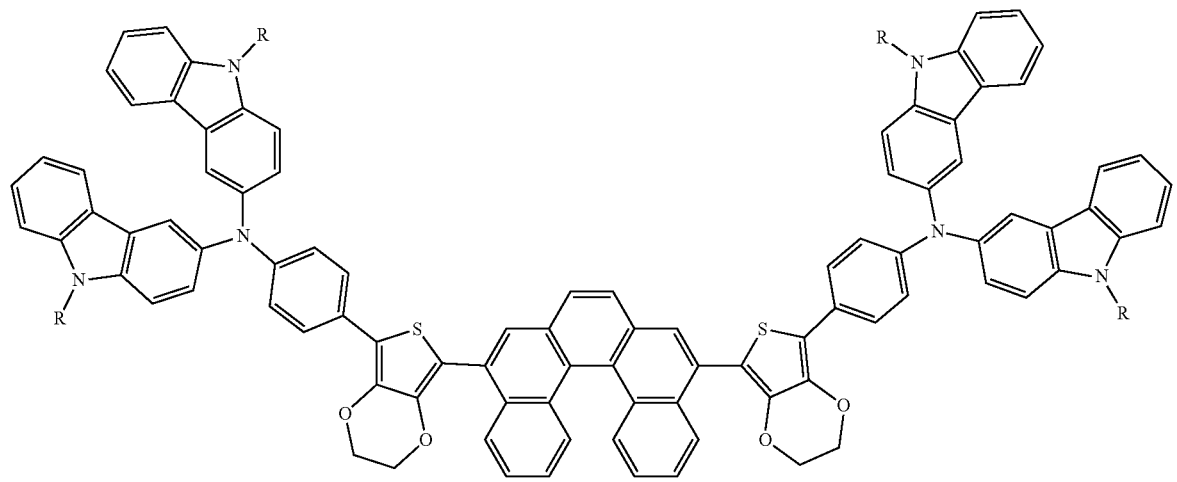
(91)
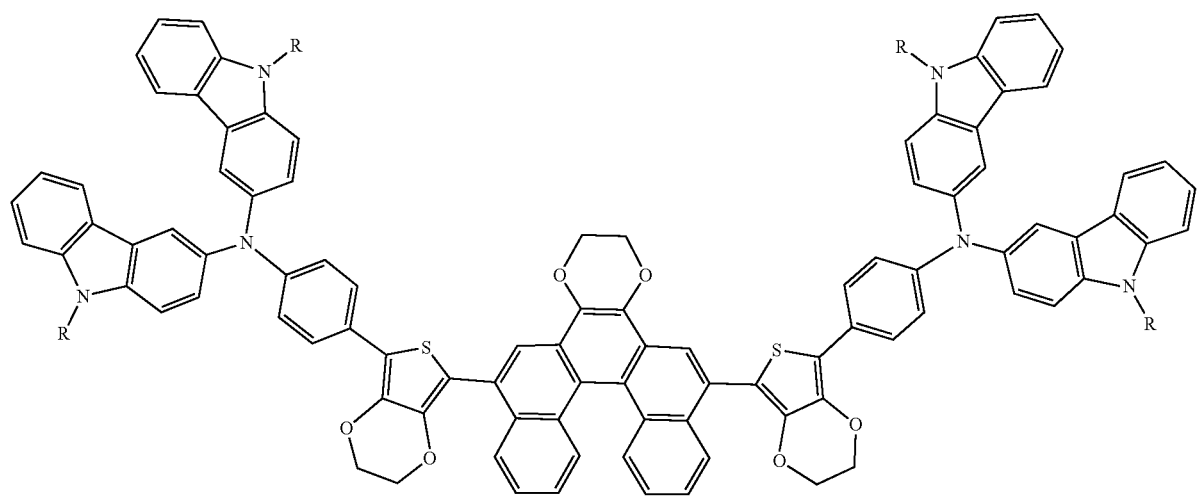

(92)
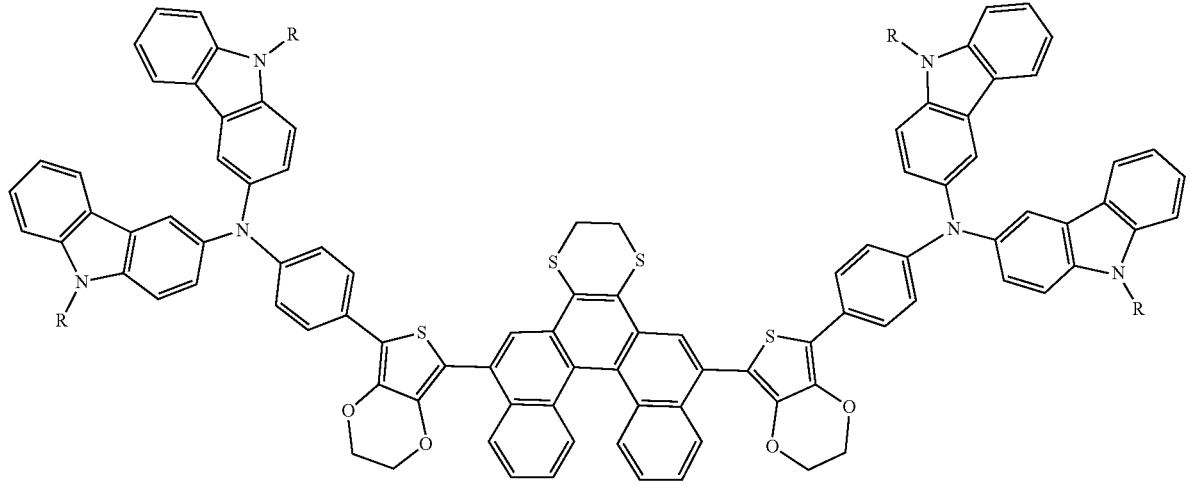
(93)
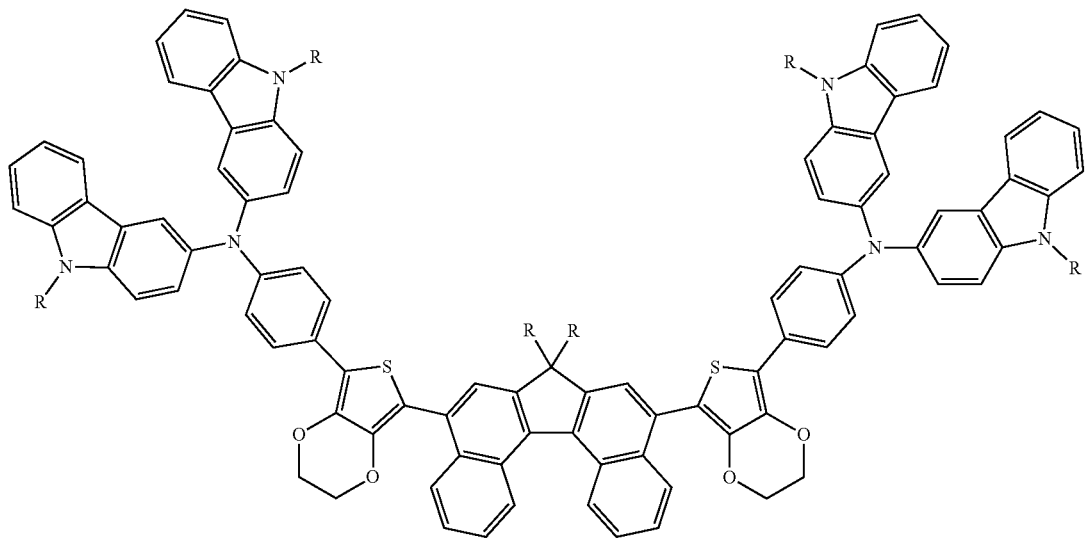
(94)
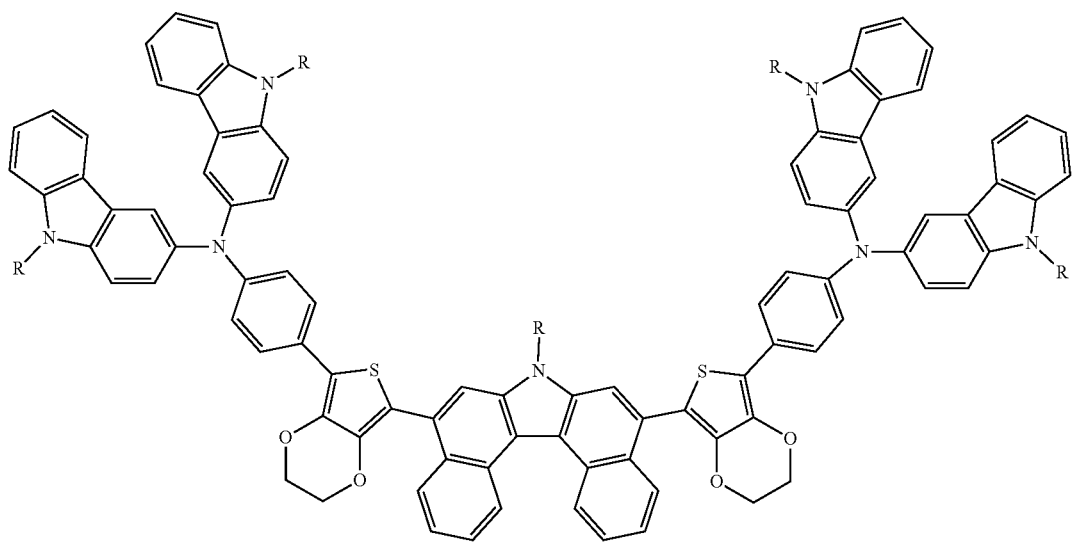

(95)
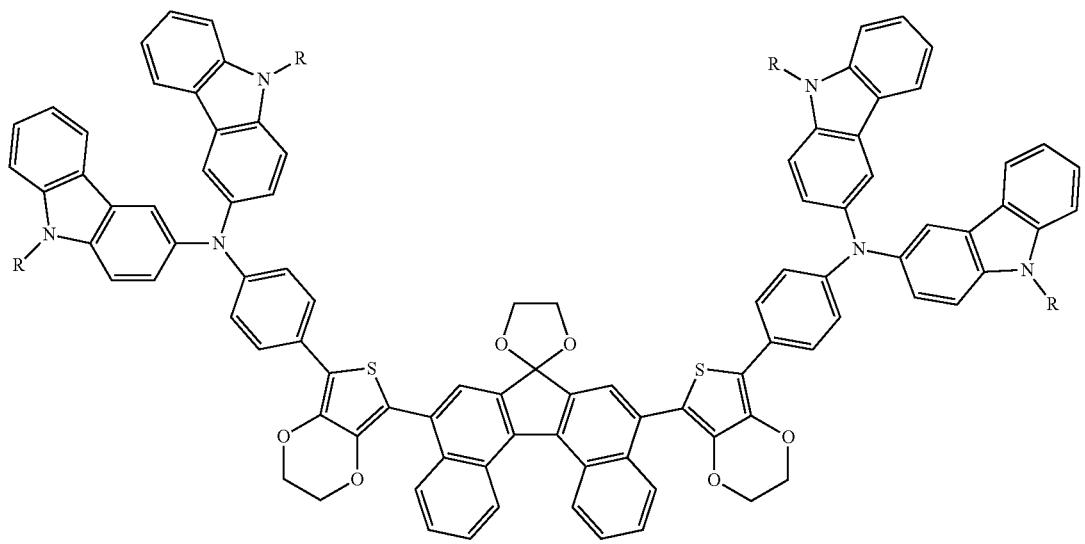
(96)
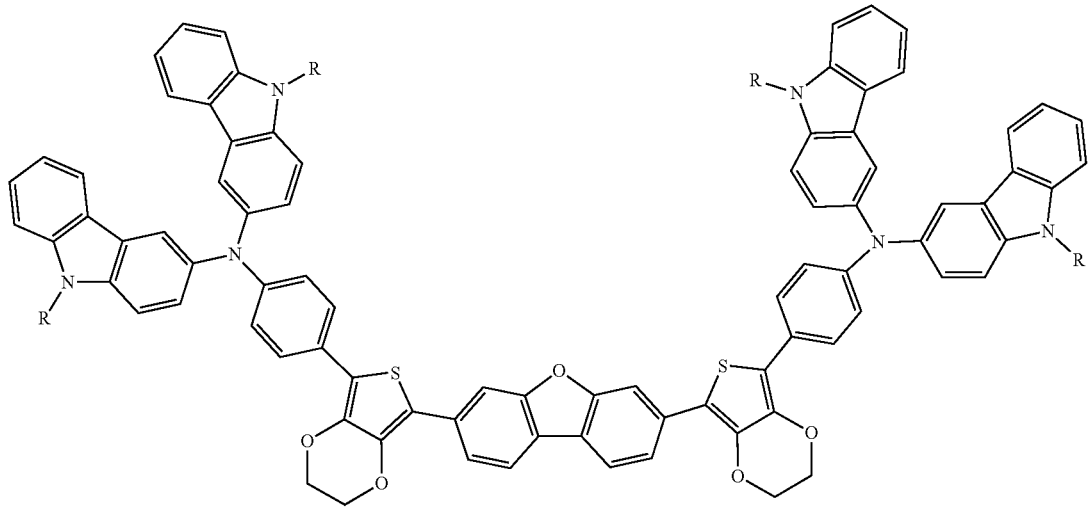
(97)
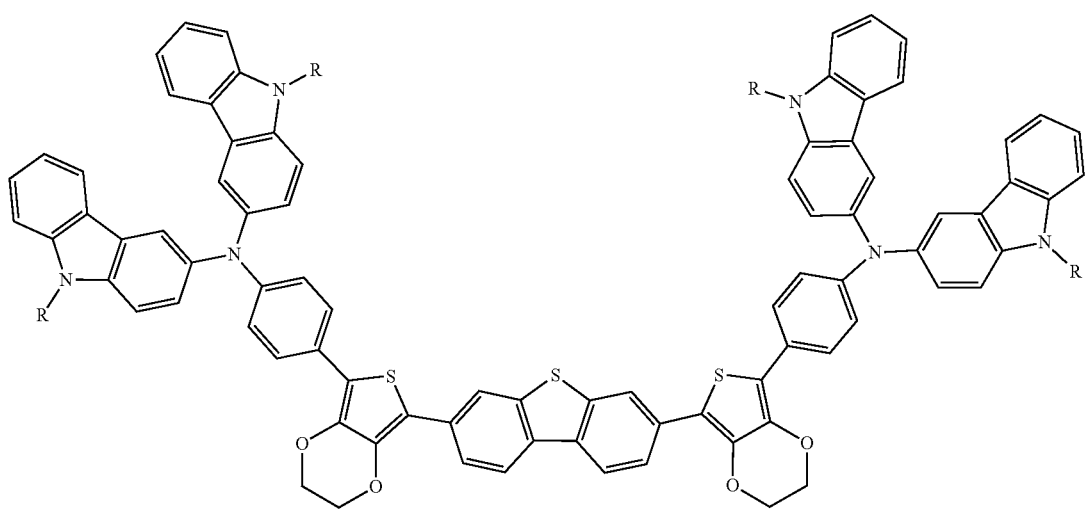

(98)
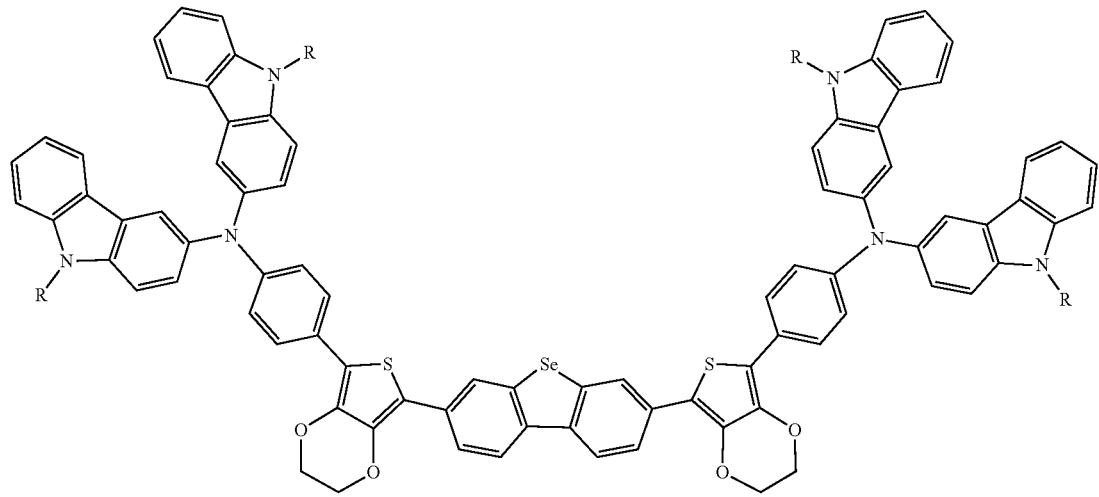
(99)
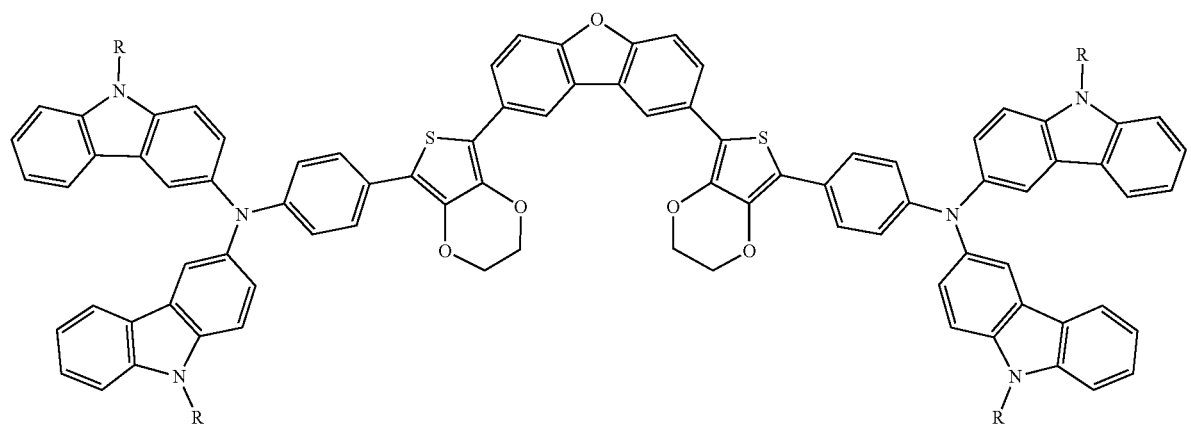
(100)
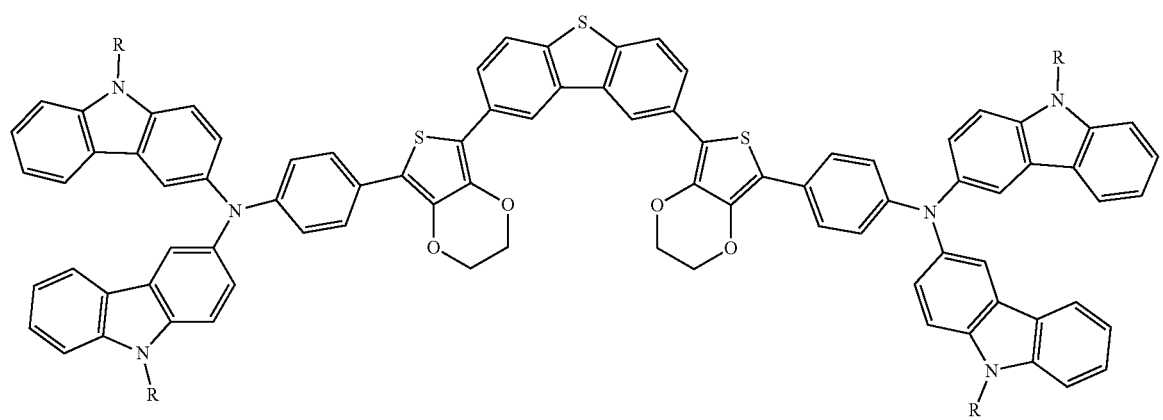

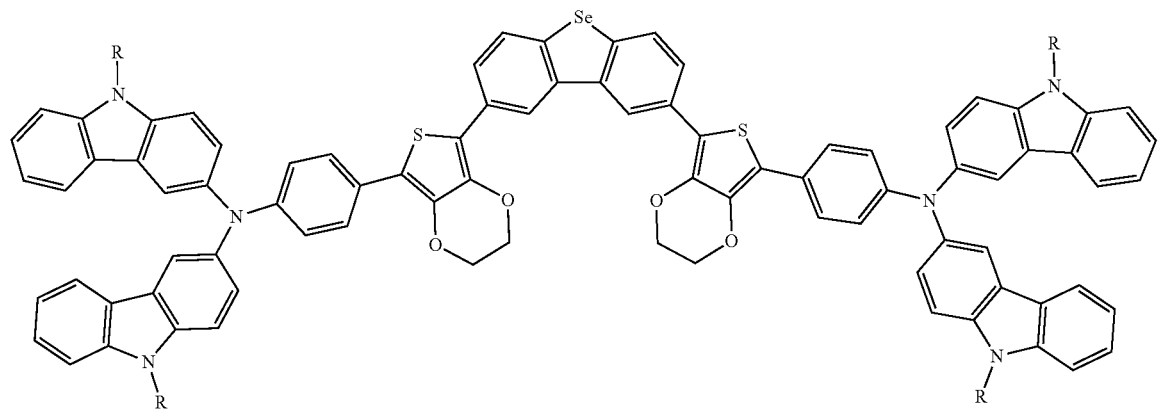
(101)
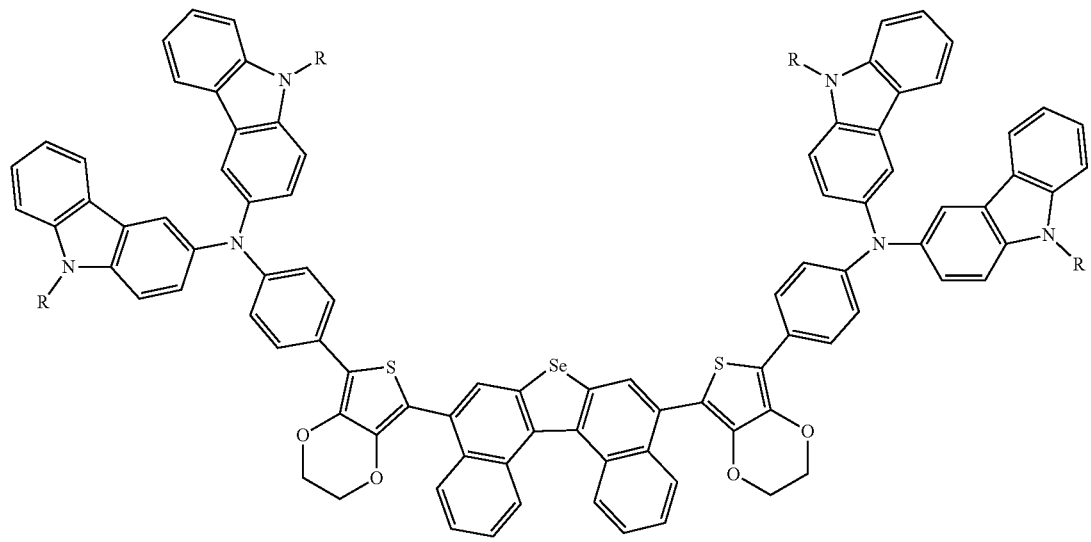
(102)
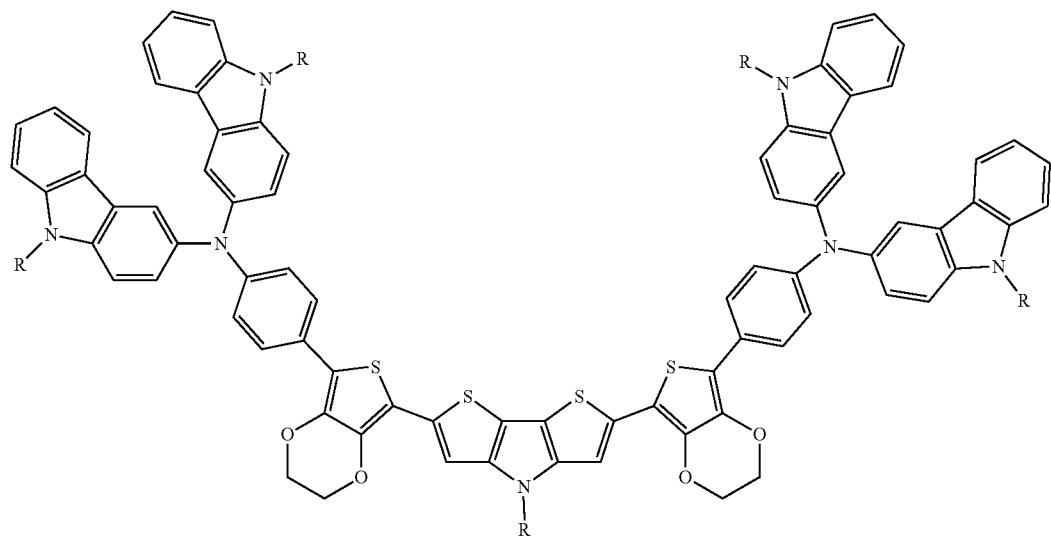
(103)

-continued
(104)
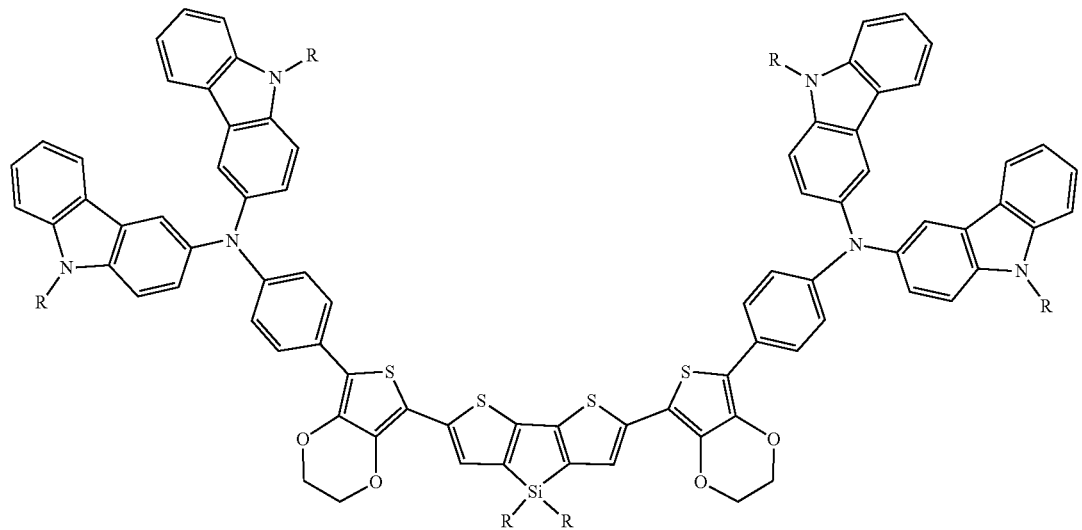
(105)
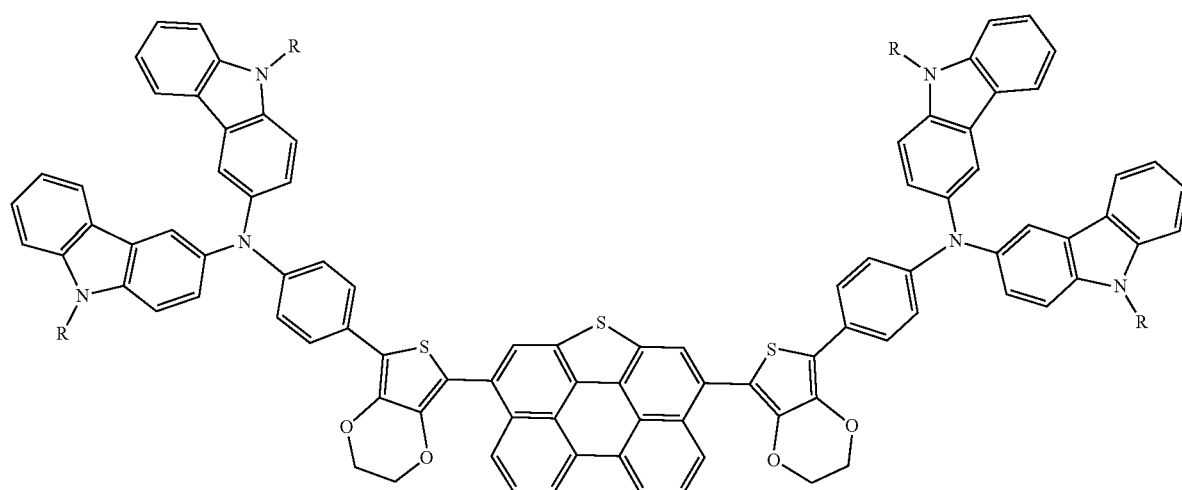
(106)
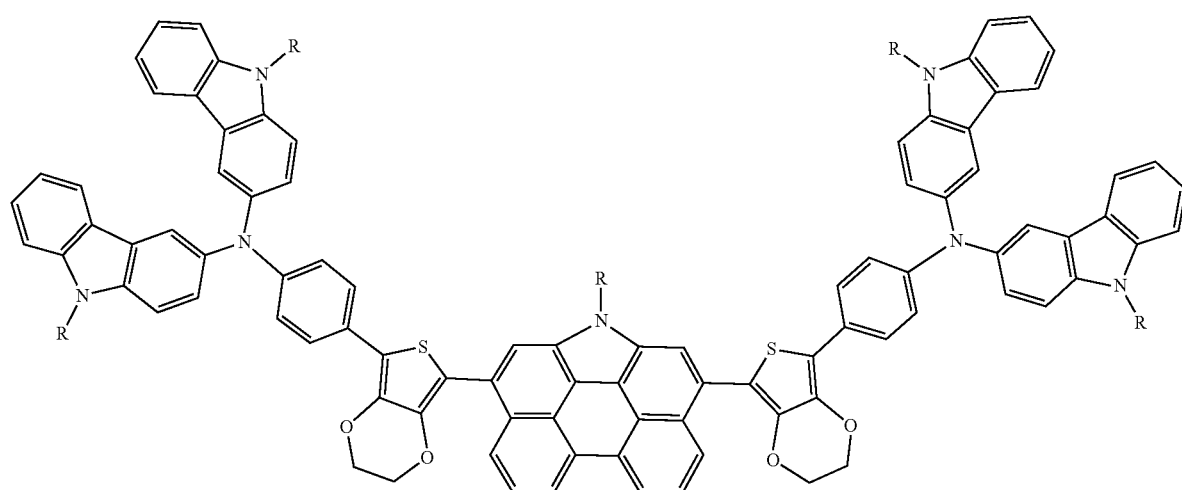

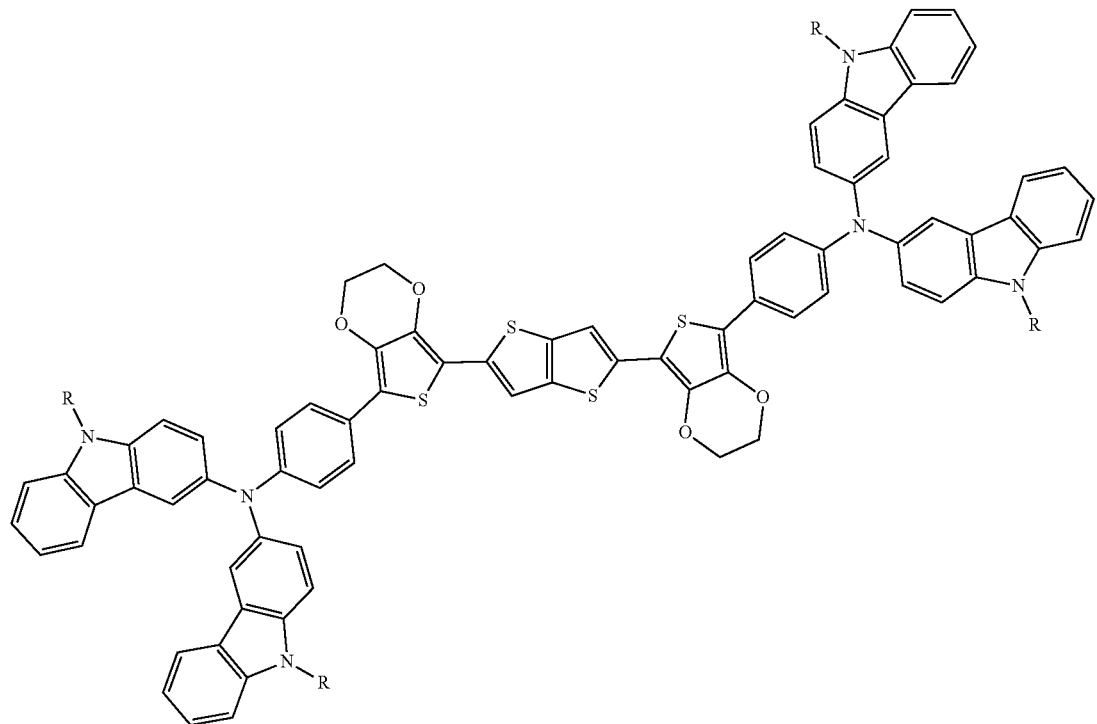
(107)
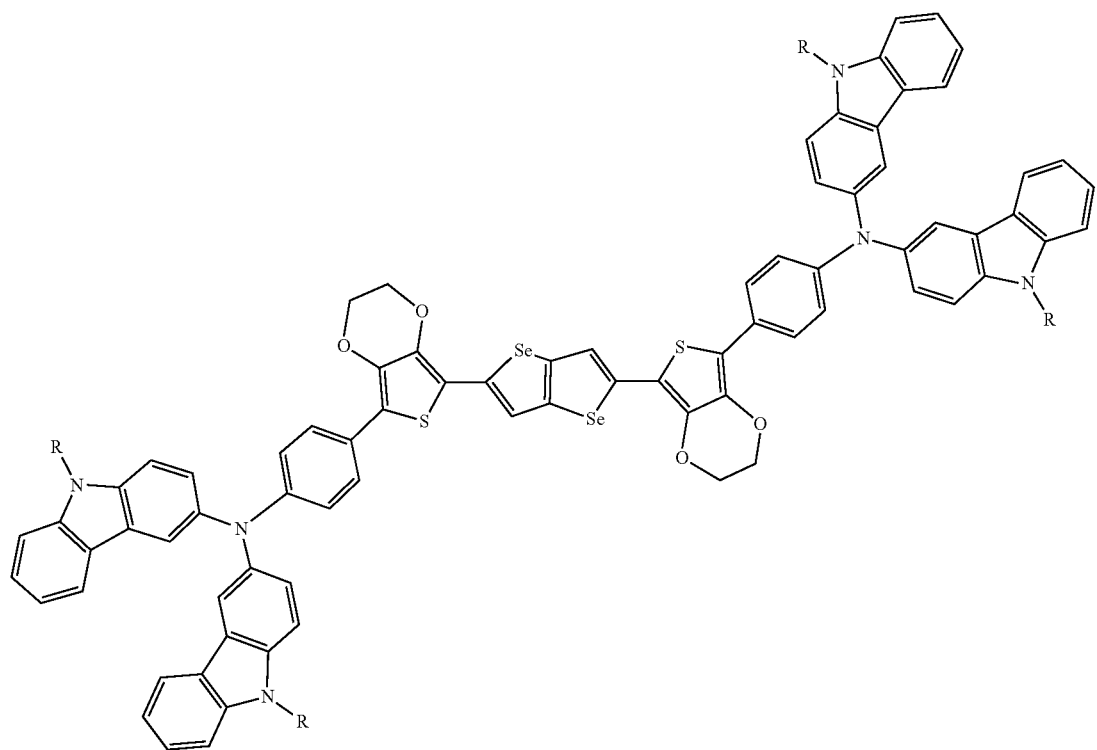
(108)

(109)
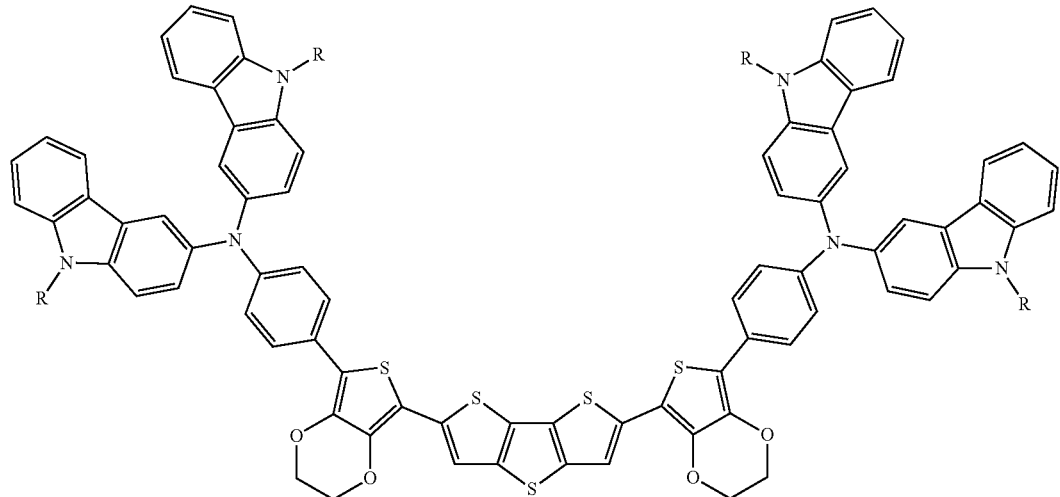
(110)
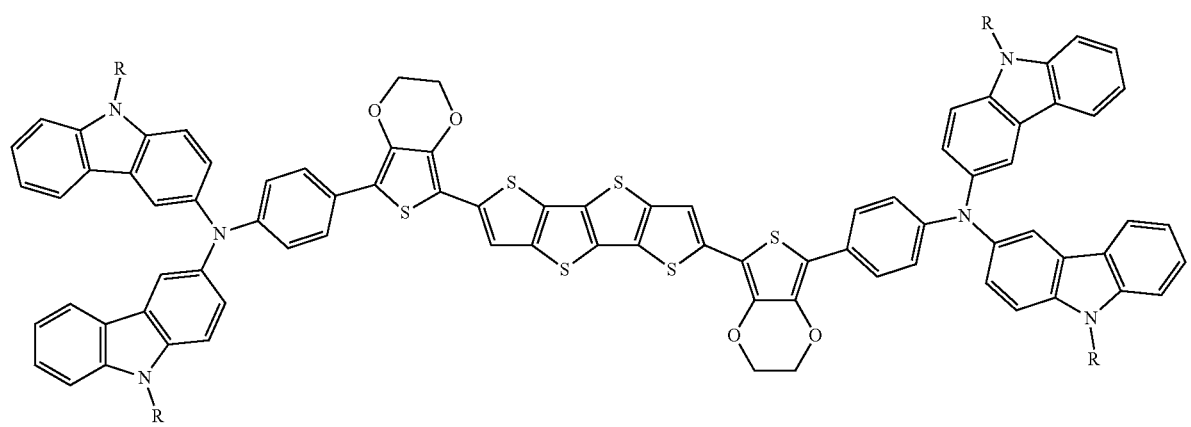
(111)
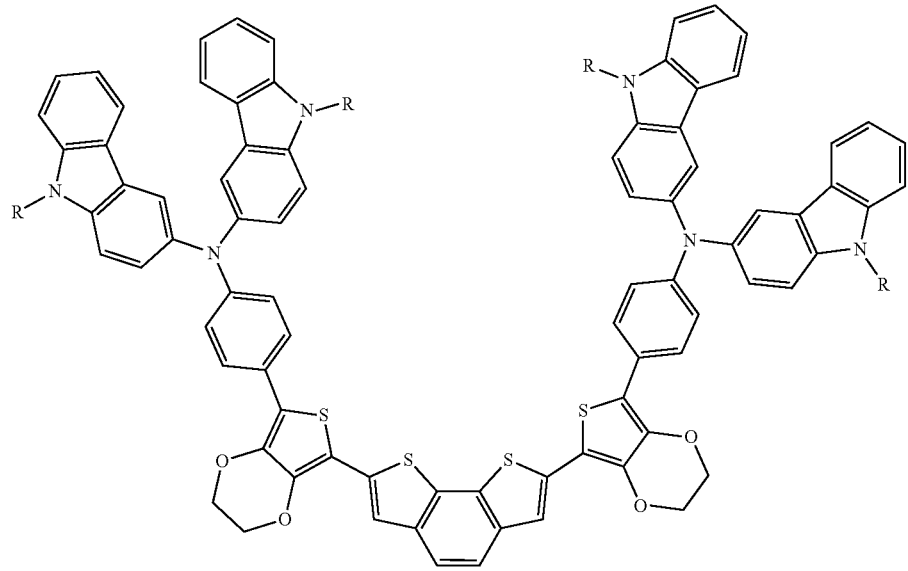

(112)

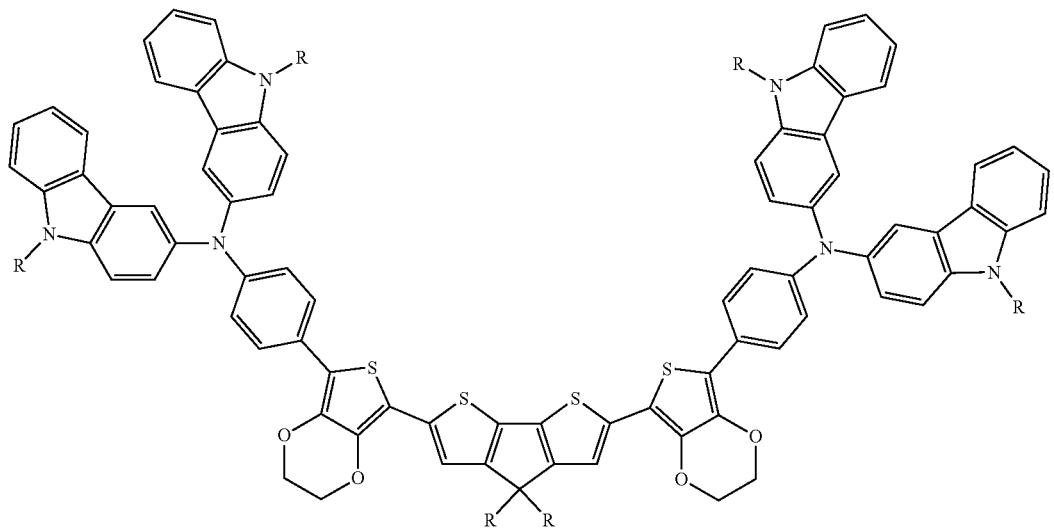

wherein, in each formula, R is a C1-C3 alkyl;
wherein the arylamine compound is used as an organic hole transport material for preparing photoelectric devices.

2. A method for preparation of the arylamine compound of claim 1, comprising the following steps:
adding a compound containing π conjugated units into toluene together with N,N-dimethyldicarbazole amine, tris (dibenzylideneacetone) dipalladium, tri-tert-butylphosphine tetrafluoroborate and sodium tert-butoxide at a molar ratio of 1:5:0.2:0.4:15; heating to 120° C. while stirring under protection of nitrogen, and allowing reaction for 12 h; standing and cooling to room temperature, filtering off organic solvent to obtain a crude product; and
obtaining an arylamine compound after column chromatography purification.

3. The method of claim 2, wherein the compound containing π conjugated units is any one of the following compounds:
5,9-dibromo-dinaphthofuran, 5,9-dibromo-dinaphthothiophene, 3,9-dibromo-dioxaanthanthrene, 3,6,11,14-tetrachloro-dibenzochrysene, 2,7,10,15-tetrachloro-tetra-o-phenylene or 18,23-dibromo-bis-dinaphthofuropyrrole.

4. A method for preparation of the arylamine compound of claim 1, comprising the following steps:
dissolving 3,4-ethylene-dioxythiophene-methyl-carbazole-triarylamine in ultra-dry tetrahydrofuran in a dry three-necked round bottom flask, and cooling to −78° C.; under the protection of argon, slowly adding a hexane solution of 1.5 times equivalent of n-butyllithium into the above solution with a needle and stirring for half an hour; adding 2 times equivalent of isopropanol pinacol borate to the above system with a syringe, and slowly heating the system to room temperature and stirring for 2 hours; adding deionized water therein after the reaction is finished, performing extraction and separating with dichloromethane, and retaining the obtained organic phase; and performing column chromatography purification, obtaining 3,4-ethylene-dioxythiophene-methyl-carbazole-triarylamine borate as an intermediate; and
adding a compound containing π conjugated units, 3,4-ethylene-dioxythiophene-methyl-carbazole-triarylamine borate, palladium acetate, tri-tert-butylphosphine tetrafluoroborate and potassium phosphate at a molar ratio of 1:5:0.08:0.08:10 into a mixed solvent of dioxane and water, wherein the volume ratio of dioxane to water in the mixed solvent is 5:1; under protection of argon, heating to 100° C. while stirring, performing reaction for 6 h; standing and cooling to room temperature, adding deionized water, performing extraction and separating with dichloromethane, and retaining the obtained organic phase to obtain a crude product; and
performing column chromatography purification, to obtain an arylamine compound.

5. The method of claim 4, wherein the compound containing π conjugated units is any one of the following chemicals:
5,9-dibromo-dinaphthofuran, 5,9-dibromo-dinaphthophene, 3,9-dibromo-dioxaanthanthrene, 3,6,11,14-tetrachloro-dibenzochrysene, 2,7,10,15-tetrachloro-tetra-o-phenylene or 18,23-dibromo-bis-dinaphthofuropyrrole.

* * * * *